(12) United States Patent
Jin

(10) Patent No.: US 8,338,895 B2
(45) Date of Patent: Dec. 25, 2012

(54) SEMICONDUCTOR DEVICE AND METHOD OF MANUFACTURING THE SAME

(75) Inventor: Zhengwu Jin, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/687,269

(22) Filed: Jan. 14, 2010

(65) Prior Publication Data

US 2010/0176457 A1    Jul. 15, 2010

(30) Foreign Application Priority Data

Jan. 14, 2009    (JP) ................... 2009-005847

(51) Int. Cl.
*H01L 21/70* (2006.01)
(52) U.S. Cl. .............. 257/390; 257/269; 257/E27.062
(58) Field of Classification Search .............. 257/369, 257/390, E27.062
See application file for complete search history.

(56) References Cited

U.S. PATENT DOCUMENTS
7,420,840 B2    9/2008    Jin
2007/0241365 A1*    10/2007    Iwamatsu ............. 257/147
2010/0176457 A1*    7/2010    Jin ........................ 257/369

FOREIGN PATENT DOCUMENTS
JP    2004063591    2/2004

* cited by examiner

*Primary Examiner* — Eugene Lee
*Assistant Examiner* — Elias M Ullah
(74) *Attorney, Agent, or Firm* — Turocy & Watson, LLP

(57) ABSTRACT

A semiconductor device includes a first insulated-gate field-effect transistor which is disposed on a semiconductor substrate having an element formation plane in a (110) plane direction, and which has a channel length direction in a <−110> direction, a second insulated-gate field-effect transistor which is disposed on the semiconductor substrate, has a channel length direction in the <−110> direction, and neighbors the first insulated-gate field-effect transistor in the channel length direction, and a first liner insulation film which is provided in a manner to cover the first and second insulated-gate field-effect transistors, the first liner insulation film including a piezomaterial, having a positive expansion coefficient, and applying a compressive stress by operation heat to the first and second insulated-gate field-effect transistors in the channel length direction.

16 Claims, 45 Drawing Sheets

Case of plane direction (110) and channel length direction <001> of transistor

Case of plane direction (110) and channel length direction <-110> of transistor pMOS transistor

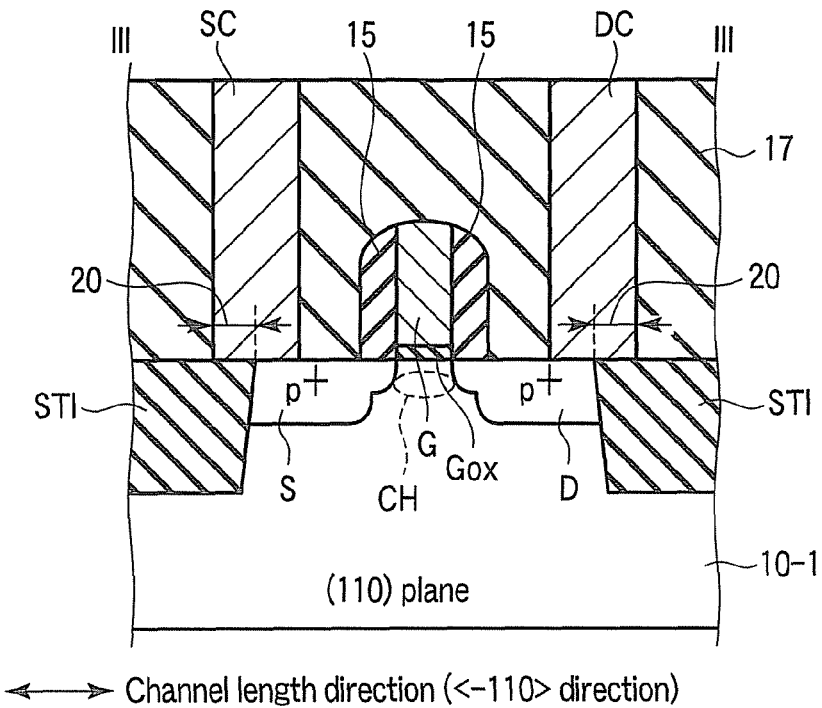
F I G. 3
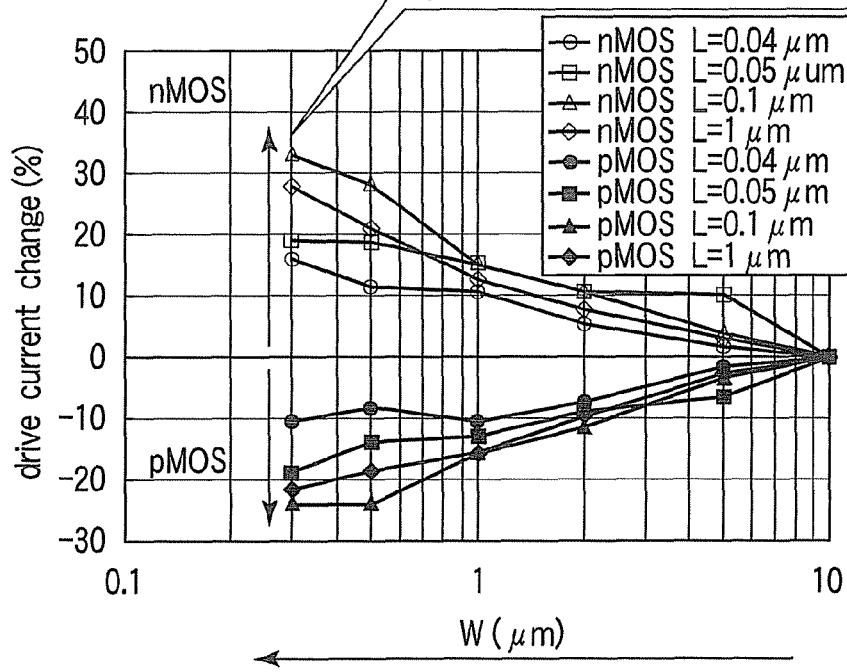
F I G. 4

Case of plane direction (110) and channel length direction <001> of transistor

Comparison between case of channel length direction
<001> and case of channel length direction <-110>

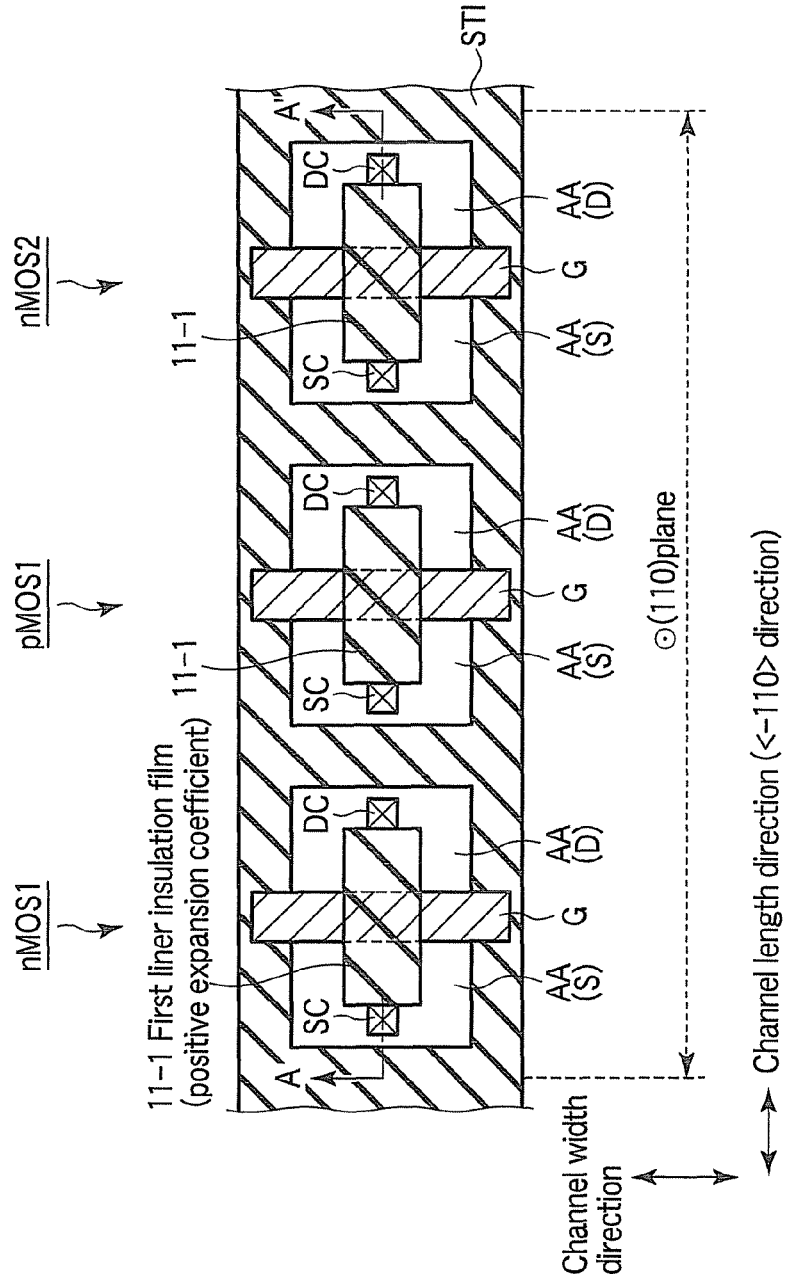
F I G. 13

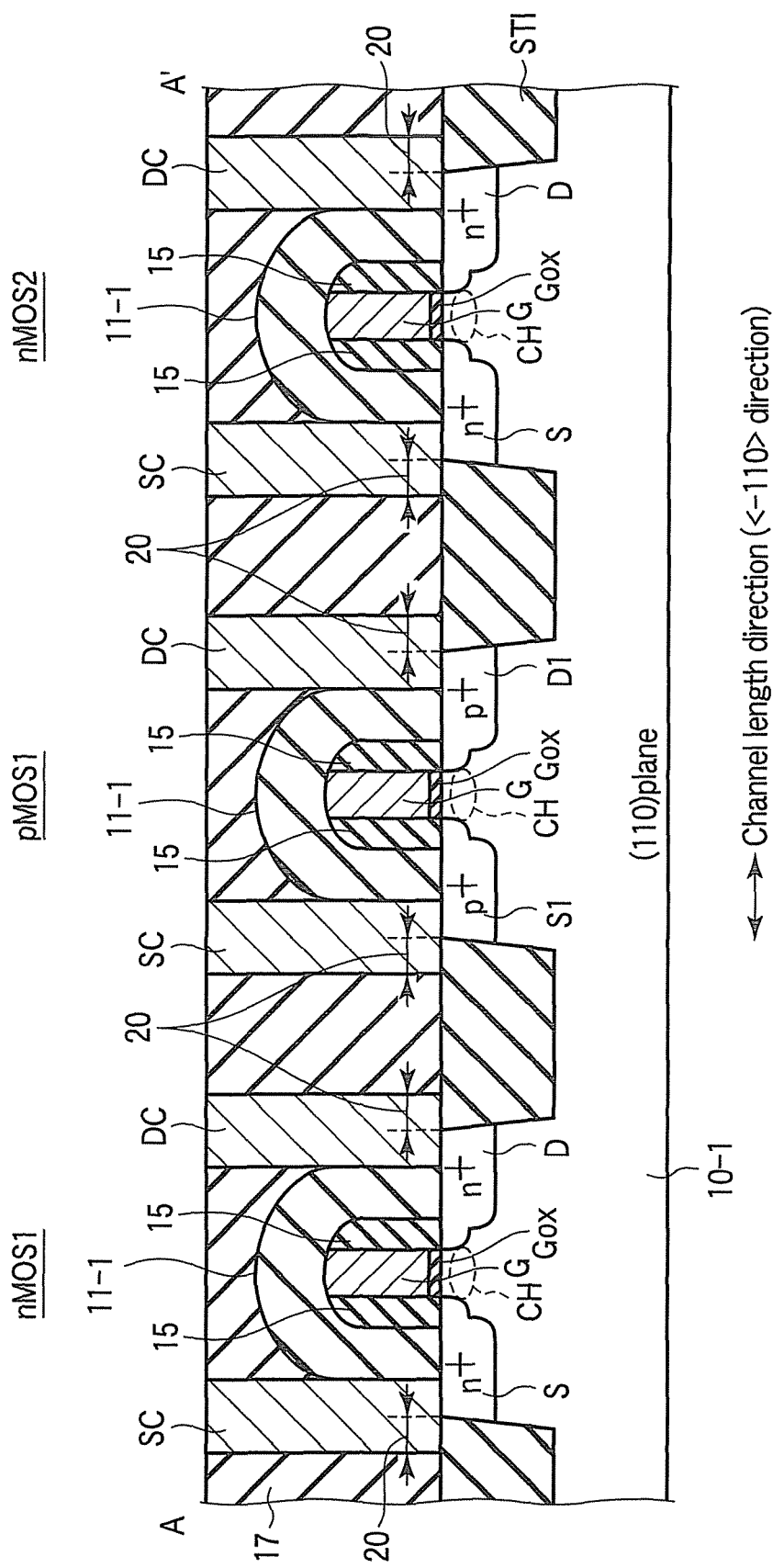
F I G. 14

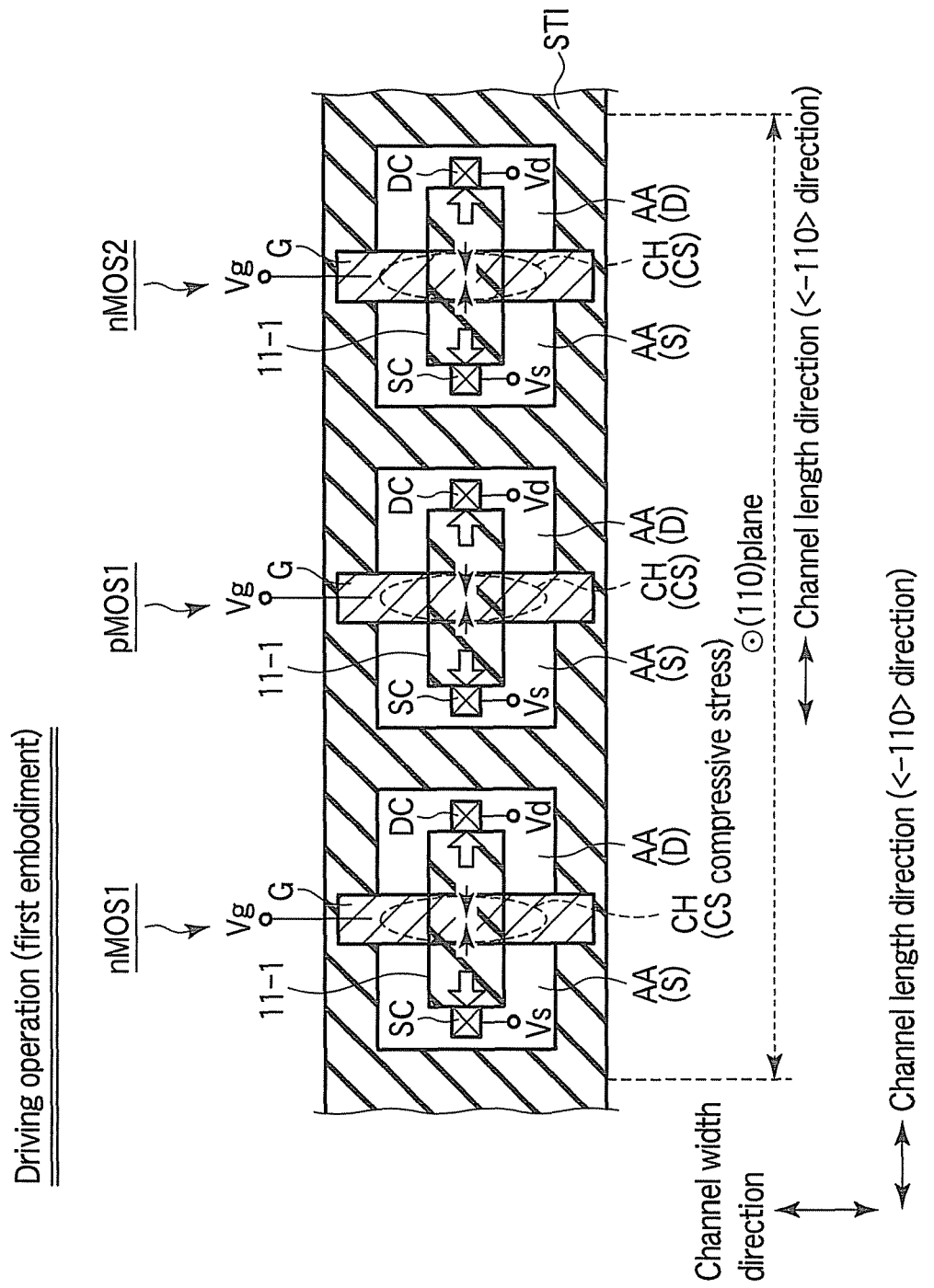
F I G. 15

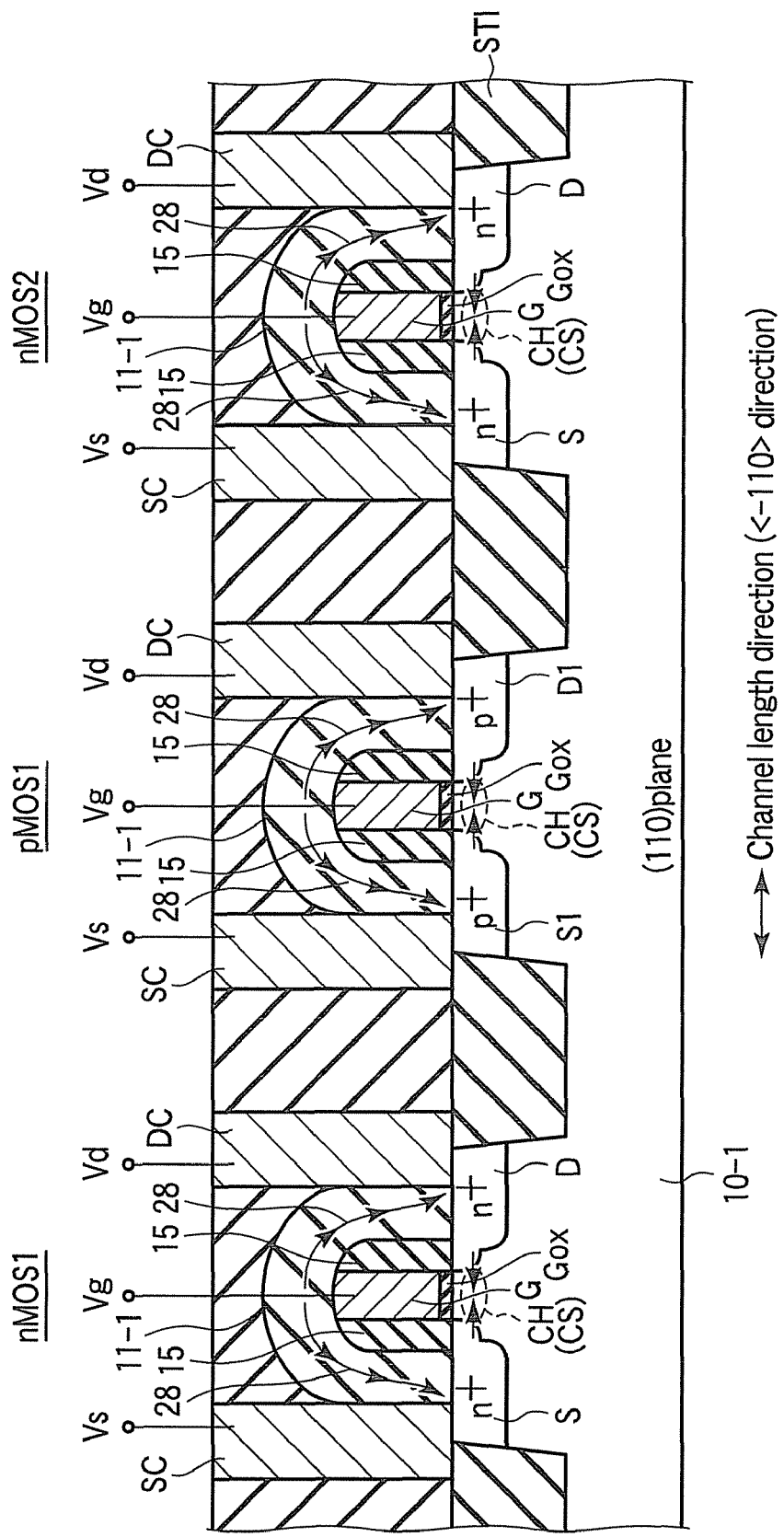
F I G. 16

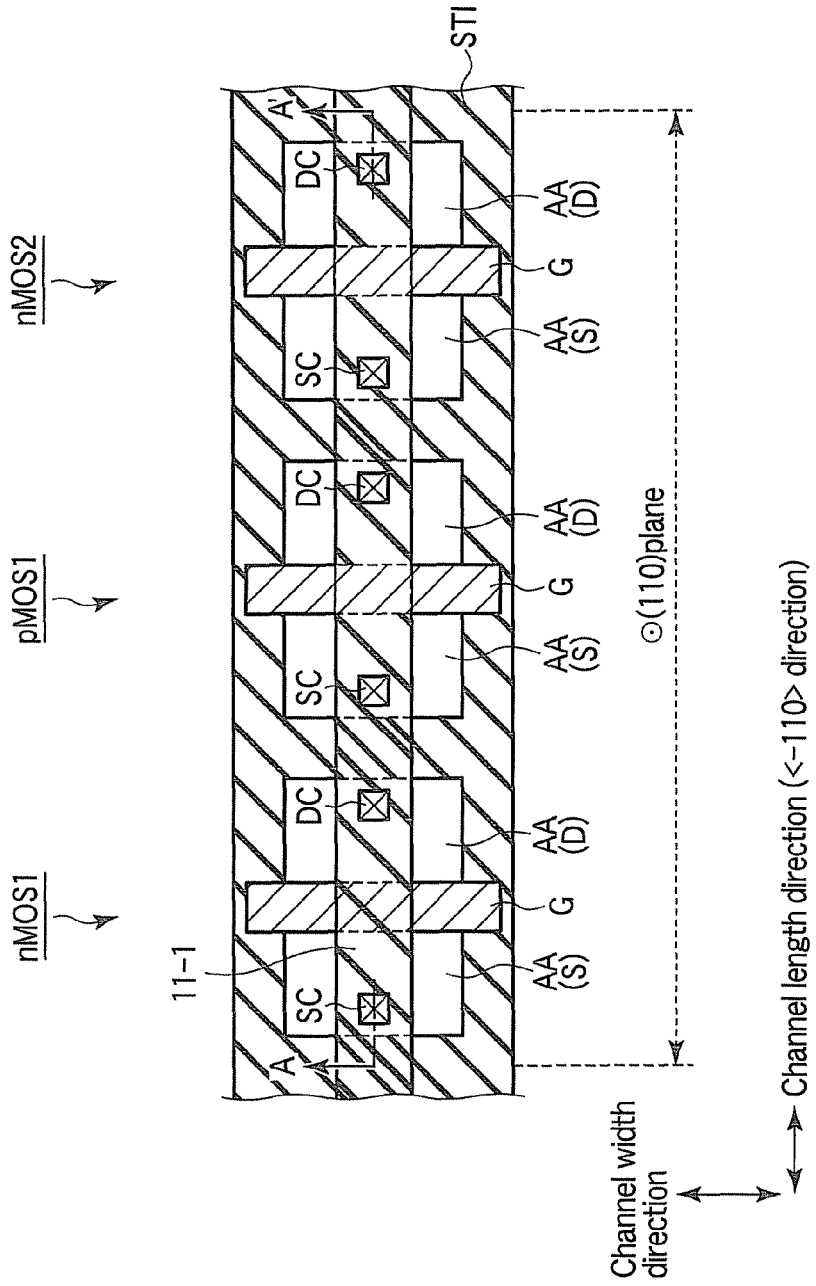
F I G. 18

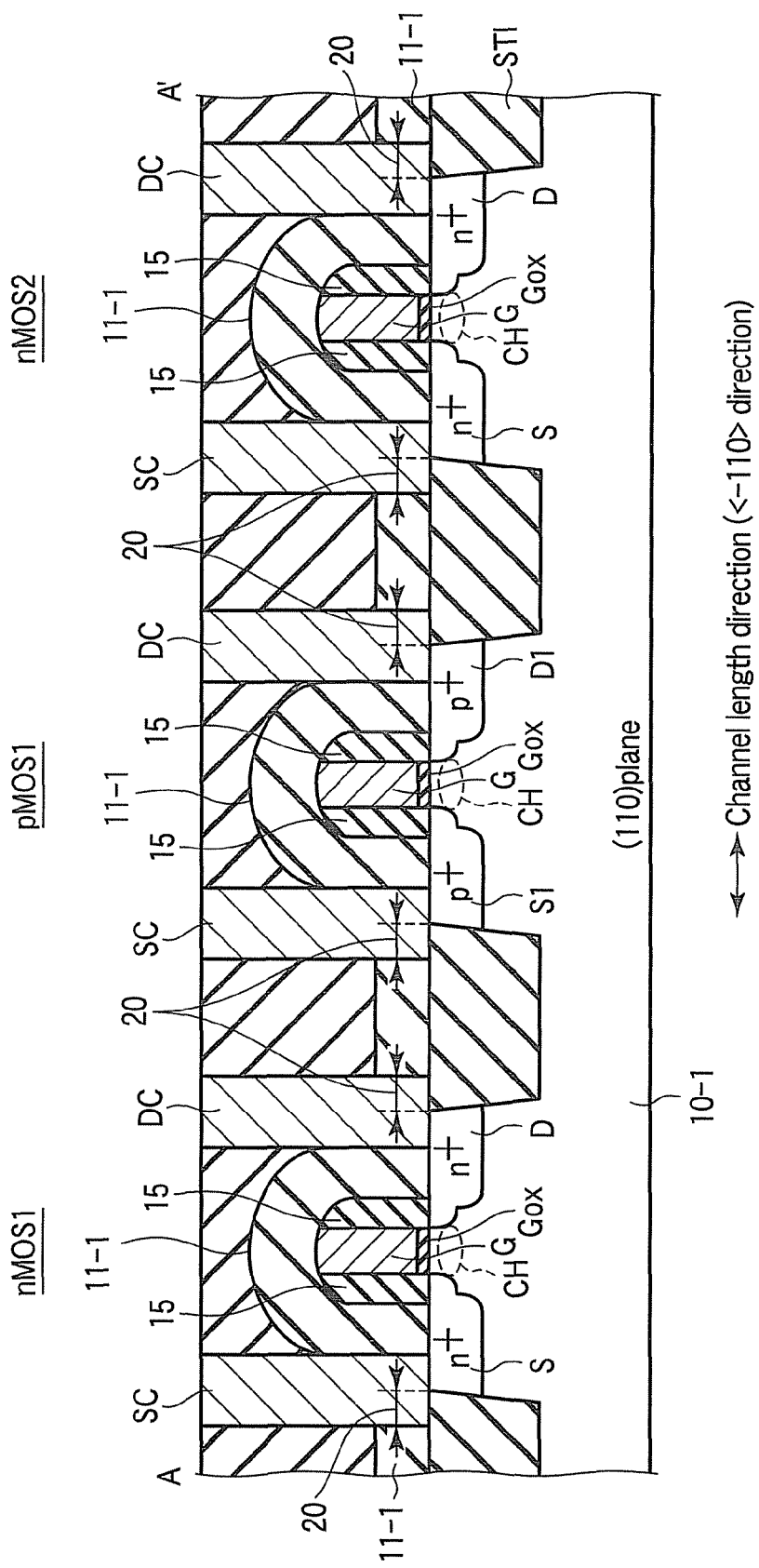
F I G. 19

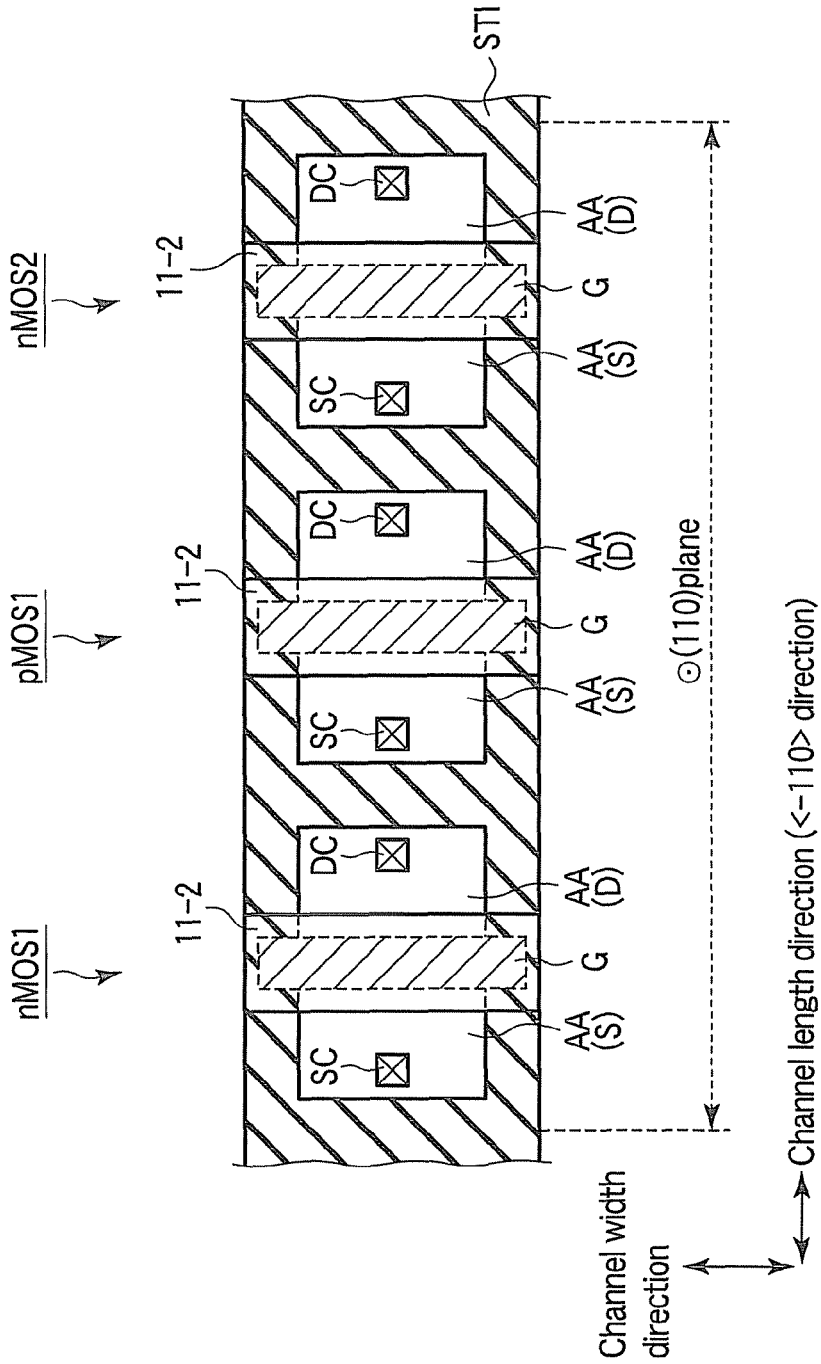
F I G. 21

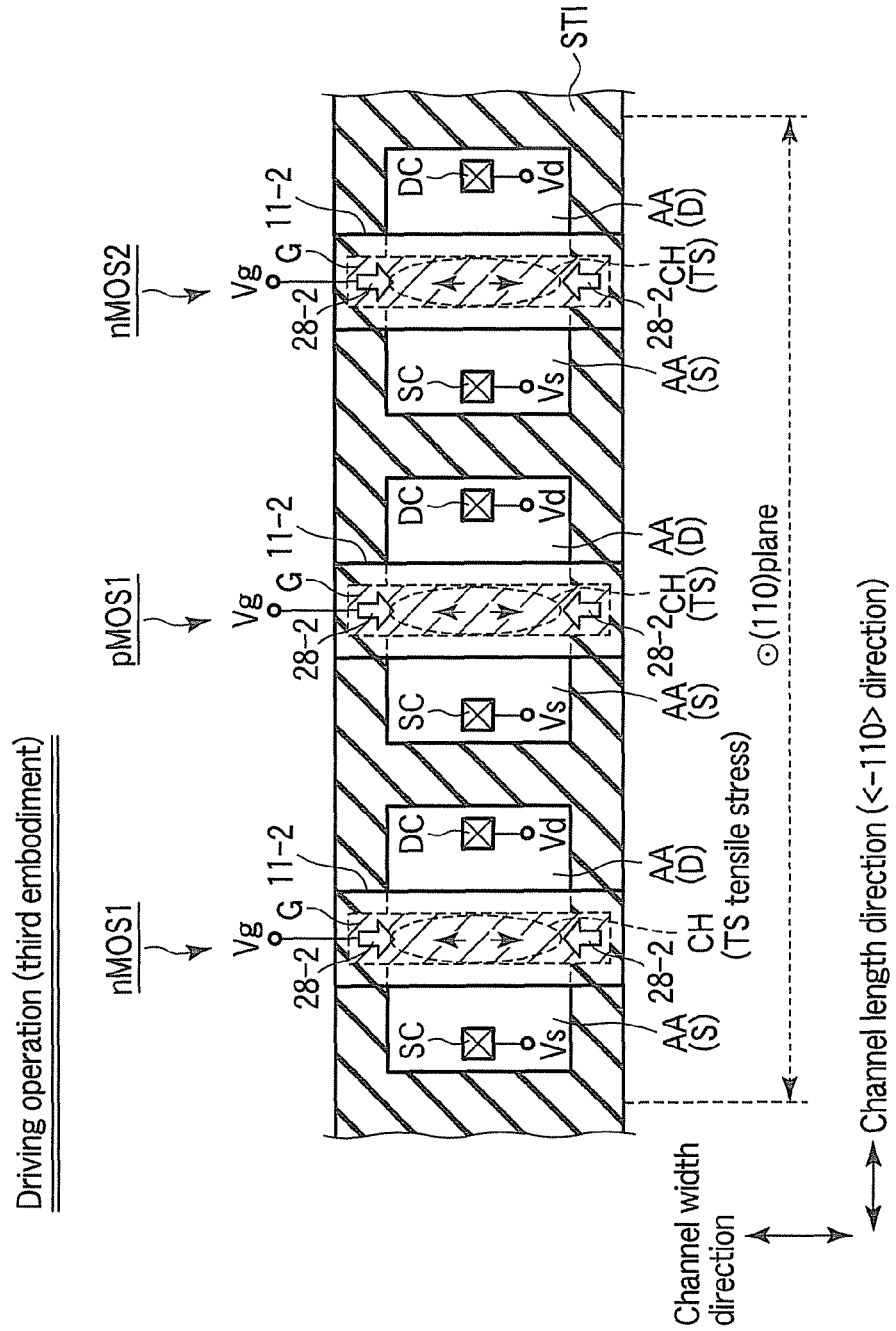
F I G. 22

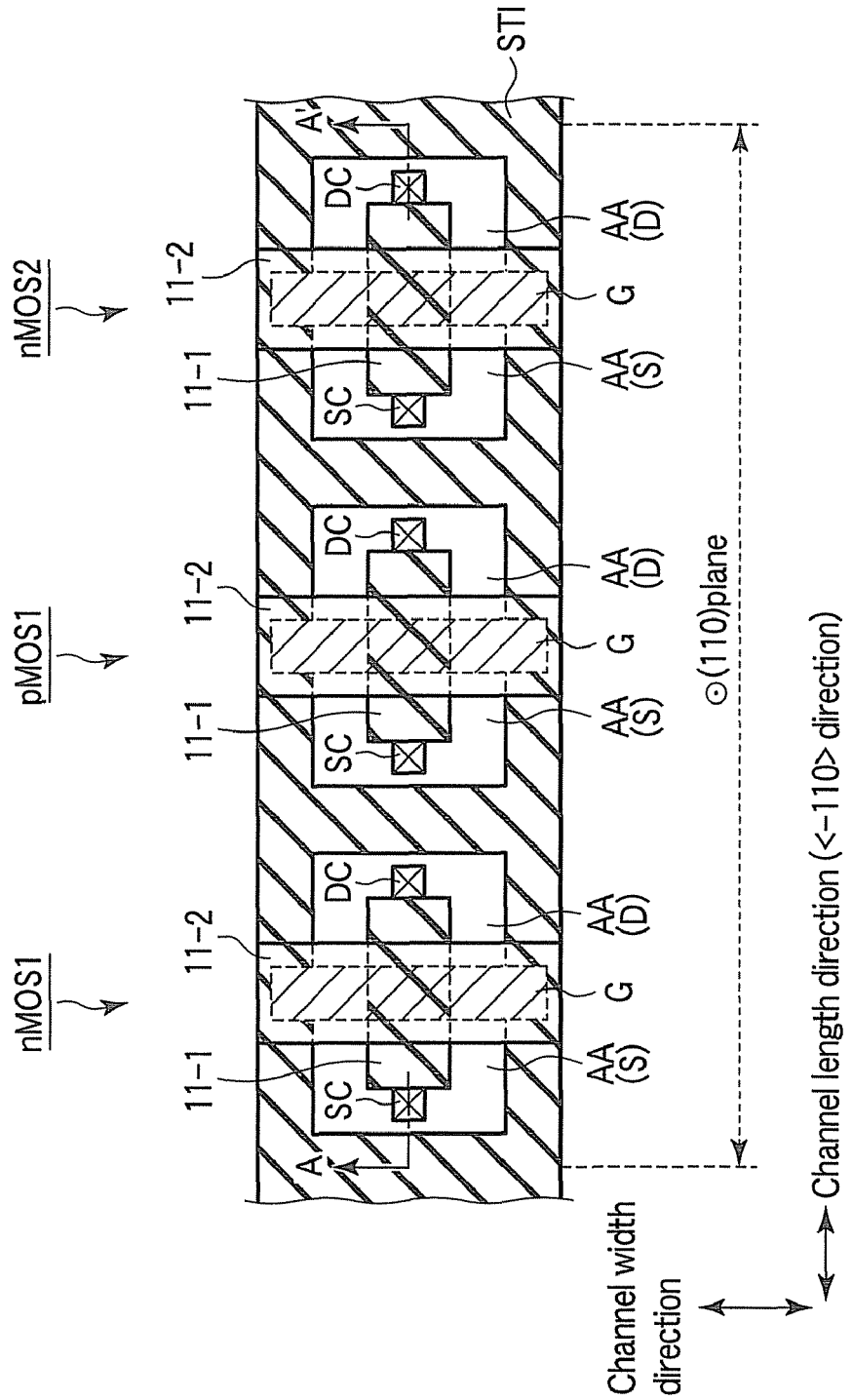
F I G. 23

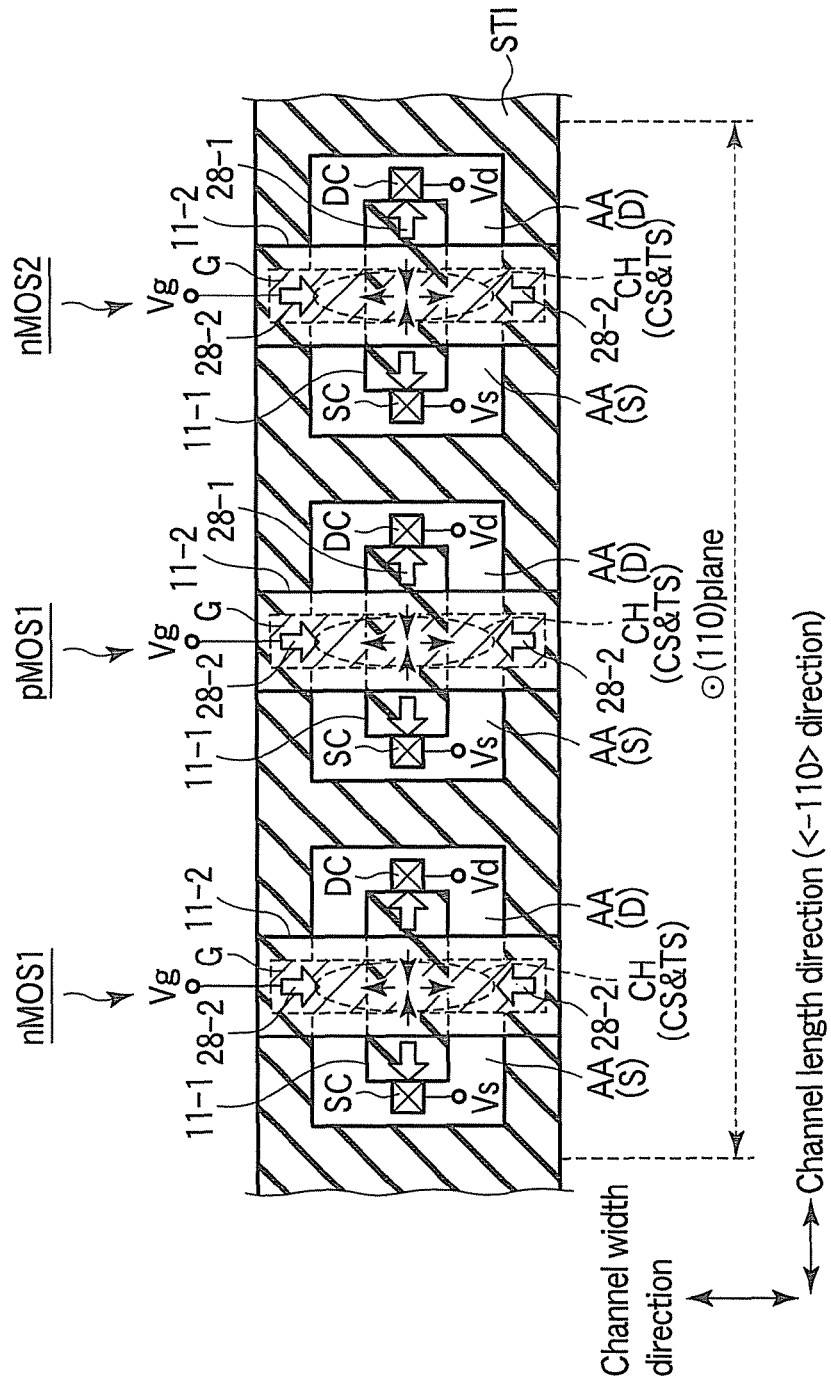
F I G. 25

Relationship between time and temperature

Manufacturing method (fourth embodiment)

Glass layer formation process (Δt1)

Crystal nucleus formation process (Δt2)

Crystal nucleus growth process (Δt3)

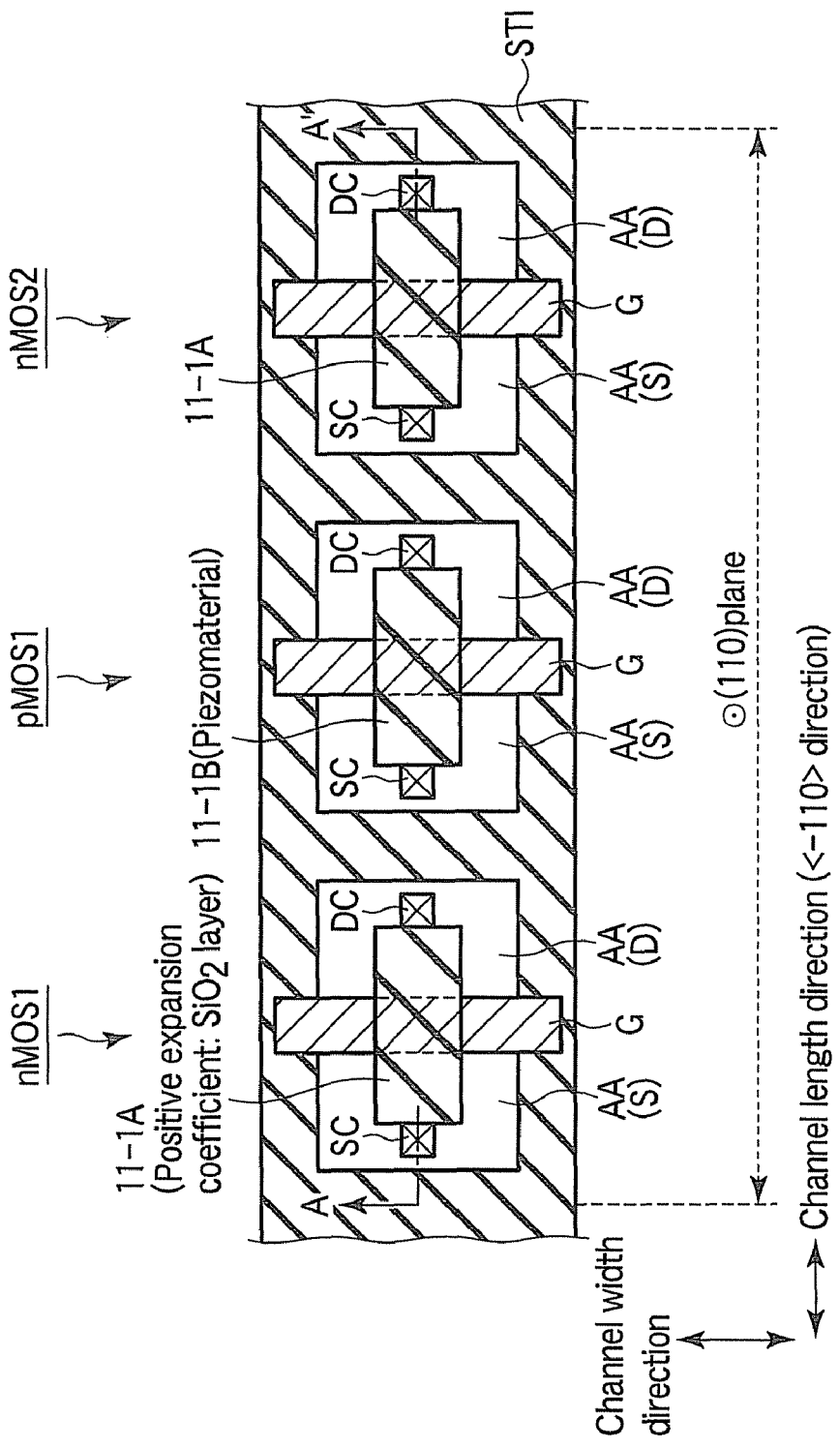
F I G. 34

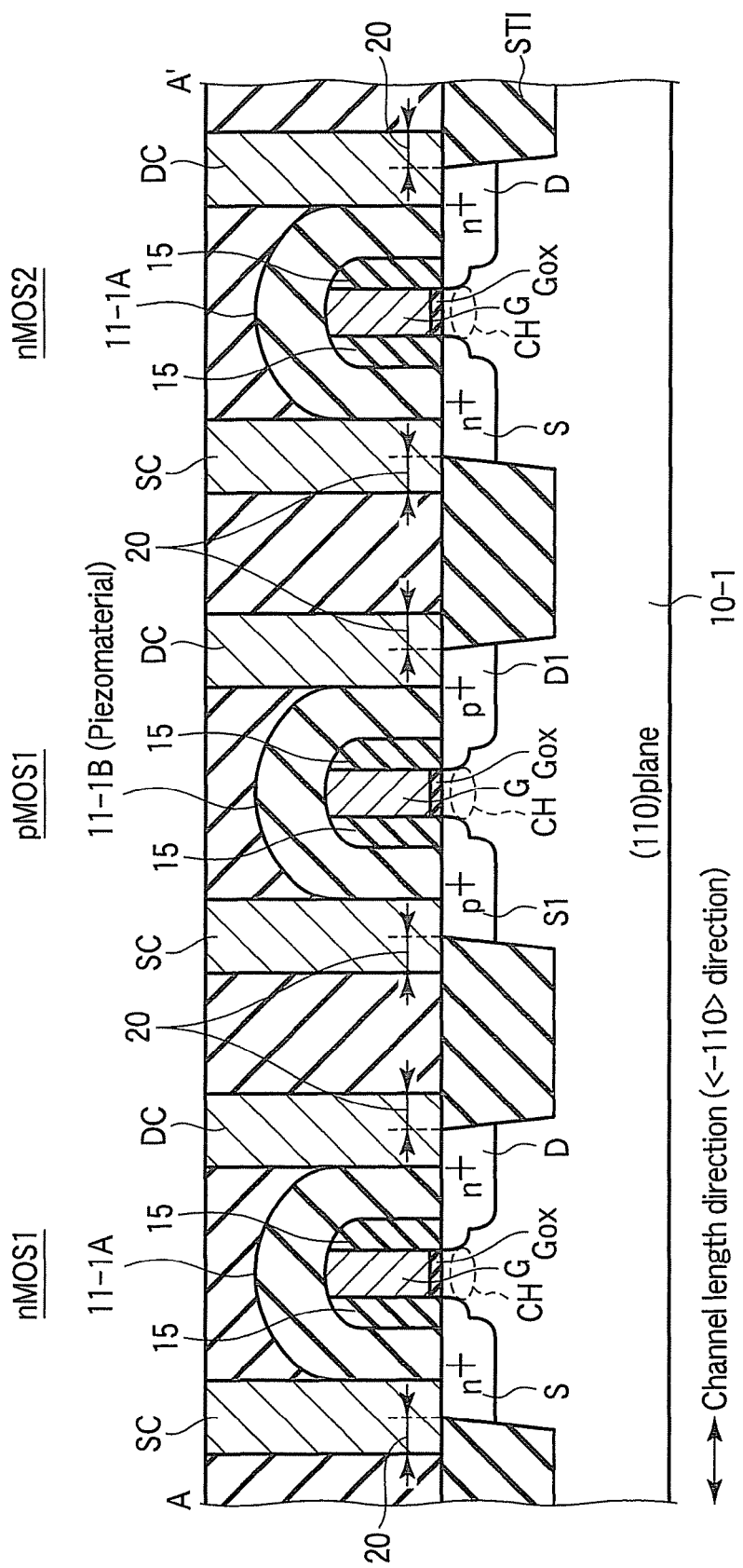
F I G. 35

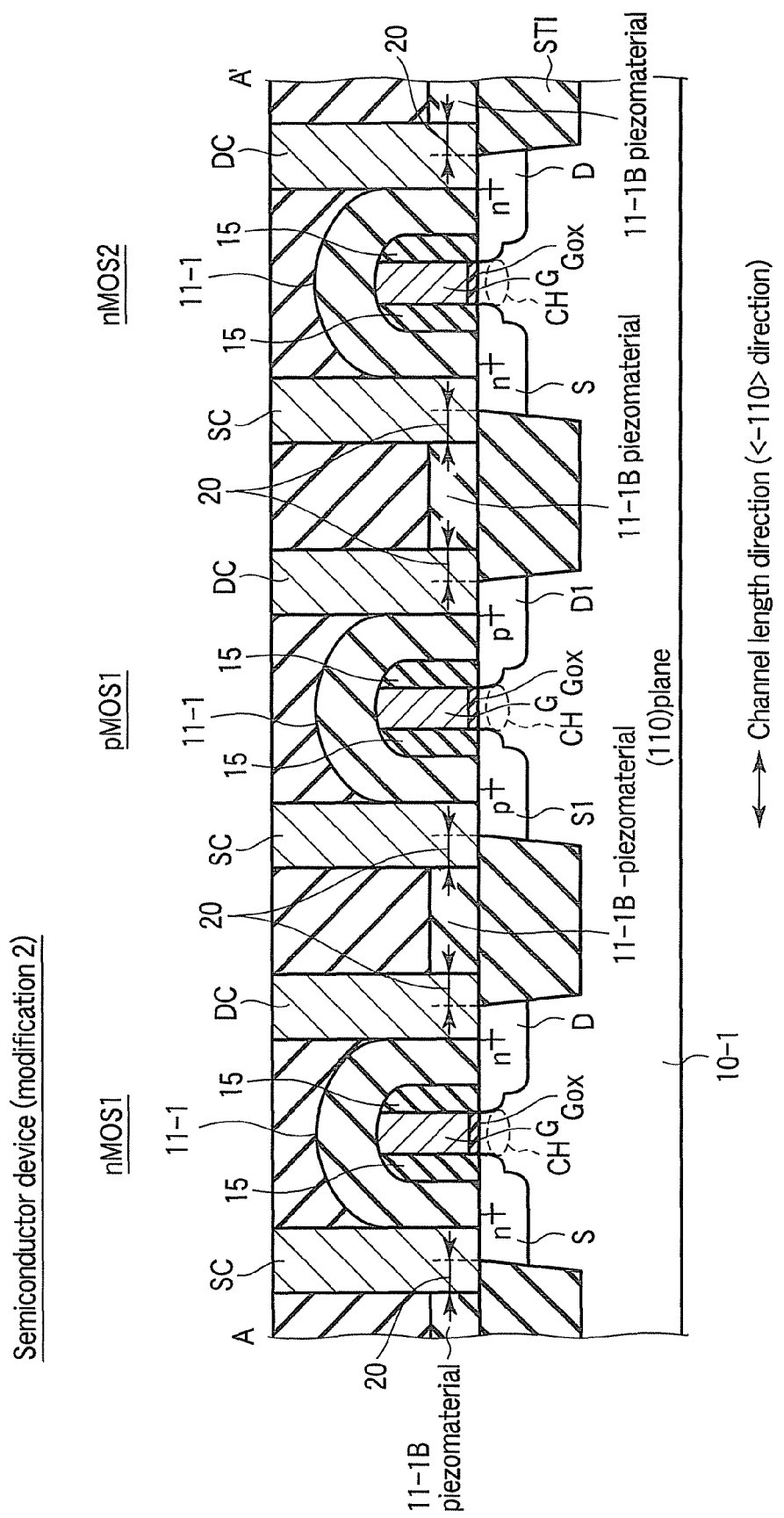
F I G. 40

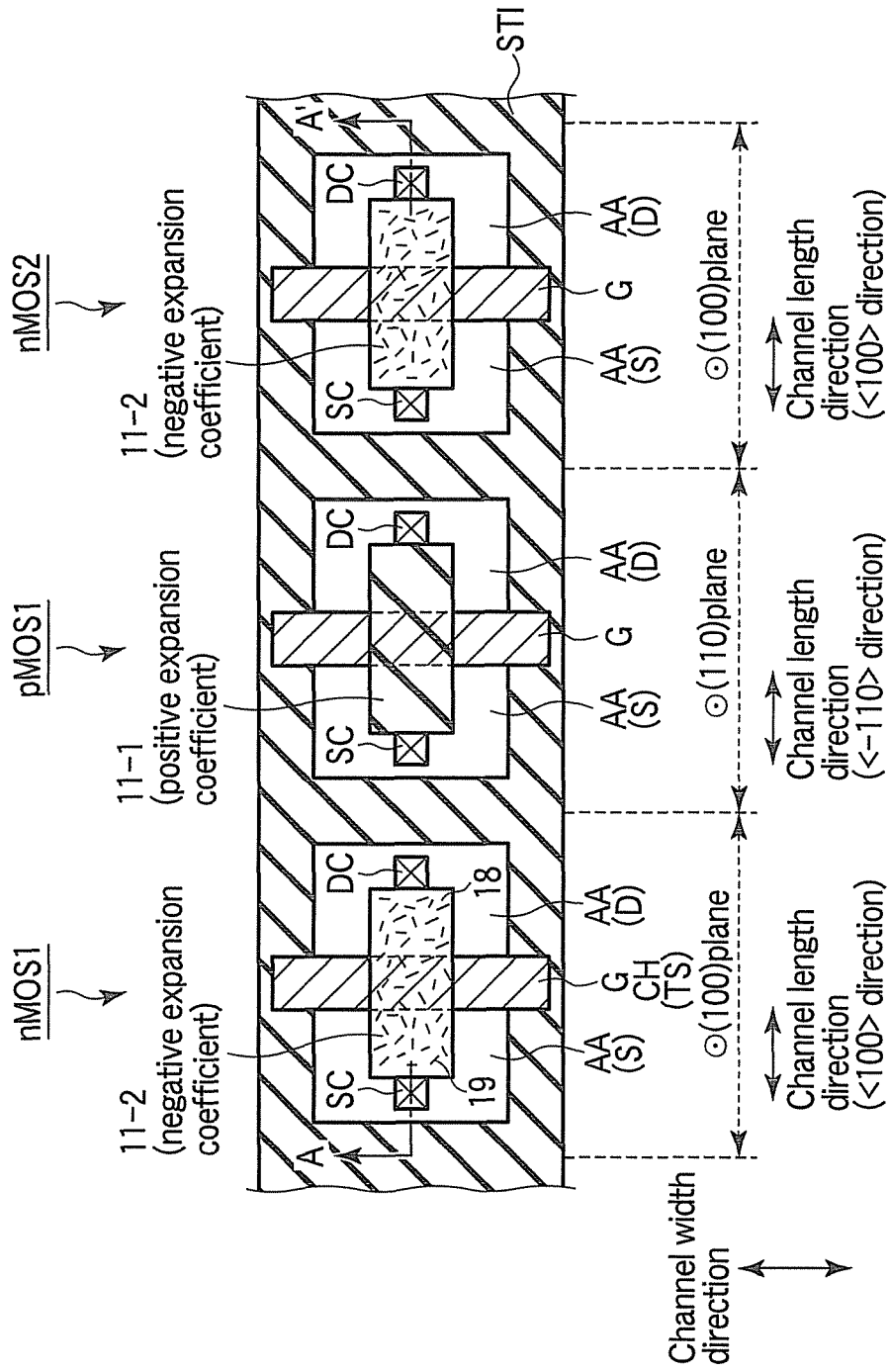
F I G. 44

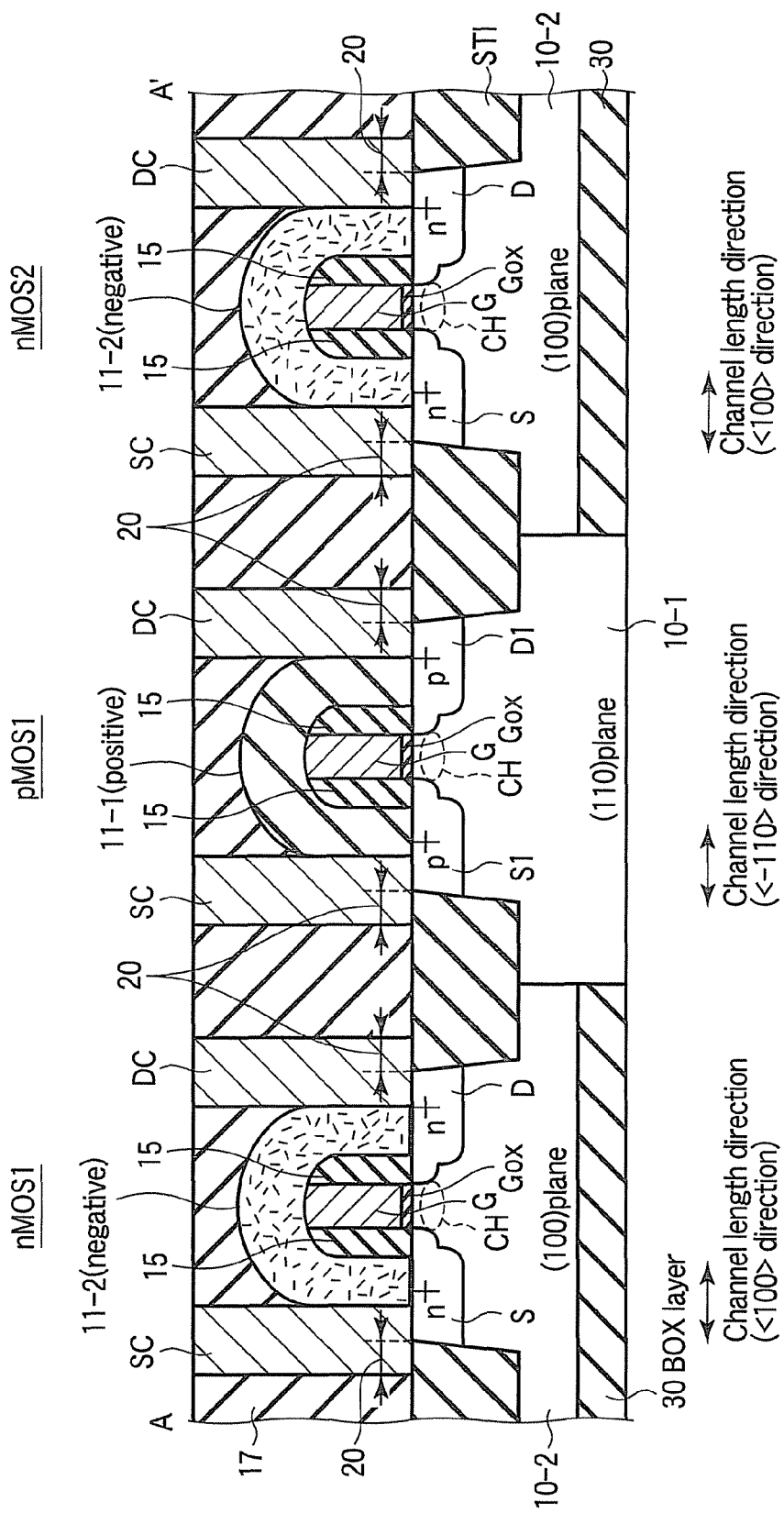
F I G. 45

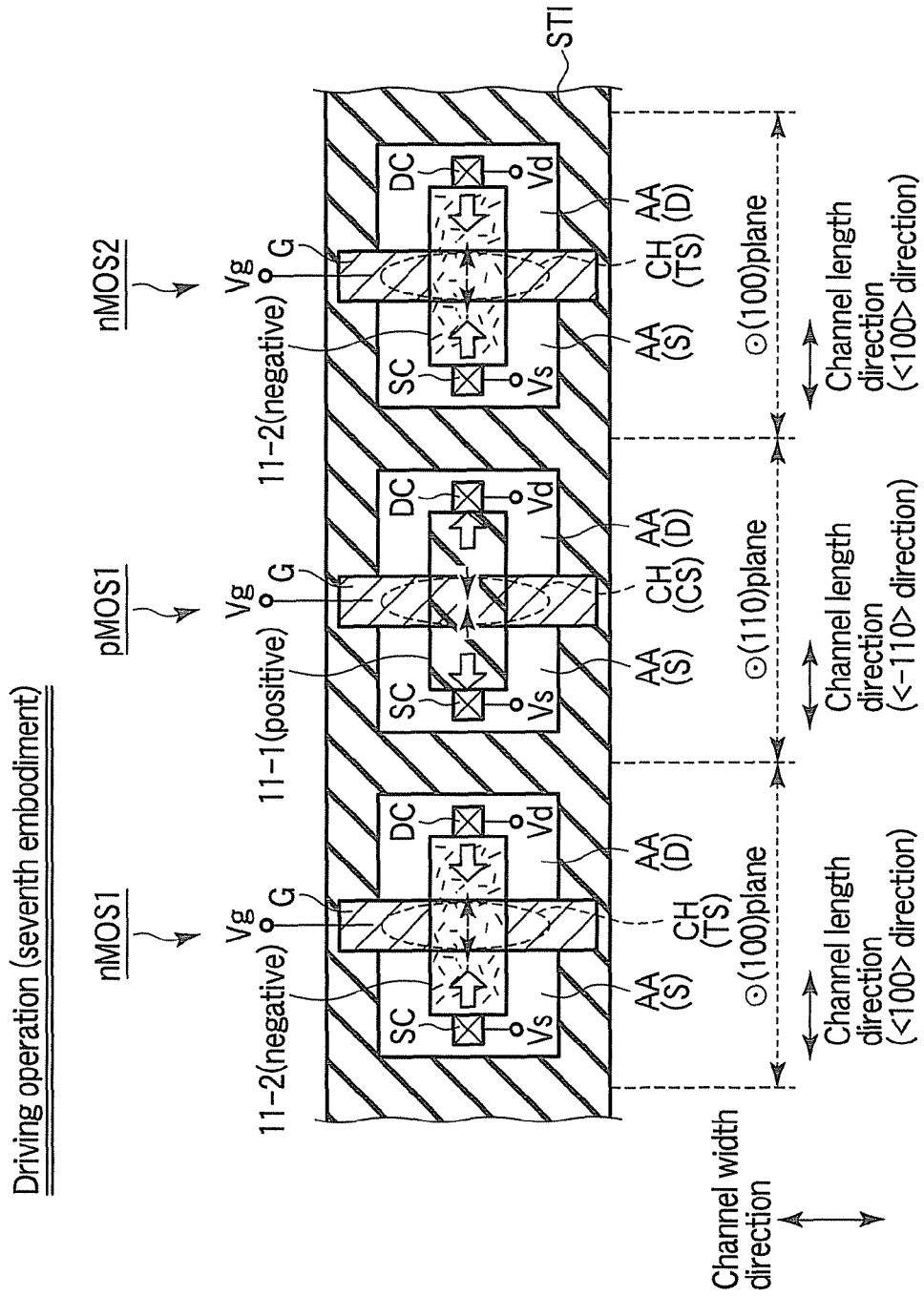
F I G. 46

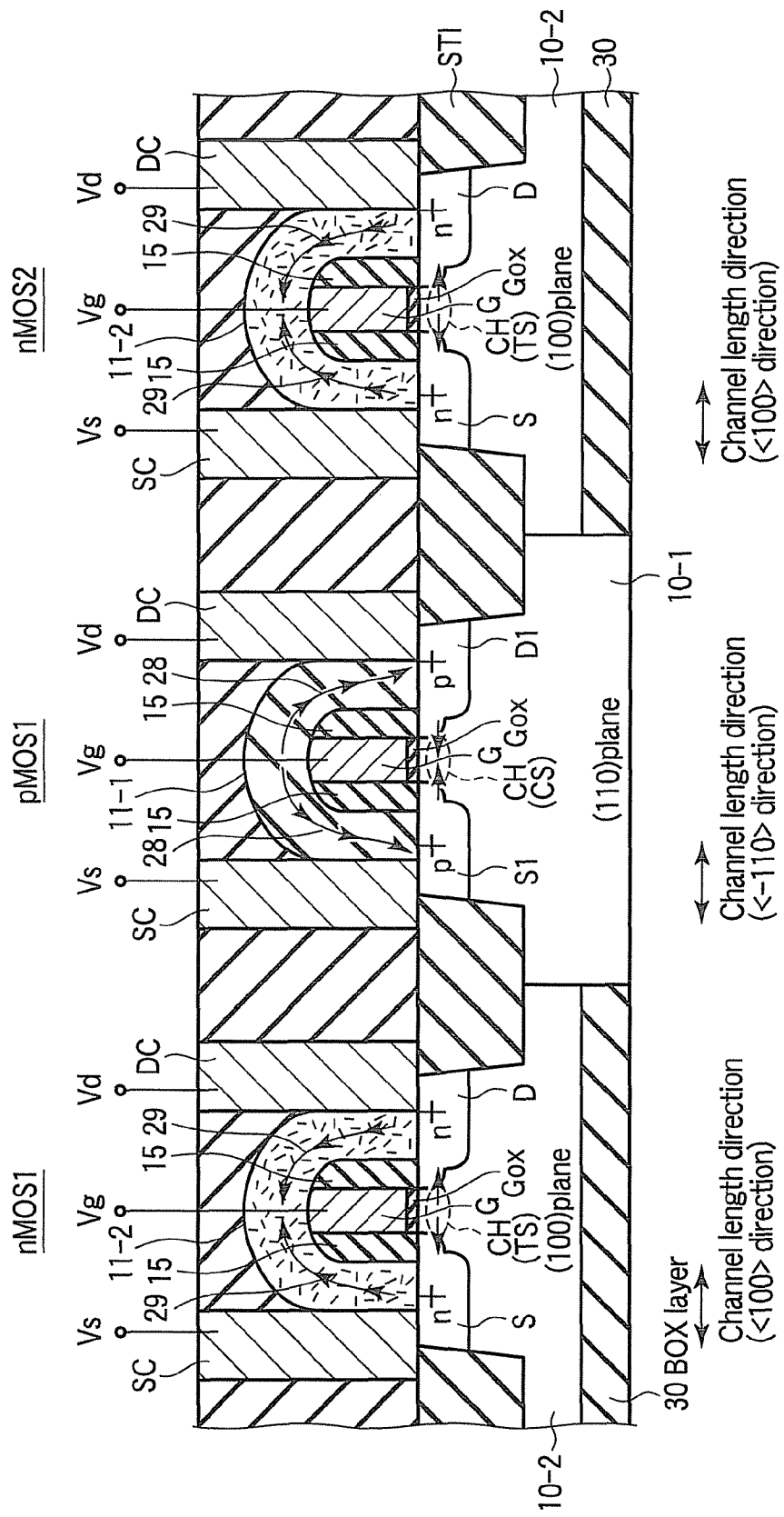
F I G. 47

Manufacturing method (seventh embodiment)

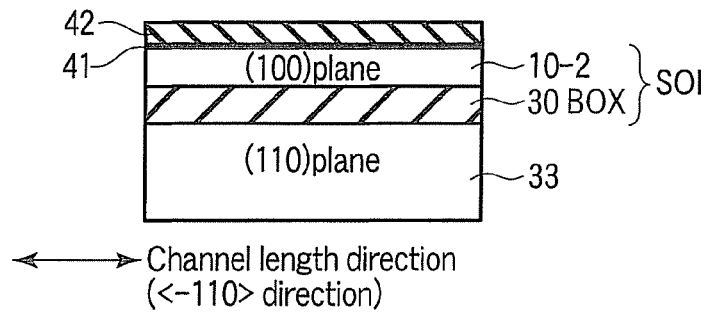
F I G. 51
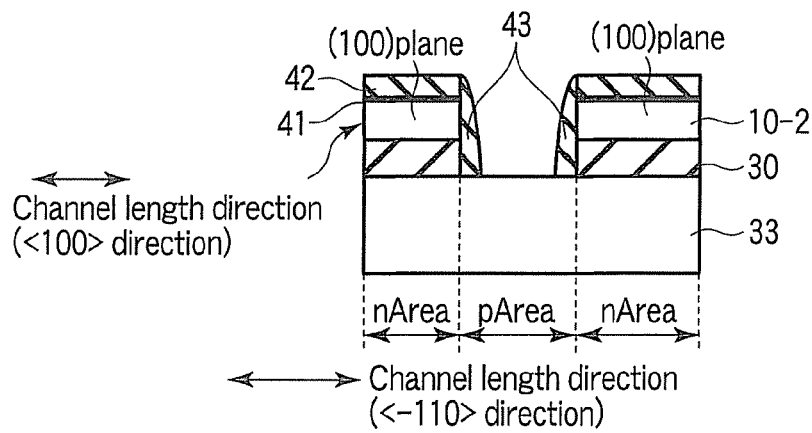
F I G. 52
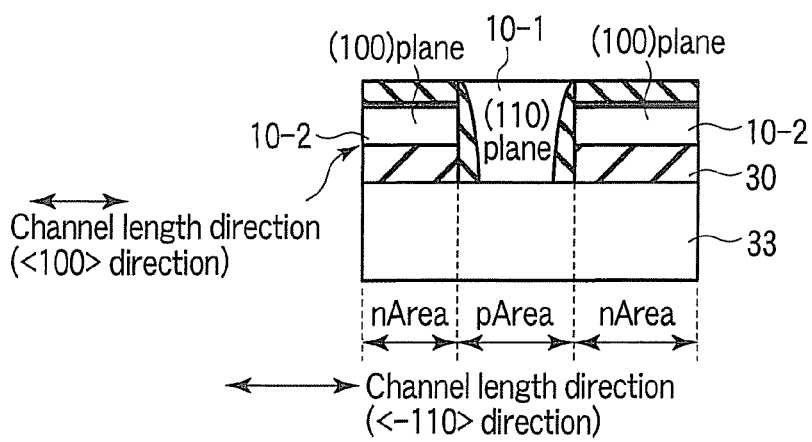
F I G. 53

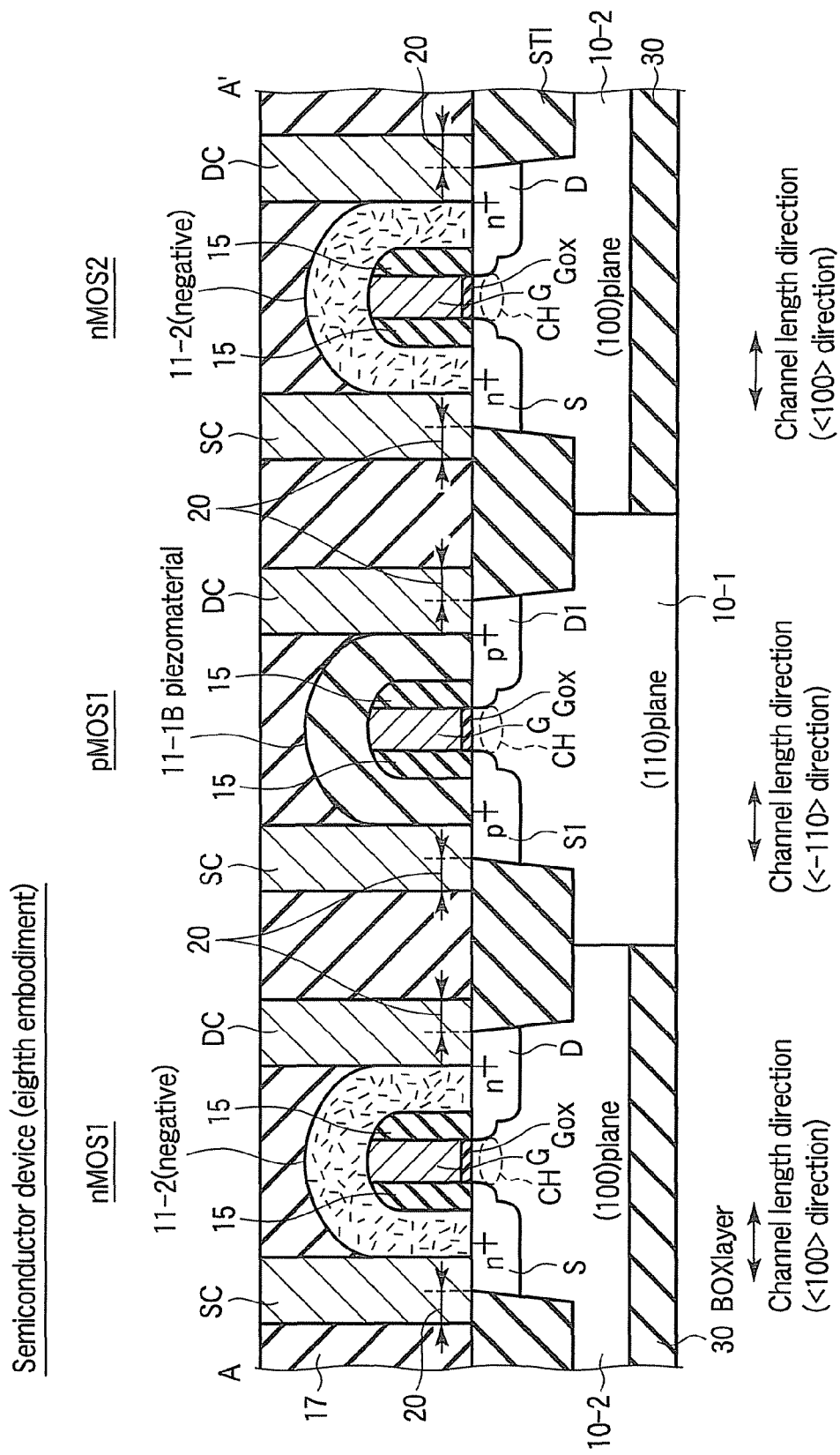
F I G. 57

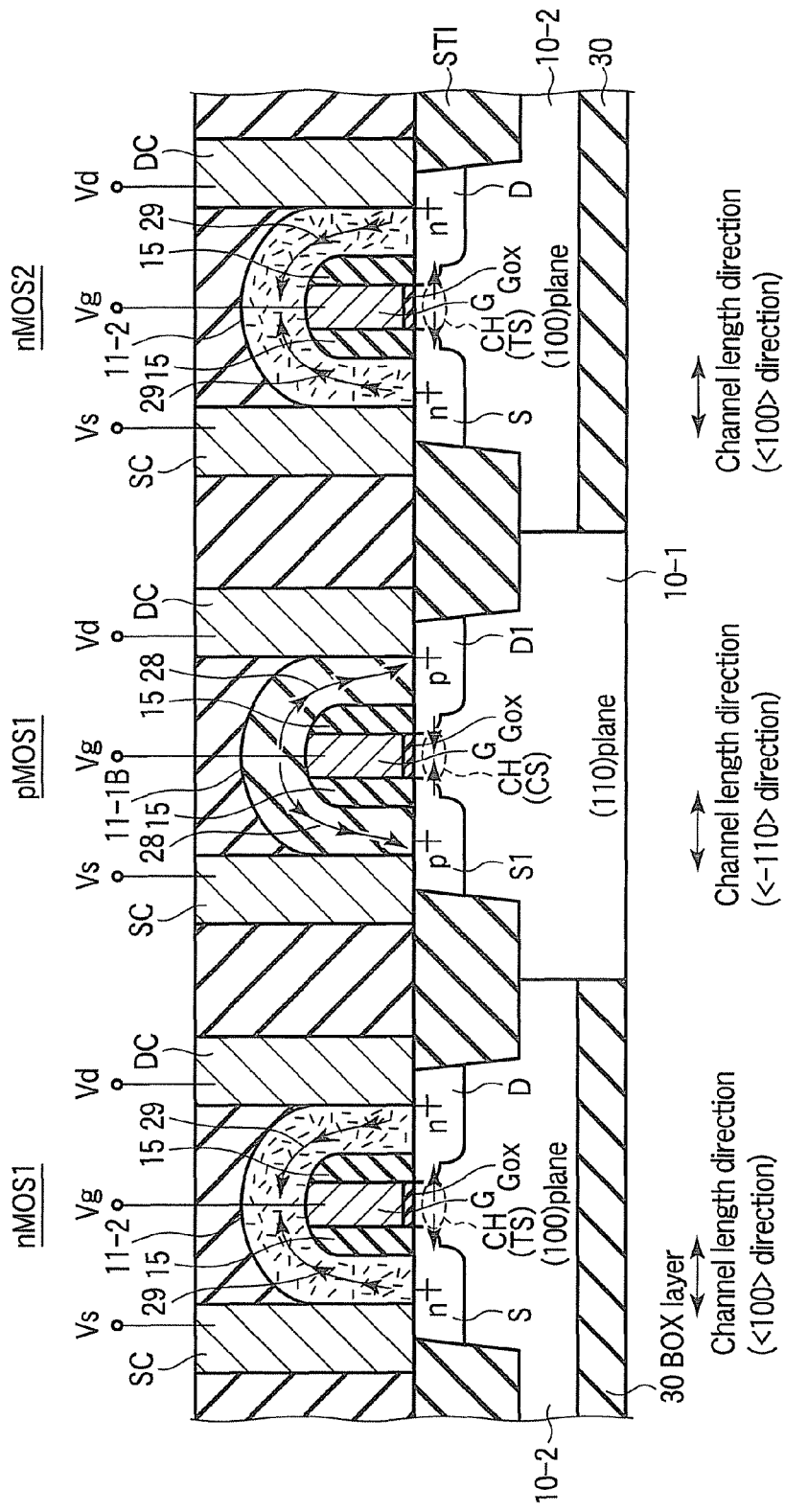
F I G. 58

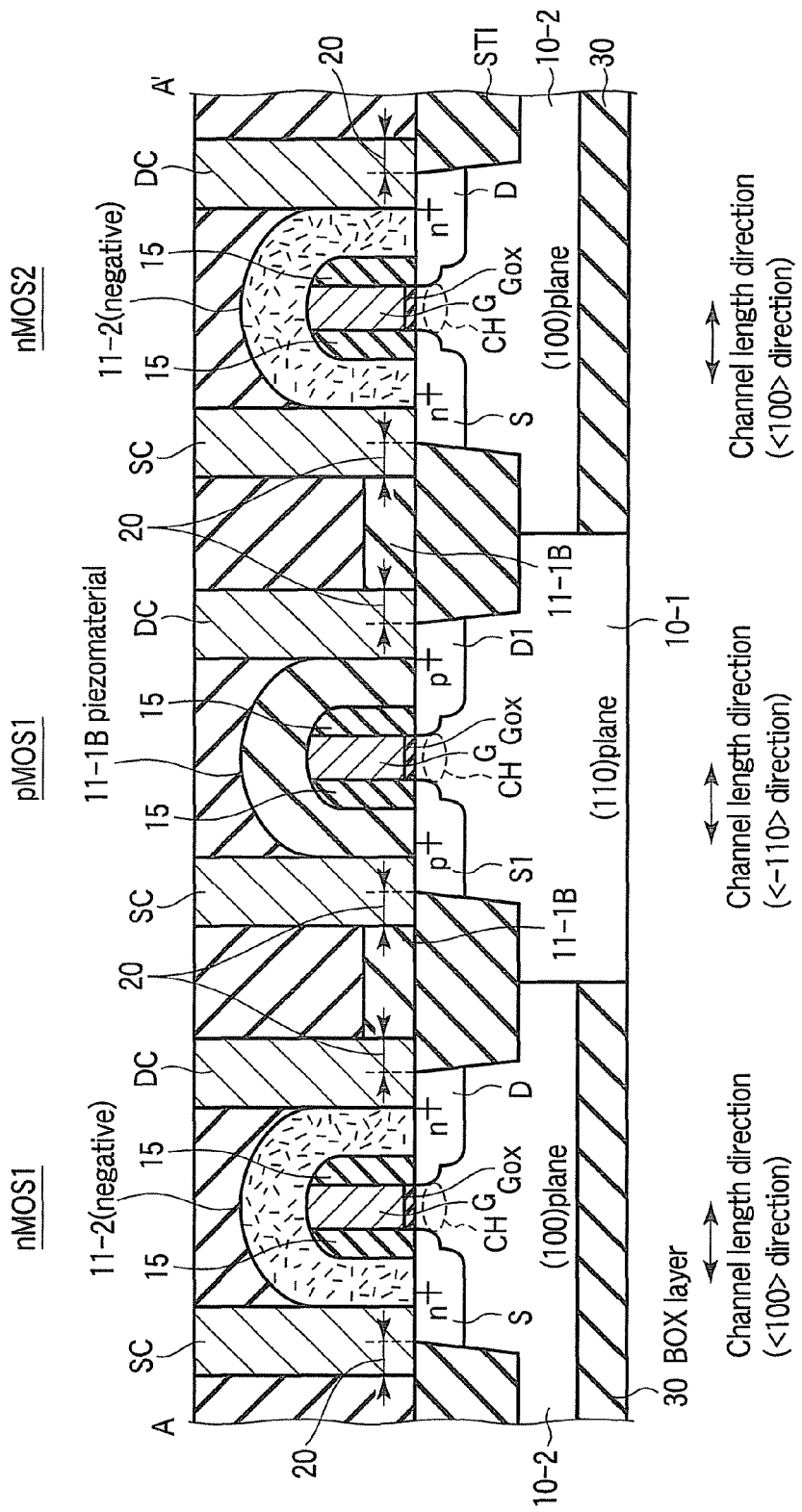
F I G. 59

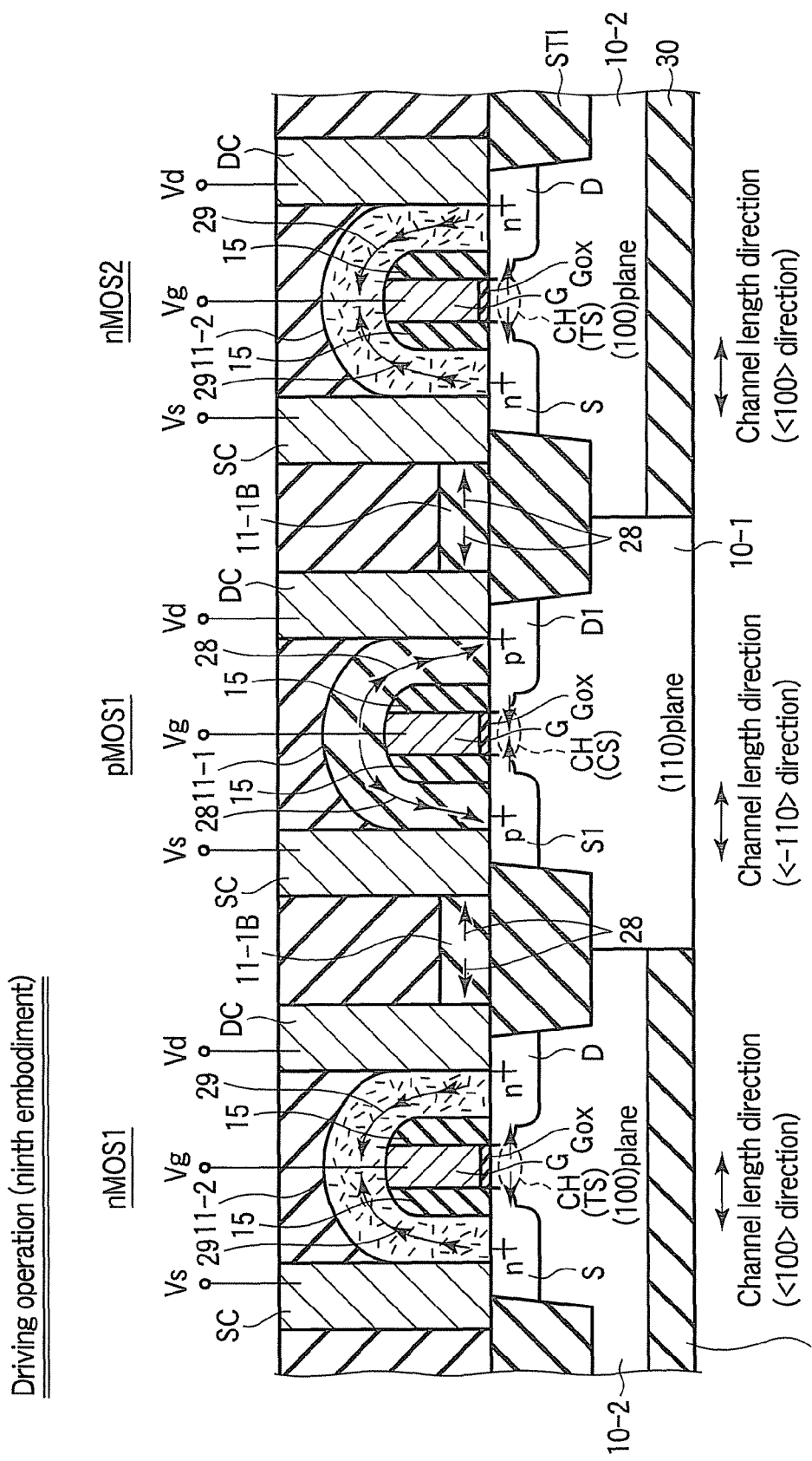
F I G. 60

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2009-005847, filed Jan. 14, 2009, the entire contents of which are incorporated herein by reference.

BACKGROUND OF THE INVENTION

1. Field of the Invention

The present invention relates to a semiconductor device and a method of manufacturing the same.

2. Description of the Related Art

As one of active elements constituting an LSI (large-scale integration), there is known an insulated-gate field-effect transistor (hereinafter referred to as "transistor") which is typified by a MOS (metal oxide semiconductor) transistor or a MIS (metal insulator semiconductor) transistor. With further microfabrication of such transistors, the number of transistors in an LSI becomes enormous. Thus, in proportion to the number of transistors, the amount of heat produced by the LSI becomes greater. As a result, the lattice vibration of a crystal lattice of silicon, etc., which constitutes a transistor, becomes large, and the resultant thermal disturbance becomes a factor which decreases the mobility of electrons or holes (carriers).

Under the circumstance, there has been proposed a semiconductor device wherein a desired stress is applied to a channel region of a transistor, for example, by means of an insulating material, thereby improving the mobility of electrons or holes, which are carriers (see, for instance, Jpn. Pat. Appln. KOKAI Publication No. 2004-63591).

BRIEF SUMMARY OF THE INVENTION

According to an aspect of the present invention, there is provided a semiconductor device comprising a first insulated-gate field-effect transistor which is disposed on a semiconductor substrate having an element formation plane in a (110) plane direction, and which has a channel length direction in a <−110> direction; a second insulated-gate field-effect transistor which is disposed on the semiconductor substrate, has a channel length direction in the <−110> direction, and neighbors the first insulated-gate field-effect transistor in the channel length direction; and a first liner insulation film which is provided in a manner to cover the first and second insulated-gate field-effect transistors, the first liner insulation film including a piezomaterial, having a positive expansion coefficient, and applying a compressive stress by operation heat to the first and second insulated-gate field-effect transistors in the channel length direction.

According to another aspect of the invention, there is provided a semiconductor device comprising a first insulated-gate field-effect transistor which is disposed on a semiconductor substrate having an element formation plane in a (110) plane direction, and which has a channel length direction in a <−110> direction; a second insulated-gate field-effect transistor which is disposed on a semiconductor substrate having an element formation plane in a (100) plane direction, and which has a channel length direction in a <100> direction, the second insulated-gate field-effect transistor neighboring the first insulated-gate field-effect transistor in the channel length direction; a first liner insulation film which is provided in a manner to cover the first insulated-gate field-effect transistor, the first liner insulation film including a piezomaterial, having a positive expansion coefficient, and applying a compressive stress by operation heat to the first insulated-gate field-effect transistor in the channel length direction; and a second liner insulation film which is provided in a manner to cover the second insulated-gate field-effect transistor, the second liner insulation film having a negative expansion coefficient, and applying a tensile stress by operation heat to the second insulated-gate field-effect transistor in the channel length direction.

According to still another aspect of the invention, there is provided a method of manufacturing a semiconductor device comprising forming a first insulated-gate field-effect transistor which is disposed on a semiconductor substrate having an element formation plane in a (110) plane direction, and which has a channel length direction in a <−110> direction; forming a second insulated-gate field-effect transistor which is disposed on the semiconductor substrate, has a channel length direction in the <−110> direction, and neighbors the first insulated-gate field-effect transistor in the channel length direction; and forming a first liner insulation film which is provided in a manner to cover the first and second insulated-gate field-effect transistors, the first liner insulation film including a piezomaterial, having a positive expansion coefficient, and applying a compressive stress by operation heat to the first and second insulated-gate field-effect transistors in the channel length direction.

BRIEF DESCRIPTION OF THE SEVERAL VIEWS OF THE DRAWING

FIG. 3 is a cross-sectional view taken along line III-III in FIG. 2;

FIG. 4 is a graph showing the relationship between a channel width direction (W) and a drive current variation amount;

FIG. 13 is a plan view showing a semiconductor device according to a first embodiment of the present invention;

FIG. 14 is a cross-sectional view taken along line A-A' in FIG. 13;

FIG. 15 is a plan view for explaining the driving operation of the semiconductor device according to the first embodiment;

FIG. 16 is a cross-sectional view for explaining the driving operation of the semiconductor device according to the first embodiment;

FIG. 18 is a plan view showing a semiconductor device according to a second embodiment of the present invention;

FIG. 19 is a cross-sectional view taken along line A-A' in FIG. 18;

FIG. 21 is a plan view showing a semiconductor device according to a third embodiment of the present invention;

FIG. 22 is a plan view for explaining the driving operation of the semiconductor device according to the third embodiment;

FIG. 23 is a plan view showing a semiconductor device according to a fourth embodiment of the present invention;

FIG. 25 is a plan view for explaining the driving operation of the semiconductor device according to the fourth embodiment;

FIG. 34 is a plan view showing a semiconductor device according to a fifth embodiment of the present invention;

FIG. 35 is a cross-sectional view taken along line A-A in FIG. 34;

FIG. 40 is a cross-sectional view showing a semiconductor device according to Modification 2;

FIG. 44 is a plan view showing a semiconductor device according to a seventh embodiment of the present invention;

FIG. 45 is a cross-sectional view taken along line A-A in FIG. 44;

FIG. 46 is a plan view for explaining the driving operation of the semiconductor device according to the seventh embodiment;

FIG. 47 is a cross-sectional view for explaining the driving operation of the semiconductor device according to the seventh embodiment;

FIG. 51 is a cross-sectional view illustrating a fabrication step of the semiconductor device according to the seventh embodiment;

FIG. 52 is a cross-sectional view illustrating a fabrication step of the semiconductor device according to the seventh embodiment;

FIG. 53 is a cross-sectional view illustrating a fabrication step of the semiconductor device according to the seventh embodiment;

FIG. 57 is a cross-sectional view showing a semiconductor device according to an eighth embodiment of the present invention;

FIG. 58 is a cross-sectional view showing the semiconductor device according to the eighth embodiment of the present invention;

FIG. 59 is a cross-sectional view showing a semiconductor device according to a ninth embodiment of the present invention; and FIG. 60 is a cross-sectional view showing the semiconductor device according to the ninth embodiment of the present invention.

DETAILED DESCRIPTION OF THE INVENTION

The above-mentioned patent document (Jpn. Pat. Appln. KOKAI Publication No. 2004-63591) proposes a semiconductor device in which the mobility of carriers is enhanced.

In this structure, however, the stress that can be applied is constant, relative to the temperature rise of the semiconductor substrate, etc. Consequently, if the temperature of the LSI rises from room temperature to a high temperature (e.g. about 200° C.), there is a tendency that the effect by the stress becomes deficient due to an intensified thermal disturbance of silicon, etc., and the mobility of electrons or holes decreases.

Embodiments of the invention, which are to be described below, propose semiconductor devices and manufacturing methods thereof, which can make the mobility of carriers higher as the temperature becomes higher.

[Re: Knowledge about Plane Directions and Stress]

To begin with, with reference to FIG. 1 to FIG. 11A, 11B, a description is given of the outline of the knowledge about plane directions and stress, which made it possible for the inventor to invent the semiconductor device and the manufacturing method thereof according to the present invention.

<1. Plane Direction (110) of Semiconductor Substrate and the Structure of Transistor>

Figure 1A:
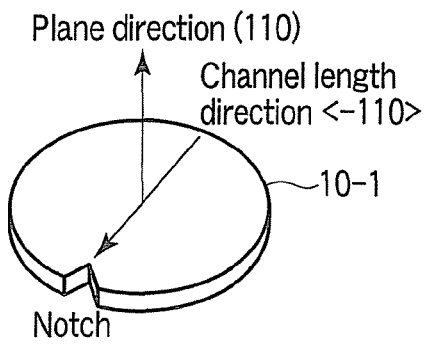
FIG. 1A is a perspective view for explaining a plane direction and a channel length direction of a semiconductor substrate according to the present invention.

1-1. Plane Direction of Semiconductor Substrate and the Channel Length Direction of Transistor As shown in FIG. 1A, the plane direction of an element formation plane of a semiconductor substrate (silicon (Si) substrate in this example) 10-1, which is described below, is a (110) plane direction.

Figure 1B:
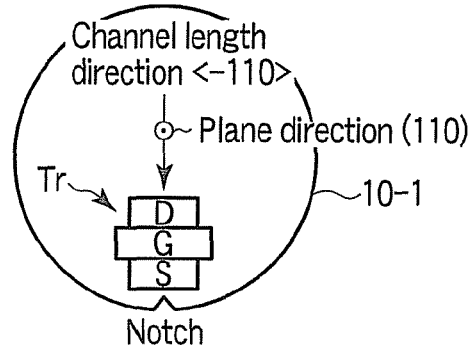
FIG. 1B is a plan view corresponding to FIG. 1A.

In addition, as shown in FIG. 1B, the channel length direction of a transistor Tr, which is disposed on the (110) plane of the semiconductor substrate 10-1, is a <–110> direction along a notch. In other words, the channel length direction of a transistor Tr is the <–110> direction which is perpendicular to a direction in which a gate electrode G is disposed.

1-2. Structure Example of the Transistor According to the Study

Figure 2:
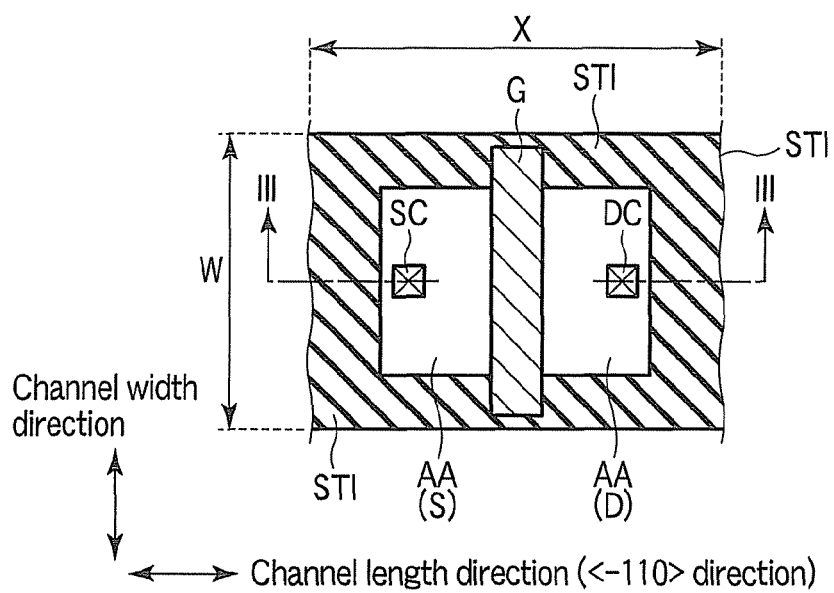
FIG. 2 is a plan view of a semiconductor device according to the invention.

Next, referring to FIG. 2 and FIG. 3, a structure example of the transistor according to the present study is described.

As shown in FIG. 2 and FIG. 3, a semiconductor device (pMOS transistor in this example) is disposed along a channel length direction that is the <–110> direction in an element region on the surface of a semiconductor substrate (n-Sisub) 10-1 having an element formation plane that is in the (110) plane direction.

In an element isolation region of the semiconductor substrate 10-1, an element isolation insulation film STI (Shallow Trench Isolation) is buried and disposed in a manner to surround the pMOS transistor.

The pMOS transistor includes a gate insulation film Gox provided on the semiconductor substrate 10-1 whose element formation plane is the (110) plane, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This pMOS transistor is an insulated-gate field-effect transistor having holes, which are doped p-type impurities, as carriers.

The gate insulation film Gox is formed of, for example, a silicon oxide film ($SiO_2$) by a thermal oxidation method.

The gate electrode G is formed of, for example, polysilicon (poly-Si).

The source S and drain D ($p^+$ layer) are formed such that p-type impurities, such as boron (B), are doped, for example, by ion implantation and are thermally diffused. The doped p-type impurities release holes serving as carriers.

The spacers 15 are formed of, e.g. a silicon nitride (SiN) film.

The contact wiring lines SC and DC are provided in an interlayer insulation film 17 on the source S and drain D. Parts of the contact wiring lines SC and DC are provided on fringe portions 20 of the element isolation insulation films STI.

As shown in FIG. 2, the dimension in the channel width direction of an active area AA of the semiconductor device (insulated-gate field-effect transistor) is indicated by W, and the dimension in the channel length direction (<–110> direction) is indicated by X. The result of the study is described below.

<2. Relationship Between W or X and the Variation Amount of Drive Current>

2-1. The Relationship Between the Dimension W in the Channel Width Direction and the Variation Amount of Drive Current Next, referring to FIG. 4, a description is given of the relationship between the dimension W (μm) in the channel width direction and the variation amount (%) of drive current. The result shown in FIG. 4 relates to a TEG (Test Element Group) including pMOS transistors and nMOS transistors each having a channel length L of 0.04 μm to 1 μm. In other words, FIG. 4 shows how the drive current changes in relation to the variation of the dimension W.

As shown in FIG. 4, it is understood that if the dimension W in the channel width direction varies in a range of about 10 μm to 0.2 μm, the variation amount of drive current (drive current change) of the pMOS transistor and nMOS transistor varies up to about 30%. Specifically, it is clear that as the dimension W in the channel width direction becomes smaller, the element performances of both the pMOS transistor and nMOS transistor are improved by 30%.

In FIG. 4, the sign "+/–" indicates the direction of electric current. Specifically, the direction of current in the n-type transistor is "+", and the direction of current in the p-type transistor is "–". This description also applies to FIG. 5 and FIG. 6.

2-2. The Relationship Between the Dimension X in the Channel Length Direction and the Variation Amount of Drive Current Next, referring to FIG. 5, a description is given of the relationship between the dimension X (μm) in the channel length direction and the variation amount (%) of drive current. The result shown in FIG. 5 relates to a TEG including nMOS transistors each having a channel length L of 0.04 μm to 0.06 μm, and pMOS transistors each having a channel length L of 0.04 μm to 1 μm. In other words, FIG. 5 shows how the drive current changes in relation to the variation of the dimension X.

Figure 5:
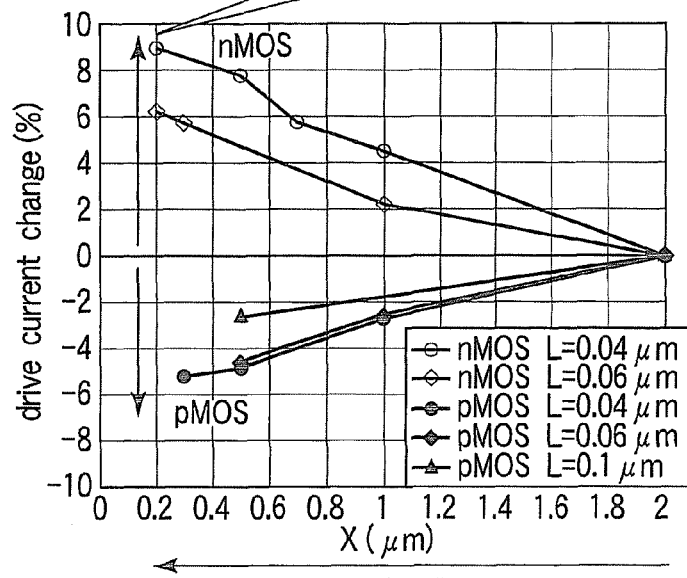
FIG. 5 is a graph showing the relationship between a channel length direction (X) and a drive current variation amount.

As shown in FIG. 5, it is understood that if the dimension X in the channel length direction varies in a range of about 2 μm to 0.2 μm, the drive currents of the pMOS transistor and nMOS transistor increase by about 6% and 10%, respectively. Specifically, it is clear that as the dimension X in the channel length direction becomes smaller, the element performances of both the pMOS transistor and nMOS transistor are improved.

2-3. The Relationship Between the Dimension X and the Variation Amount of Drive Current Next, referring to FIG. 6, a description is given of the relationship between the dimension X (μm) in the channel length direction and the variation amount (%) of drive current. The result shown in FIG. 6 relates to a TEG including nMOS transistors and pMOS transistors each having a fixed channel width of 0.5 μm. In other words, FIG. 6 shows how the drive current changes in relation to the variation of the dimension X, in the same manner as described above.

Figure 6:
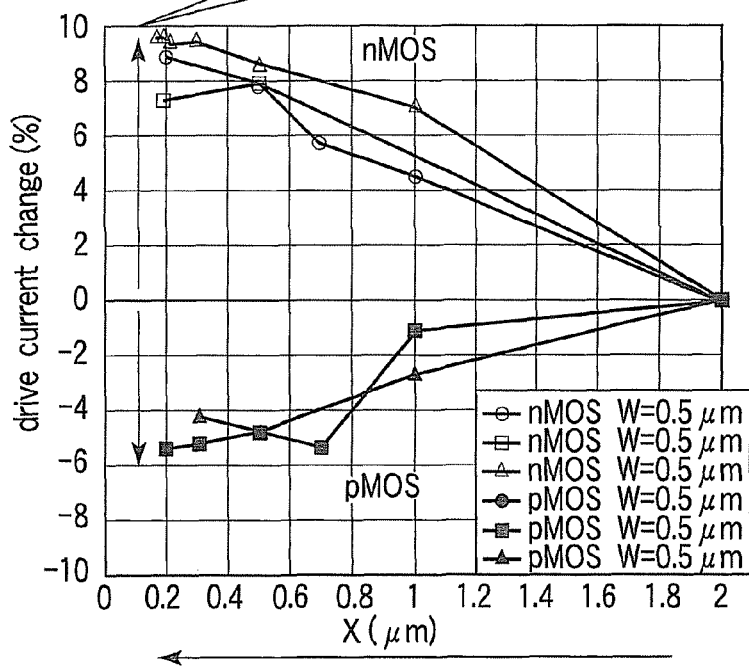
FIG. 6 is a graph showing the relationship between a channel length direction (X) and a drive current variation amount.

As shown in FIG. 6, it is understood that if the dimension X in the channel length direction varies in a range of about 2 μm to 0.2 μm, the drive currents of the pMOS transistor and nMOS transistor increase by about 6% and 10%, respectively. Specifically, it is clear that as the dimension X in the channel length direction becomes smaller, the element performances of both the pMOS transistor and nMOS transistor are improved.

<3. Relationship of the Plane Directions that are Advantageous in Association with the Conductivity Types of Transistors>

Figure 7:
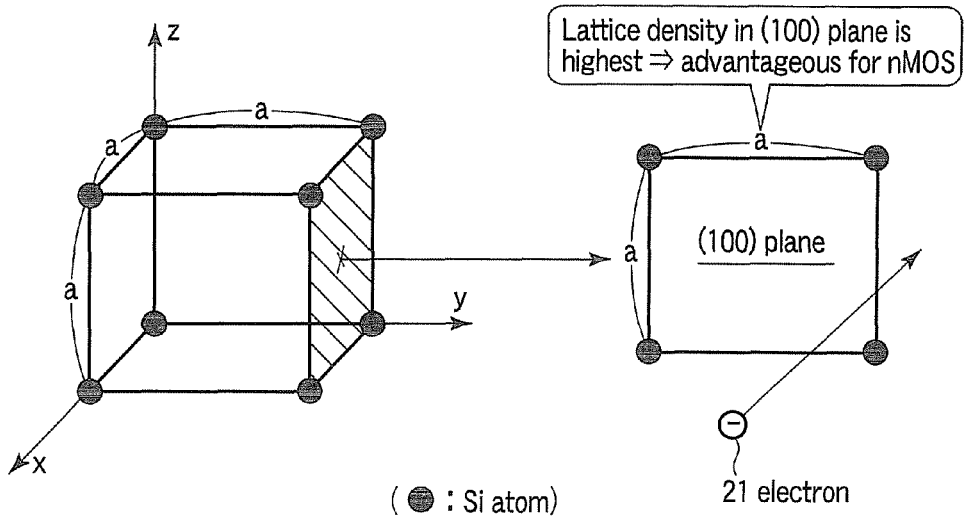
FIG. 7 is a view schematically showing a lattice density in a (100) plane direction.
Figure 8:
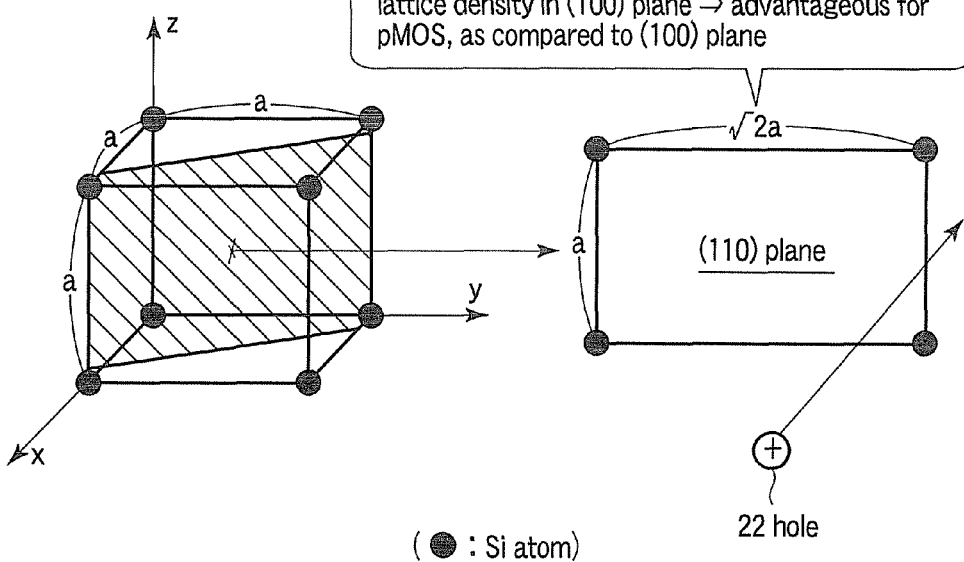
FIG. 8 is a view schematically showing a lattice density in a (110) plane direction.

Next, referring to FIG. 7 and FIG. 8, a description is given of the relationship of the plane directions that are advantageous in association with the conductivity types of transistors.

3-1. Re: nMOS Transistor

To begin with, referring to FIG. 7, the plane direction that is advantageous for the nMOS transistor is explained. FIG. 7 is a view for explaining the lattice density of the silicon (Si) substrate in the (100) plane. The distance between neighboring lattices of silicon atoms is a (Å).

As shown in FIG. 7, the (100) plane has a square shape having each side with a shortest distance a (Å) between neighboring silicon atoms. Accordingly, the lattice density is highest in the plane direction of the (100) plane. Thus, it appears that the mobility of carriers decreases when the carriers pass through the channel of silicon in the (100) plane direction.

However, in the case of the nMOS transistor, the carrier is an electron 21 having a small volume. Thus, even if the (100) plane has the highest lattice density, the mobility of electron 21 does not remarkably decrease.

In addition, in the case where a silicon oxide ($SiO_2$) film, for instance, is applied to the gate insulation film, since the lattice density is highest in the (100) plane, the bond between a silicon atom (Si) and oxygen atoms ($O_2$) can be strengthened, and the reliability of the gate insulation film can advantageously be enhanced.

Therefore, it can be said that the plane direction that is advantageous for the nMOS transistor is the (100) plane direction, from the standpoint of the mobility and the reliability of the gate insulation film.

3-2. Re: pMOS Transistor

Next, referring to FIG. 8, the plane direction that is advantageous for the pMOS transistor is explained. FIG. 8 is a view for explaining the lattice density of the silicon (Si) substrate in the (110) plane.

As shown in FIG. 8, the (110) plane has a rectangular shape having a side with a shortest distance a (Å) between neighboring silicon atoms and a side with a distance $\sqrt{2}a$ (Å). Accordingly, compared to the above-described (100) plane, the (110) plane has a lower lattice density.

In the case of the pMOS transistor, the carrier is a hole 22 having a relatively greater volume than the electron 21. Thus, the (110) plane having a relatively small lattice density is advantageous in enhancing the mobility of the hole 22.

Therefore, it can be said that the plane direction that is advantageous for the pMOS transistor is the (110) plane direction, from the standpoint of the mobility.

The description of the mobility in the sections 3-1 and 3-2 are general ones, with attention being paid to only the crystal lattices of silicon atoms. To be more precise, it is necessary to additionally consider the result of strict calculations of band structures, etc. However, with the agreement to the above-described experimental results, etc., the crystal lattice of silicon atoms can be understood as one of essential factors.

<4. Conclusion>

The conclusions of sections 4-1 to 4-3 below, which have been obtained by the inventor on the basis of the above study, are described.

4-1. Stress that is Advantageous for Both pMOS and nMOS Transistors

Figure 9:
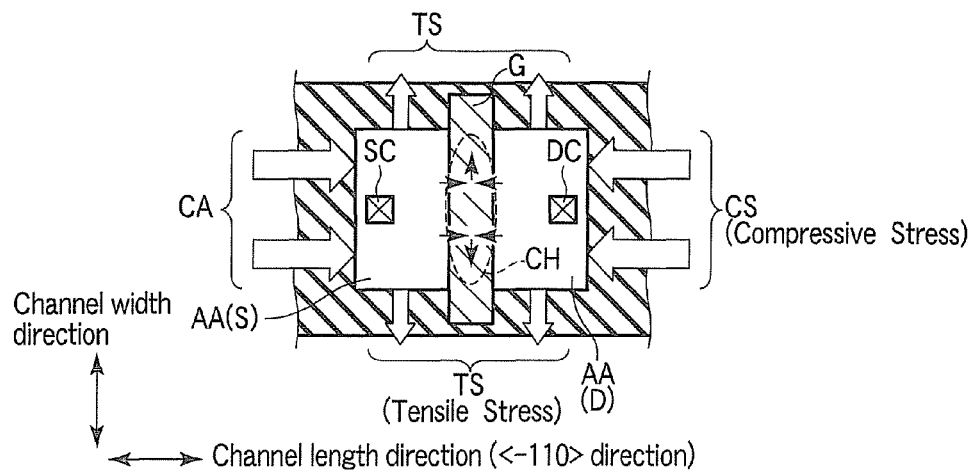
FIG. 9 is a plan view showing a stress which is advantageous for a pMOS and an nMOS.

To begin with, referring to FIG. 9, a description is given of the stress which is advantageous for both the pMOS and nMOS transistors.

The stress which is advantageous for both the pMOS and nMOS transistors is as shown in FIG. 9. A compressive stress CS is applied to a channel CH in the channel length direction, and a tensile stress TS is applied to the channel CH in the channel width direction. Alternatively, either the compressive stress CS or the tensile stress TS may be applied.

As regards the channel length direction (X dimension), as shown in FIG. 5 and FIG. 6, the device performances of both the pMOS transistor and nMOS transistor are improved as the dimension X in the channel length direction becomes smaller. The compressive stress CS is applied in the channel length direction, in consideration of the fact that "the compressive stress increases in the channel length direction as the dimension X becomes smaller".

Similarly, as regards the channel width direction (W dimension), as shown in FIG. 4, the device performances of both the pMOS transistor and nMOS transistor are improved as the dimension W in the channel width direction becomes smaller. The tensile stress TS is applied in the channel width direction, in consideration of the fact that "the tensile stress increases in the channel width direction as the dimension W becomes smaller".

4-2. Plane Directions that are Advantageous for the nMOS and pMOS Transistors

Figure 10:
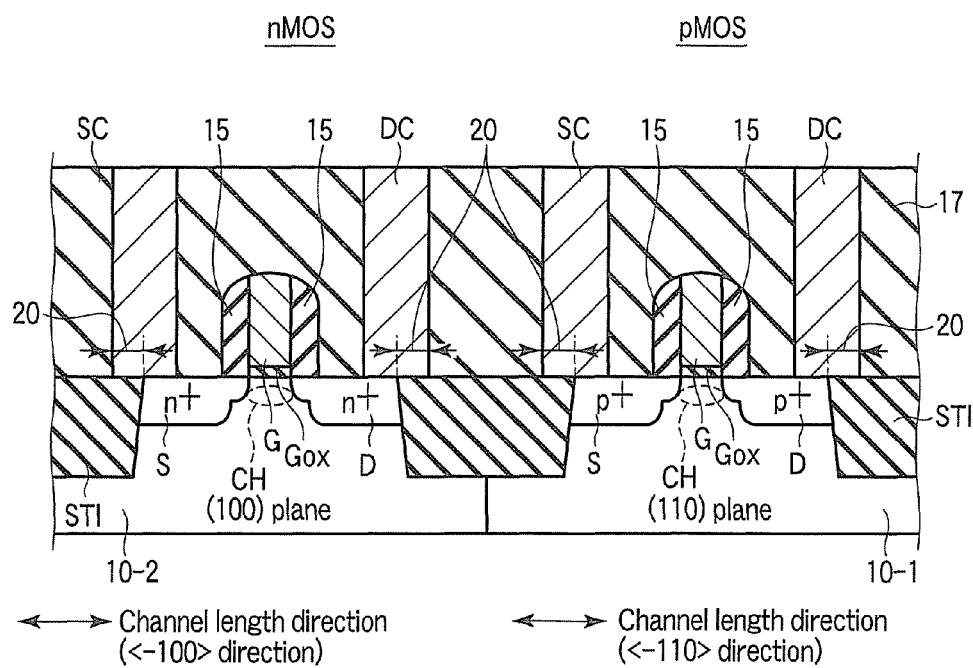
FIG. 10 is a cross-sectional view showing a plane direction which is advantageous for a pMOS and an nMOS.

Next, referring to FIG. 10, the plane directions that are advantageous for the pMOS and nMOS transistors are described. The plane directions that are advantageous for the pMOS and nMOS transistors are as shown in FIG. 10.

As shown in FIG. 10, the nMOS transistor is disposed along the channel length direction that is the <100> direction on the semiconductor substrate whose element formation plane is in the (100) plane direction. As described above in section 3-1, in the case of the nMOS transistor, the carrier is the electron 21 having a small volume. Thus, even if the lattice density is highest in the (100) plane, the mobility of the electron 21 does not decrease. In addition, in the case where the silicon oxide ($SiO_2$) film, for instance, is applied to the gate insulation film, since the lattice density is highest in the (100) plane, the bond between a silicon atom (Si) and oxygen atoms ($O_2$) can be strengthened, and the reliability of the gate insulation film can advantageously be enhanced.

Therefore, it can be said that the plane direction that is advantageous for the nMOS transistor is the (100) plane direction, from the standpoint of the mobility and the reliability of the gate insulation film.

The pMOS transistor is disposed along the channel length direction that is the <−110> direction on the semiconductor substrate whose element formation plane is in the (110) plane direction. As described above in section 3-2, since the lattice density is relatively low in the (110) plane, the mobility of the hole 22 is advantageously be improved.

Therefore, if consideration is given comprehensively from the standpoint of the mobility, it can be said that the plane direction that is advantageous for the pMOS transistor is the (110) plane direction.

4-3. Re: The Channel Length Direction that is a <001> Direction Perpendicular to the <−110> Direction Next, Referring to FIG. 11 and FIG. 12, a description is given of the fact that even if the channel length direction is a <001> direction which is perpendicular to the above-described <−110> direction, the invention is applicable in the same manner as described above.

The above description has been given of the insulated-gate field effect transistor, whose channel length direction is the <−110> direction, is disposed on the semiconductor substrate having the element formation plane in the (110) plane direction. The invention, however, is not limited to the above example. The invention is similarly applicable to an insulated-gate field effect transistor whose channel length direction is set in a <001> direction which is perpendicular to the <−110> direction, with the same advantageous effect being obtained.

4-3-1. Re: The Channel Length Direction <001> of the Transistor

Figures 11A, 11B:
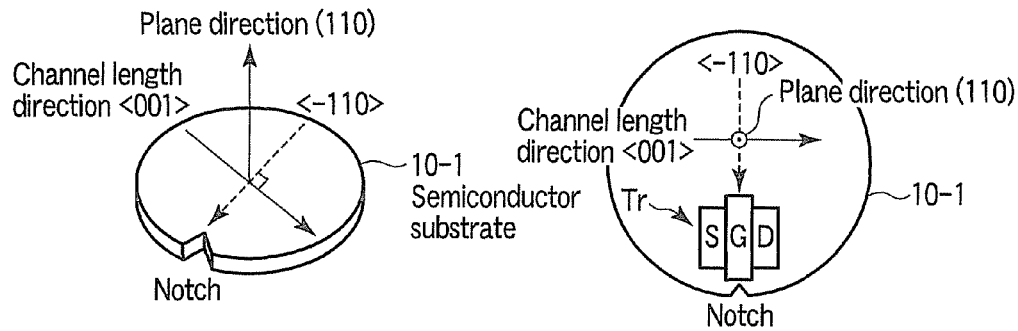
FIG. 11A and FIG. 11B are views for explaining a case in which the channel length direction is a <001> direction which is perpendicular to a <−110> direction.

As shown in FIG. 11A, the plane direction of the element formation plane of the semiconductor substrate (silicon (Si) substrate) 10-1 is the (110) plane.

As shown in FIG. 11B, the channel length direction of a transistor Tr, which is disposed in the (110) plane of the semiconductor substrate 10-1, is the <001> direction that is perpendicular to the <−110> direction (notch direction).

4-3-2. Comparison Between the Channel Length Direction <001> and the Channel Length Direction <−110>

Figure 12:
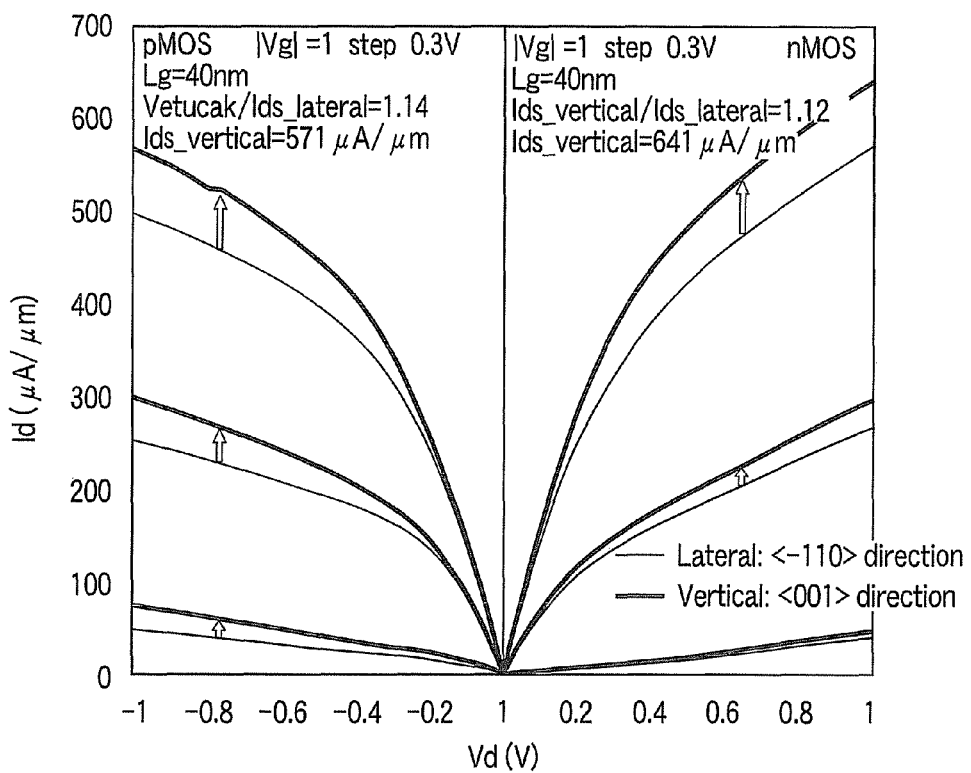
FIG. 12 is a graph for comparing the case in which the channel length direction is the <−110> direction, and the case in which the channel length direction is the <001> direction.

Next, referring to FIG. 12, a description is given of the comparison between the channel length direction <001> and the channel length direction <−110>. In FIG. 12, "Lateral" is the <−110> direction that is the above-described channel direction, and "Vertical" is the <001> direction. FIG. 12 shows the relationship between the gate voltage Vd of the pMOS and nMOS transistors, the channel length L of which is L=about 40 nm, and the drive current Id in these two directions.

As is understood from the result shown in FIG. 12, in each of the pMOS and nMOS transistors with the channel length L=about 40 nm, the transistor characteristics are better in the Vertical <001> direction than in the Lateral <−110> direction.

Thus, even in the case where the channel length direction is the <001> direction that is perpendicular to the <−110> direction, the invention is similarly applicable as in the above-described example, and the same advantageous effect can be obtained. The reason for this is that as shown in FIG. 12, the performance ratio between the case of the channel length direction <001> and the case of the channel length direction <−110> is always in a range of up to about 1.1 in both the pMOS transistor and nMOS transistor.

The description has been given above of the outline of the study of plane directions and stress, which made it possible for the inventor to invent the semiconductor device and the manufacturing method thereof according to the present invention.

The semiconductor device and the manufacturing method thereof, to which the above study is applied and which can improve the mobility of carriers as the temperature rises, are proposed below. Embodiments of the semiconductor device and the manufacturing method thereof are described concretely.

Embodiments of the invention are described with reference to the accompanying drawings. In the description below, common parts are denoted by like reference numerals throughout the drawings.

First Embodiment

An Example of Stress Application by Liner Insulation Film

Referring to FIG. 13 to FIG. 17, a semiconductor device and a manufacturing method thereof according to a first embodiment of the present invention are described.

<Structure Example>

Referring to FIG. 13 and FIG. 14, a description is given of a structure example of the semiconductor device according to the first embodiment.

As shown in FIG. 13 and FIG. 14, a plurality of transistors (nMOS1, pMOS1, nMOS2) are adjacently disposed on a semiconductor substrate having an element formation plane in the (110) plane direction.

In addition, a first liner insulation film 11-1, which has a positive expansion coefficient and applies a compressive stress to the transistor (nMOS1, pMOS1, nMOS2) in the channel length direction by operation heat, is disposed in a manner to cover the plural transistors (nMOS1, pMOS1, nMOS2).

The p-type MOS transistor (pMOS1) has a channel length direction in the <−110> direction and is disposed on a semiconductor substrate 10-1 having an element formation plane in the (110) plane direction.

The p-type MOS transistor (pMOS1) includes a gate insulation film Gox provided on the semiconductor substrate 10-1, a gate electrode G provided on the gate insulation film Gox, a source S and a drain D provided spaced apart in the semiconductor substrate 10-1 in a manner to sandwich the gate electrode G, spacers 15 provided on side walls of the gate electrode G, and contact wiring lines SC and DC. This pMOS transistor is an insulated-gate field-effect transistor having holes, which are doped p-type impurities, as carriers.

The gate insulation film Gox is formed of, for example, a silicon oxide film ($SiO_2$) by a thermal oxidation method.

The gate electrode G is formed of, for example, polysilicon (poly-Si).

The source S and drain D ($p^+$ layer) are formed such that p-type impurities, such as boron (B), are doped in the semiconductor substrate 10-1, for example, by ion implantation and are thermally diffused. The doped p-type impurities release holes serving as carriers.

The spacers 15 are formed of, e.g. a silicon nitride (SiN) film.

The contact wiring lines SC and DC are provided in an interlayer insulation film 17 on the source S and drain D. Parts of the contact wiring lines SC and DC are provided on fringe portions 20 of an element isolation insulation film STI.

The source S and drain D ($n^+$ layer) of the n-type MOS transistor (nMOS1, nMOS2) are formed such that n-type impurities, such as arsenic (As), are doped in the semiconductor substrate 10-1, for example, by ion implantation and are thermally diffused. The doped n-type impurities release electrons serving as carriers.

The first liner insulation film 11-1 is a liner insulation film of the transistor (nMOS1, pMOS1, nMOS2), which is disposed in the channel length direction. For example, the first liner insulation film 11-1 is formed of a silicon nitride film (SiN film) having a positive expansion coefficient (positive expansion factor) [$\Delta V/V/\Delta T$] (V: volume, T: temperature, $\Delta T$: volume variation). The first liner insulation film 11-1 may be formed of a film including a piezomaterial, as will be described later.

The positive expansion coefficient, in this context, refers to a ratio at which the volume increases in accordance with an increase in temperature. The above-described compressive stress in this embodiment is, e.g. about several to several-ten GPa. Most of substances expand in accordance with an increase in temperature, and thus have positive expansion coefficients. Accordingly, there are many choices of materials having positive expansion coefficients. Any material, which should preferably have a high expansion coefficient and does not adversely affect device performances, is applicable as a material of the first liner insulation film 11-1 of the present invention. For example, it is possible to apply a material which is obtained by adding to a silicon oxide film ($SiO_2$ film) such a composition as to increase the expansion coefficient. Other modes of the first liner insulation film 11-1 may include an amorphous mode and a mode in which the composition of glass ceramics is varied. Aside from the silicon oxide film ($SiO_2$ film), an aluminum oxide film ($Al_2O_3$ film) and an aluminum nitride film (AlN film), which have large thermal expansion coefficients and large elastic coefficients, may be used as the liner insulation film having a positive expansion coefficient.

<Application of Stress at Time of Driving Operation>

Next, referring to FIG. 15 and FIG. 16, a description is given of the application of stress at the time of the driving operation of the semiconductor device according to the first embodiment.

As shown in FIG. 15 and FIG. 16, in the above-described structure, when the transistor (nMOS1, pMOS1, nMOS2) is driven, a source voltage Vs, a drain voltage Vd and a predetermined gate voltage Vg are applied. Then, holes or electrons, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1, the first liner insulation layer 11-1 expands in accordance with its own positive expansion coefficient. Accordingly, a strain 28, which causes stretching deformation, occurs in the first liner insulation film 11-1. As a result, a desired compressive stress CS is caused to occur in the channel region CH. In this state, the holes or electrons, which are carriers, are passed, and the transistor (nMOS1, pMOS1, nMOS2) is driven.

Figure 17:
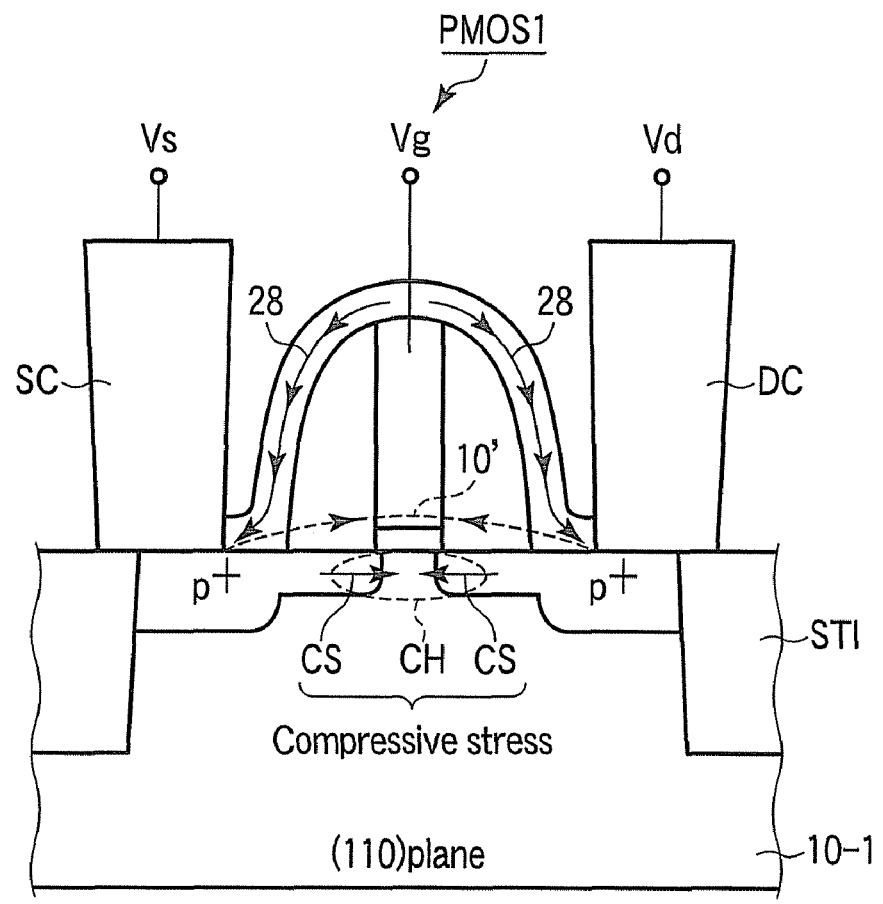
FIG. 17 is a cross-sectional view for explaining the application of stress in the semiconductor device according to the first embodiment.

Referring to FIG. 17, the application of stress is explained in greater detail. In this description, the transistor pMOS is taken as an example, and a depiction of hatching is omitted.

As shown in FIG. 17, in the case of the above-described relationship in voltage, the strain 28, which causes stretching deformation, occurs in the first liner insulation film 11-1 by its own positive expansion coefficient. Then, by the occurring strain 28, the semiconductor substrate 10-1 under the gate electrode tries to deform, as indicated by a broken line 10'. As a result, the desired compressive stress CS can be caused to occur in the channel region CH of the transistor pMOS1.

As has been described above, according to the structure of the present embodiment, even in the case where the temperature of the semiconductor substrate 10-1 rises to high temperatures, the mobility of holes or electrons, which are carriers of the transistor, can be increased. This is clear from the result of the study shown in FIG. 5 and FIG. 6 in the above sections 2-2 and 2-3.

In addition, in the case of the present embodiment, the contact wiring lines SC and DC are connected to one end and the other end of the first liner insulation films 11-1. Thus, also because the operation heat occurring in the contact wiring lines SC and DC is directly conducted to the first liner insulation film 11-1, the mobility of carriers can advantageously be improved.

Needless to say, the same advantageous effect can be obtained, not only by the above-described operation heat occurring due to the driving operation of the transistor, but also by the operation heat, in a broader sense, occurring when the LSI including this transistor is operated.

<Advantageous Effects>

With the semiconductor device and the manufacturing method thereof according to the first embodiment of the invention, at least the following advantageous effects (1) and (2) are obtained.

(1) As the temperature of the LSI rises from room temperature to higher temperatures (e.g. about 200° C.), the mobility of holes or electrons, which are carriers, can be increased.

As described above, in the above-described structure, when the transistor (nMOS1, pMOS1, nMOS2) is driven, a source voltage Vs, a drain voltage Vd and a predetermined gate voltage Vg are applied. Then, holes or electrons, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1, the first liner insulation layer 11-1 expands in accordance with its own positive expansion coefficient. Accordingly, a strain 28, which causes stretching deformation, occurs in the first liner insulation film 11-1. As a result, a desired compressive stress CS is caused to occur in the channel region CH. In this state, the holes or electrons, which are carriers, are passed, and the transistor (nMOS1, pMOS1, nMOS2) is driven.

As has been described above, according to the structure of the present embodiment, even in the case where the temperature of the semiconductor substrate 10-1 rises to high temperatures, the mobility of holes or electrons, which are carriers of the transistor, can be increased. This is clear from the result of the study shown in FIG. 5 and FIG. 6 in the above sections 2-2 and 2-3.

In addition, in the case of the present embodiment, the contact wiring lines SC and DC are connected to one end and the other end of the first liner insulation films 11-1. Thus, also because the operation heat occurring in the contact wiring lines SC and DC is directly conducted to the first liner insulation film 11-1, the mobility of carriers can advantageously be improved.

Needless to say, the same advantageous effect can be obtained, not only by the above-described operation heat occurring due to the driving operation of the transistor, but also by the operation heat, in a broader sense, occurring when the LSI including this transistor is operated.

(2) The manufacturing cost can advantageously be reduced.

In the case where a so-called strained semiconductor substrate of, e.g. silicon germanium (SiGe) or strained Si is used, the number of fabrication processes and the number of manufacturing devices increase, and the manufacturing cost tends to increase.

On the other hand, in the present embodiment, there is no need to use such a strained semiconductor substrate, and only the silicon substrate with the same (110) plane direction is used. Therefore, the number of fabrication processes and the number of manufacturing devices can be decreased, and the manufacturing cost can advantageously be reduced.

Furthermore, the strained semiconductor substrate using, e.g. strained Si is disadvantageous in that there are many defects in crystal lattices. On the other hand, in the present embodiment, no use is made of the strained semiconductor substrate, and only the silicon substrate 10-1 with the same (110) plane direction is used. Thereby, defects in crystal lattices can be reduced. Therefore, the reliability of the device can advantageously be enhanced.

Second Embodiment

Figure 20:
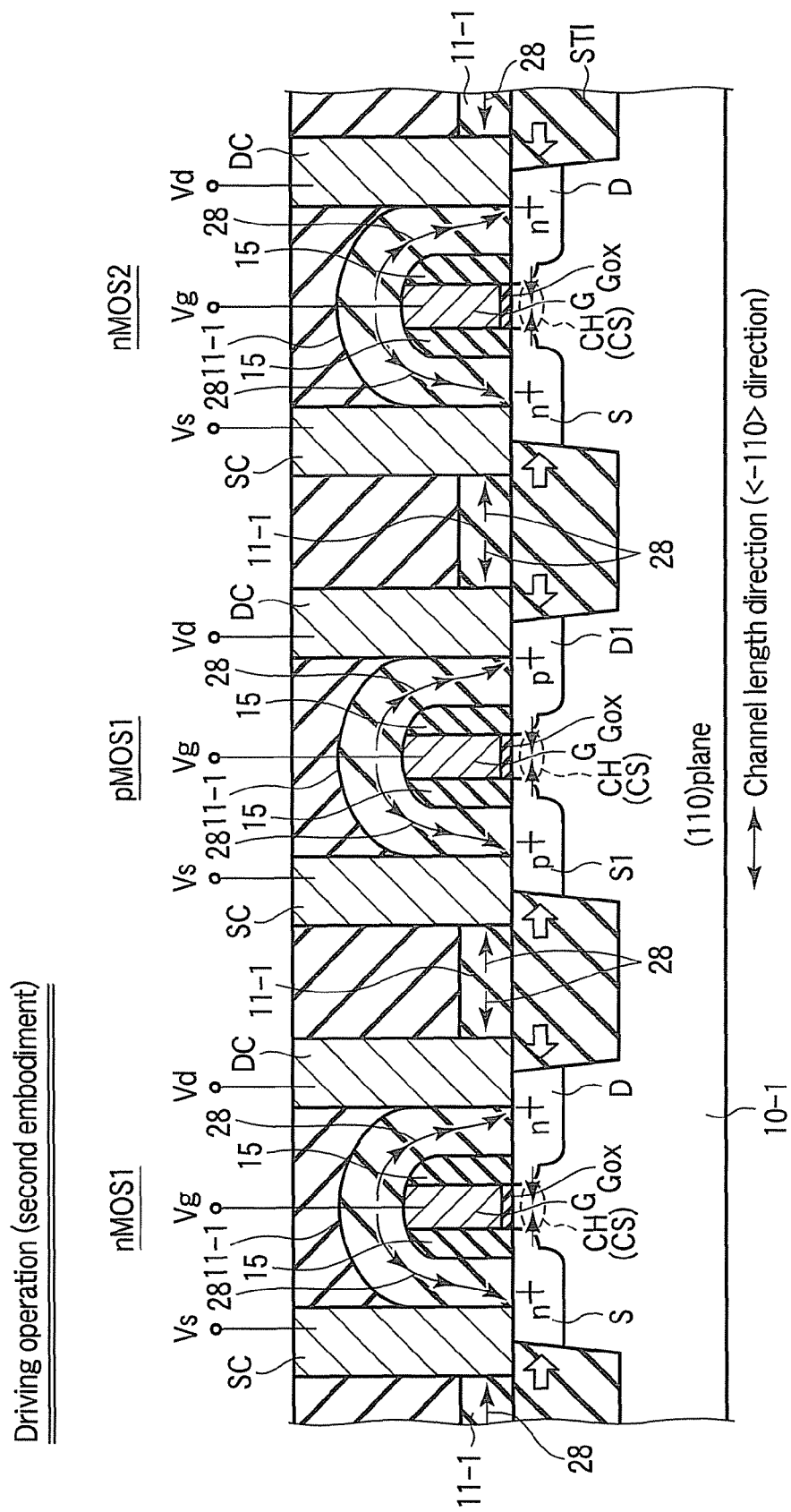
FIG. 20 is a cross-sectional view for explaining the driving operation of the semiconductor device according to the second embodiment.

An Example in which a Liner Insulation Film is Also Disposed Uniformly Over an Element Isolation Insulation Film Next, Referring to FIG. 18 to FIG. 20, a description is given of a semiconductor device and a manufacturing method thereof according to a second embodiment of the invention. The second embodiment relates to an example in which the first liner insulation film 11-1 is disposed uniformly over the element region and element isolation region. A detailed description of the parts common to those of the first embodiment is omitted.

<Structure Example>

Referring to FIG. 18 and FIG. 19, a description is given of a structure example of the semiconductor device according to the second embodiment. As shown in FIG. 18 and FIG. 19, the semiconductor device of the second embodiment differs from that of the first embodiment in that the first liner insulation film 11-1 is uniformly disposed along the channel length direction, not only on the element region AA, but is disposed both on the element region AA and the element isolation region. In other words, the structure of the second embodiment differs from that of the first embodiment in that the first liner insulation film 11-1 is also disposed uniformly over the element isolation insulation film STI.

The first liner insulation film 11-1, which is disposed on the element isolation insulation film STI, has a positive expansion coefficient, as in the above-described example, and is formed of, e.g. a SiN film.

Additionally, the element isolation insulation film STI may be formed of the same material as the first liner insulation film 11-1 and is buried. With the above-described structure, the element isolation insulation film STI also expands at the time of the driving operation, and the compressive stress CS can be applied to the channel CH. In this respect, the mobility can more effectively be increased.

<Application of Stress at Time of Driving Operation>

Next, referring to FIG. 20, a description is given of the application of stress at the time of the driving operation of the semiconductor device according to the second embodiment.

As shown in FIG. 20, in the above-described structure, when the transistor (nMOS1, pMOS1, nMOS2) is driven, a source voltage Vs, a drain voltage Vd and a predetermined gate voltage Vg are applied. Then, holes or electrons, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1, the first liner insulation layer 11-1 expands in accordance with its own positive expansion coefficient. Accordingly, a strain 28, which causes stretching deformation, occurs in the first liner insulation film 11-1. In this case, the second embodiment differs from the first embodiment in that the same strain 28 can be caused to occur also in the first liner insulation film 11-1 that is disposed on the element isolation insulation film STI.

Furthermore, since the element isolation insulation film STI is formed of the same material as the first liner insulation film 11-1 and is buried, the element isolation insulation film STI also expands at the time of the driving operation, and the compressive stress CS can be applied to the channel CH.

As a result, a greater compressive stress CS is caused to occur in the channel region CH. In this state, the holes or electrons, which are carriers, are passed, and the transistor (nMOS1, pMOS1, nMOS2) can be driven.

According to the structure of the present embodiment, even in the case where the temperature of the semiconductor substrate 10-1 rises to high temperatures, the mobility of holes or electrons, which are carriers of the transistor, can advantageously be more improved.

<Manufacturing Method>

As regards the description of the manufacturing method of the present embodiment, although detailed illustrations are omitted, it should suffice if a SiN film having a positive expansion coefficient is uniformly formed along the channel length direction by using, e.g. CVD, over the element region and element isolation region so as to cover the formed transistors (pMOS1, nMOS1, pMOS2). In other words, there is no need to pattern the formed SiN film so that the SiN film is left only on the element region AA. Therefore, the number of manufacturing steps can be decreased, and the manufacturing cost can advantageously be reduced.

Besides, the manufacturing cost can advantageously be reduced also because the element isolation insulation film STI may be formed of the material having the same positive expansion coefficient and be buried.

<Advantageous Effects>

With the semiconductor device and the manufacturing method thereof according to the second embodiment of the invention, at least the same advantageous effects (1) and (2) as described above are obtained.

Moreover, the semiconductor device of the second embodiment differs from that of the first embodiment in that the first liner insulation film 11-1 is uniformly disposed along the channel length direction, not only on the element region AA, but is disposed both on the element region AA and the element isolation region. In other words, in the structure of the present embodiment, the first liner insulation film 11-1 is also disposed uniformly over the element isolation insulation film STI.

If the operation heat is conducted to the first liner insulation layer 11-1, the first liner insulation layer 11-1 expands in accordance with its own positive expansion coefficient. Accordingly, in this embodiment, the same strain 28 can be caused to occur also in the first liner insulation film 11-1 that is disposed on the element isolation insulation film STI. As a result, a greater compressive stress CS can be caused to occur in the channel region CH. According to the structure of the present embodiment, even in the case where the temperature of the semiconductor substrate 10-1 rises to high temperatures, the mobility of holes or electrons, which are carriers of the transistor, can advantageously be more improved.

Furthermore, as regards the manufacturing method, it should suffice if a SiN film having a positive expansion coefficient is uniformly formed along the channel length direction by using, e.g. CVD, over the element region and element isolation region so as to cover the formed transistors (pMOS1, nMOS1, pMOS2). In other words, there is no need to pattern the formed SiN film so that the SiN film is left only on the element region AA. Therefore, the number of manufacturing steps can be decreased, and the manufacturing cost can advantageously be reduced.

Third Embodiment

Application of Tensile Stress by a Liner Insulation Film (Negative Expansion Coefficient)

Next, referring to FIG. 21 and FIG. 22, a semiconductor device according to a third embodiment of the invention is described. This third embodiment relates to an example in which tensile stress is applied to the channel region by a second liner insulation film 11-2 having a negative expansion coefficient, which is disposed on the substrate having the element formation plane in the (110) plane direction. A detailed description of the parts common to those in the first embodiment is omitted here.

<Structure Example>

Referring to FIG. 21, a description is given of a structure example of the semiconductor device according to the third embodiment.

As shown in FIG. 21, the semiconductor device of the third embodiment differs from that of the first embodiment in that a second liner insulation film 11-2, which has a negative expansion coefficient and applies a tensile stress to the transistor (nMOS1, pMOS1, nMOS2) in the channel width direction by operation heat, is further disposed along the channel width direction in a manner to cover the plural transistors (nMOS1, pMOS1, nMOS2). The negative expansion coefficient (negative expansion factor) $[\Delta V/V/\Delta T]$(V: volume, T: temperature, $\Delta T$: volume variation) refers to a ratio at which the volume decreases in accordance with an increase in temperature. The expansion coefficient of the second liner insulation film 11-2 is, for example, about $-8 \times 10^{-6}$/K.

The second liner insulation film 11-2 in this embodiment is formed of a glass ceramics layer including an amorphous matrix layer 18, and crystal lines 19 which are dispersed in the amorphous matrix layer 18. The composition of the glass ceramics layer may be any combination of four compositions, i.e. $Li_2O$—$Al_2O_3$—$SiO_2$—$TiO2$, which can make the glass ceramics layer transition into a glass state. The crystal lines 19 have a negative expansion coefficient, and the amorphous matrix layer 18 has a positive expansion coefficient. Thus, it is desirable that the ratio of the crystal lines 19 in the entire second liner insulation film 11-2 be greater than the ratio of the amorphous matrix layer 18 in the entire second liner insulation film 11-2.

Examples of the insulating material with a negative expansion coefficient include $HfW_2O_2$.

<Application of Stress at Time of Driving Operation>

Next, referring to FIG. 22, a description is given of the application of stress at the time of the driving operation of the semiconductor device according to the third embodiment.

As shown in FIG. 22, in the above-described structure, when the transistor (nMOS1, pMOS1, nMOS2) is driven, a source voltage Vs, a drain voltage Vd and a predetermined gate voltage Vg are applied. Then, electrons or holes, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the second liner insulation layer 11-2, the second liner insulation layer 11-2 contracts in accordance with its own negative expansion coefficient. Accordingly, a strain 28-2, which causes contraction deformation, occurs in the second liner insulation film 11-2.

As a result, a uniaxial stress due to a tensile stress TS along the channel width direction <001> can be applied to the channel region CH.

Thus, even in the case where the temperature of the semiconductor substrate 10-1 rises to high temperatures, the mobility of carriers of the transistor can advantageously be more improved, regardless of the conductivity types of the pMOS transistor and nMOS transistor. It is clear from the result of the study shown in FIG. 9 in the above section 4-1, that the stress as in the present embodiment is advantageous in improving the mobility regardless of the conductivity types of transistors.

The method of fabricating the second liner insulation film 11-2 having the negative expansion coefficient will be described in detail in connection with a fourth embodiment of the invention that is to be described later.

<Advantageous Effects>

With the semiconductor device according to the third embodiment of the invention, at least the same advantageous effects (1) and (2) as described above are obtained. Where necessary, the present embodiment can be applied.

Fourth Embodiment

Biaxial Stress by Liner Insulation Films (Positive and Negative Expansion Coefficients)

Next, referring to FIG. 23 to FIG. 33, a description is given of a semiconductor device and a manufacturing method thereof according to a fourth embodiment of the invention. The fourth embodiment relates to an example in which stress is applied to the channel region in two axial directions by first and second liner insulation films 11-1 and 11-2 having positive and negative expansion coefficients, which are disposed on a substrate with an element plane in the (110) plane direction. A detailed description of the parts common to those of the first embodiment is omitted here.

<Structure Example>

Figure 24:
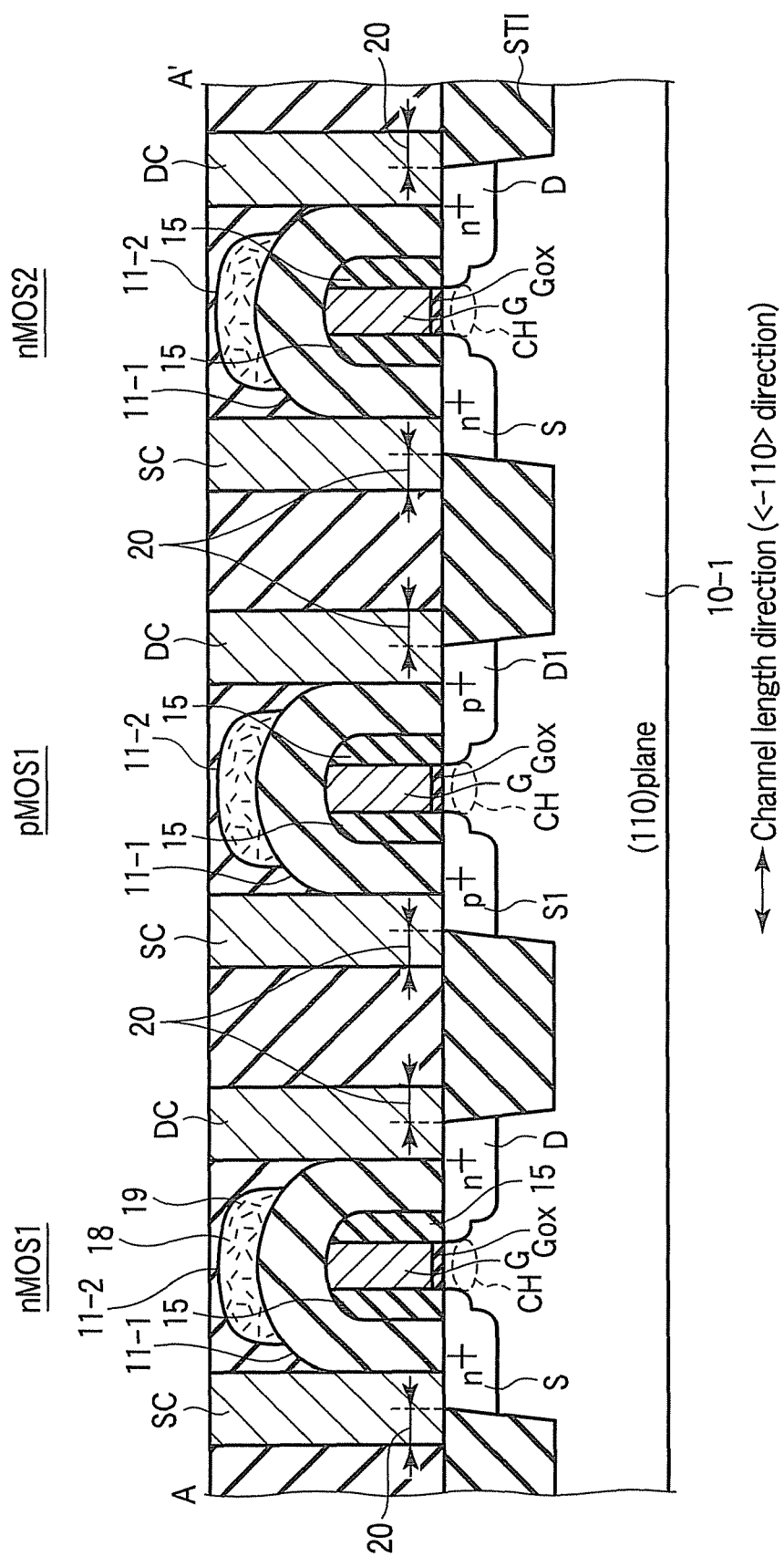
FIG. 24 is a cross-sectional view taken along line A-A' in FIG. 23.

Referring to FIG. 23 and FIG. 24, a structure example of the semiconductor device according to the fourth embodiment is described.

As shown in FIG. 23 and FIG. 24, the semiconductor device of the fourth embodiment differs from that of the first embodiment in that a second liner insulation film 11-2, which has a negative expansion coefficient and applies a tensile stress to the transistor (nMOS1, pMOS1, nMOS2) in the channel width direction by operation heat, is further disposed along the channel width direction <001> in a manner to cover the transistor (nMOS1, pMOS1, nMOS2).

The second liner insulation film 11-2 in this embodiment is formed of a glass ceramics layer including an amorphous matrix layer 18, and crystal lines 19 which are dispersed in the amorphous matrix layer 18. The composition of the glass ceramics layer may be any combination of four compositions, i.e. $Li_2O$—$Al_2O_3$—$SiO_2$—$TiO2$, which can make the glass ceramics layer transition into a glass state. The crystal lines 19 have a negative expansion coefficient, and the amorphous matrix layer 18 has a positive expansion coefficient. Thus, it is desirable that the ratio of the crystal lines 19 in the entire second liner insulation film 11-2 be greater than the ratio of the amorphous matrix layer 18 in the entire second liner insulation film 11-2.

Examples of the insulating material with a negative expansion coefficient include $HfW_2O_2$.

<Application of Stress at Time of Driving Operation>

Figure 26:
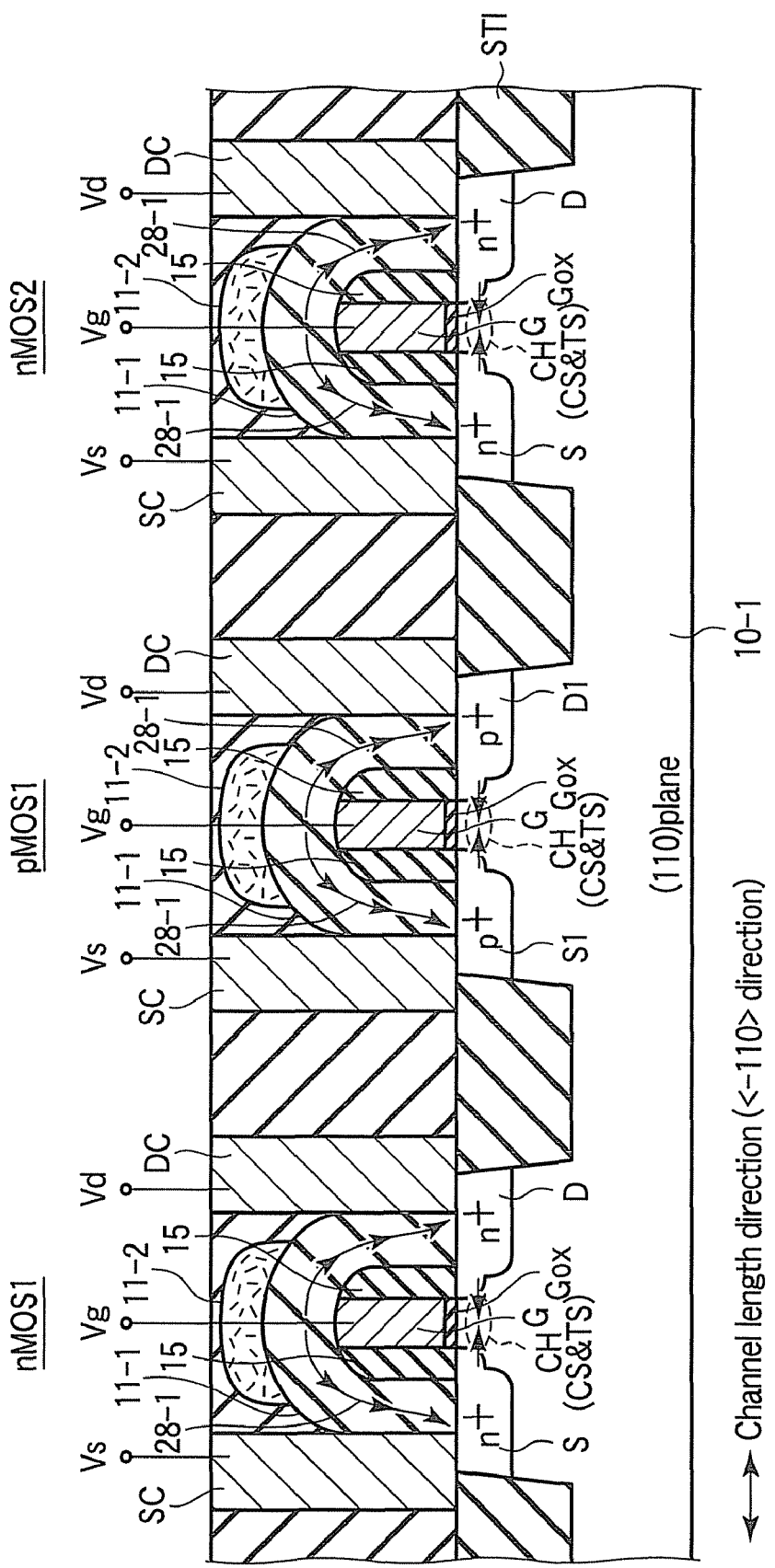
FIG. 26 is a cross-sectional view for explaining the driving operation of the semiconductor device according to the fourth embodiment.
Figure 27:
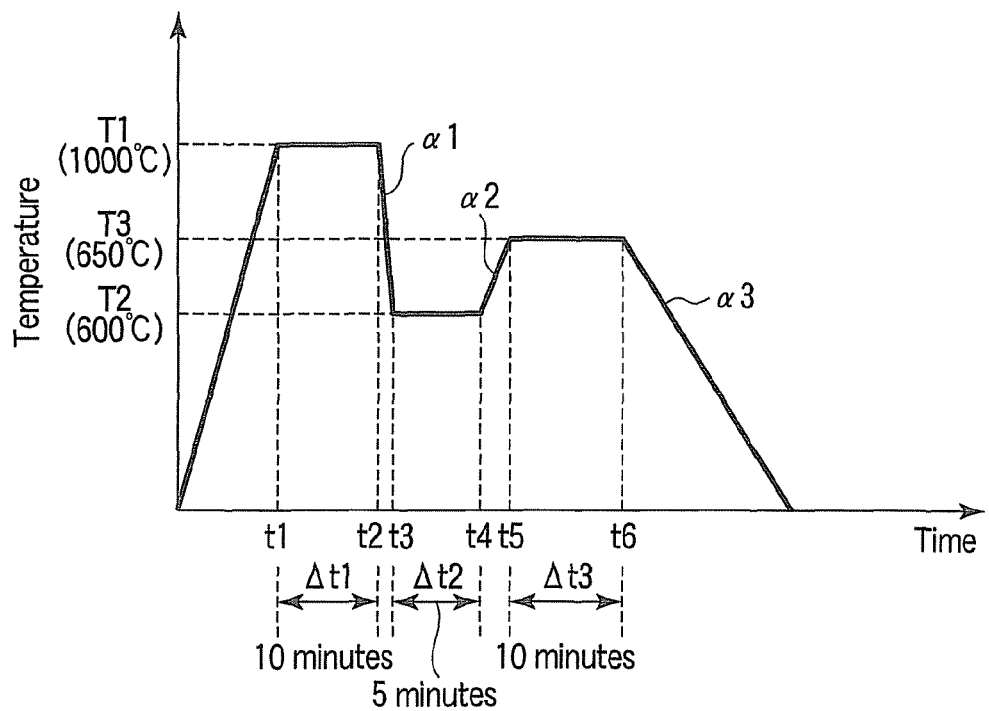
FIG. 27 is a timing chart showing the relationship between the time and temperature according to the fourth embodiment.

Next, referring to FIG. 25 and FIG. 26, a description is given of the application of stress at the time of the driving operation of the semiconductor device according to the fourth embodiment.

As shown in FIG. 25 and FIG. 26, in the above-described structure, when the transistor (nMOS1, pMOS1, nMOS2) is driven, a source voltage Vs, a drain voltage Vd and a predetermined gate voltage Vg are applied. Then, holes or electrons, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1, the first liner insulation layer 11-1 expands in accordance with its own positive expansion coefficient, and a strain 28-1, which causes stretching deformation, occurs in the first liner insulation film 11-1. In addition, in the present embodiment, when the operation heat is conducted to the second liner insulation layer 11-2, the second liner insulation layer 11-2 contracts in accordance with its own negative expansion coefficient, and a strain 28-2, which causes contraction deformation, occurs in the second liner insulation film 11-2.

As a result, stresses in two axial directions, namely, a compressive stress CS in the channel length direction and a tensile stress TS in the channel width direction <001>, can be applied at the same time to the channel region CH.

Thus, even in the case where the temperature of the semiconductor substrate 10 rises to high temperatures, the mobility of carriers of the transistor can advantageously be more improved, regardless of the conductivity types of the pMOS transistor and nMOS transistor.

It is clear from the result of the study shown in FIG. 9 in the above section 4-1, that the stress as in the present embodiment is advantageous in improving the mobility regardless of the conductivity types of transistors.

<Manufacturing Method>

Next, referring to FIG. 27 to FIG. 33, a description is given of a method of manufacturing the semiconductor device according to the fourth embodiment. The description below is given on the basis of the timing chart of FIG. 27.

Figure 28:
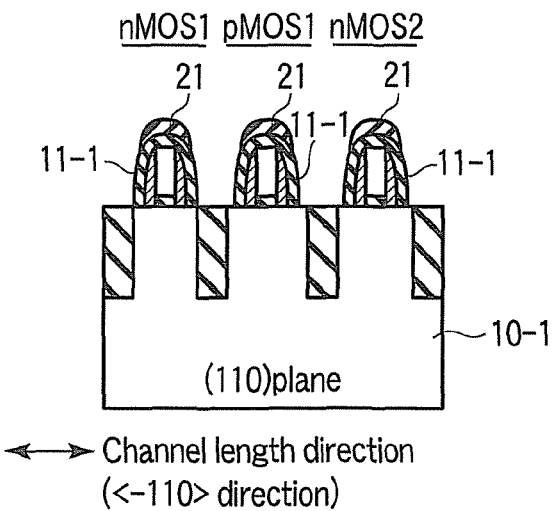
FIG. 28 is a cross-sectional view illustrating a fabrication step of the semiconductor device according to the fourth embodiment.

To begin with, as shown in FIG. 28, a first liner insulation film 11-1 is formed on the transistor (nMOS1, pMOS1, nMOS2). Subsequently, a silicon oxide ($SiO_2$) film 21, which is patterned in the channel width direction, is formed by, e.g. CVD, on the first liner insulation film 11-1.

Figure 29:
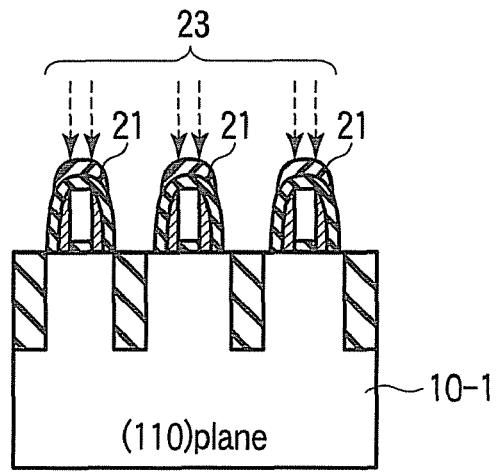
FIG. 29 is a cross-sectional view illustrating a fabrication step of the semiconductor device according to the fourth embodiment.

Then, as shown in FIG. 29, crystal seeds 23 of ions of, e.g. lithium (Li), aluminum (Al) or titanium (Ti), are doped in the silicon oxide film 21 by, e.g. ion implantation.

Figure 30:
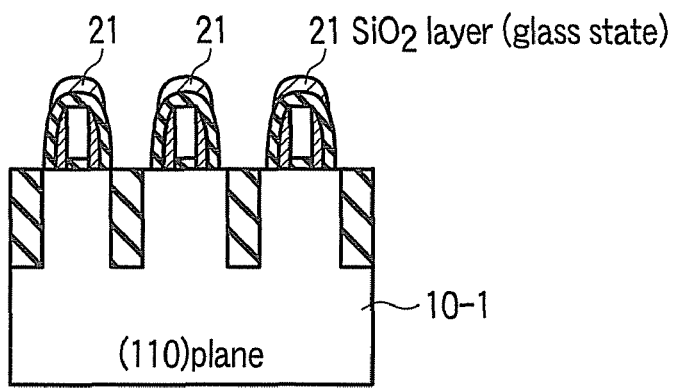
FIG. 30 is a cross-sectional view illustrating a fabrication step of the semiconductor device according to the fourth embodiment.

Then, as shown in FIG. 30, heat treatment is performed, for example, in an oxidizing atmosphere during a time $\Delta t1$ (e.g. about 10 minutes) between time points t1 and t2 at a temperature T1 (e.g. about 1000° C.). Thereby, the silicon oxide film 21 is made to transition into a glass state (amorphous state).

Subsequently, at time point t2, the resultant structure is cooled to a temperature T2 (e.g. about 600° C.) at a temperature-lowering rate $\alpha 1$. Preferably, the rate $\alpha 1$ should be as high as possible.

Figure 31:
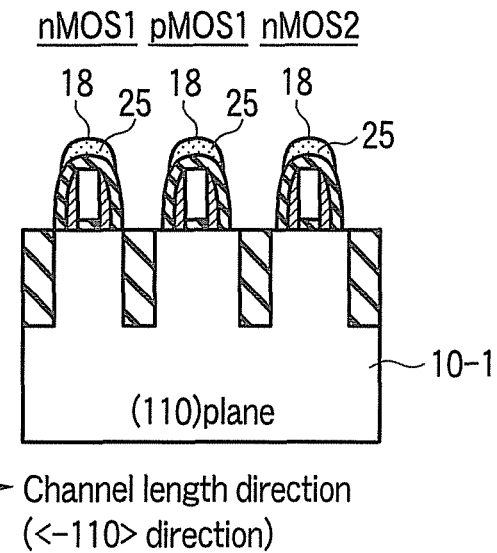
FIG. 31 is a cross-sectional view illustrating a fabrication step of the semiconductor device according to the fourth embodiment.

Then, as shown in FIG. 31, the silicon oxide film 21, which is in the glass state, is annealed during a time $\Delta t2$ (e.g. about 5 minutes) between time points t3 and t4 at a temperature T2 (e.g. about 600° C.). Crystal nuclei 25 are precipitated at high density in the amorphous matrix layer 18 in the silicon oxide film 21. The size of each crystal nucleus 25 is, e.g. about several nm (nanometers).

In the above process (time points t3 to t4), the temperature, at which the heat treatment is conducted, should preferably be the temperature T2 (about 600° C. in this embodiment) at which the crystal nuclei 25 are precipitated at the highest rate. Specifically, as indicated by a solid line 31 in FIG. 33, since the rate of precipitation of crystal nuclei 25 is the highest rate V1 at the temperature T2, the crystal nuclei 25 can be formed at high density in a short time.

At time point t4, the temperature of the amorphous matrix layer 18 including the crystal nuclei 25 is raised to a temperature T3 (e.g. about 650° C.) at a temperature-raising rate $\alpha 2$. Preferably, the temperature-raising rate $\alpha 2$ should be as high as possible in order to prevent non-uniform growth of the crystal nuclei 25.

Figure 32:
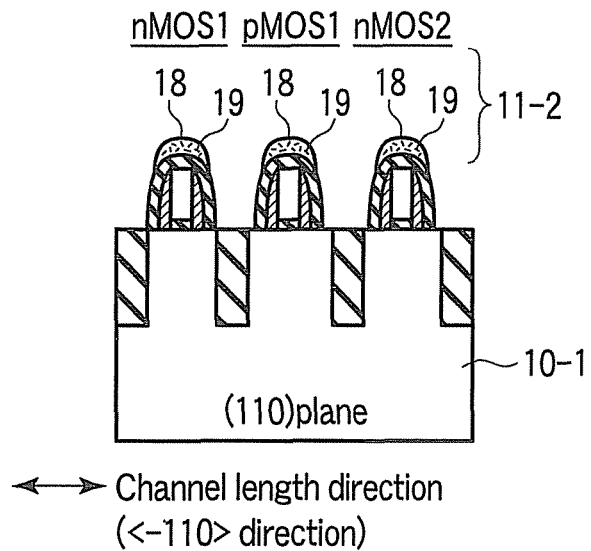
FIG. 32 is a cross-sectional view illustrating a fabrication step of the semiconductor device according to the fourth embodiment.

Subsequently, as shown in FIG. 32, the amorphous matrix layer 18 including the crystal nuclei 25 is annealed during a time $\Delta t3$ (e.g. about 10 minutes) between time points t5 and t6 at a temperature T3 (e.g. about 650° C.). Thereby, the crystal nuclei 25 are grown, and the crystal lines 19 are formed. At the same time, by growing the crystal nuclei 25 and forming the crystal lines 19, the ions (crystal seeds) 23, which are doped in the amorphous matrix layer 18 by the ion implantation, are sufficiently precipitated. As a result, the second liner insulation film 11-2 can be formed of the glass ceramics layer including the amorphous matrix layer 18 and crystal lines 19. The size of the crystal line 19 is, e.g. several nm to several-ten nm.

In the above process (time points t5 to t6), it is preferable that the temperature for annealing be the temperature T3 at which the crystal nuclei 25 grow at the highest rate. Specifically, as indicated by a solid line 32 in FIG. 33, the rate of growth of crystal nuclei 25 is the highest rate V2 at the temperature T3, and the crystal nuclei 25 grow in a short time.

Figure 33:
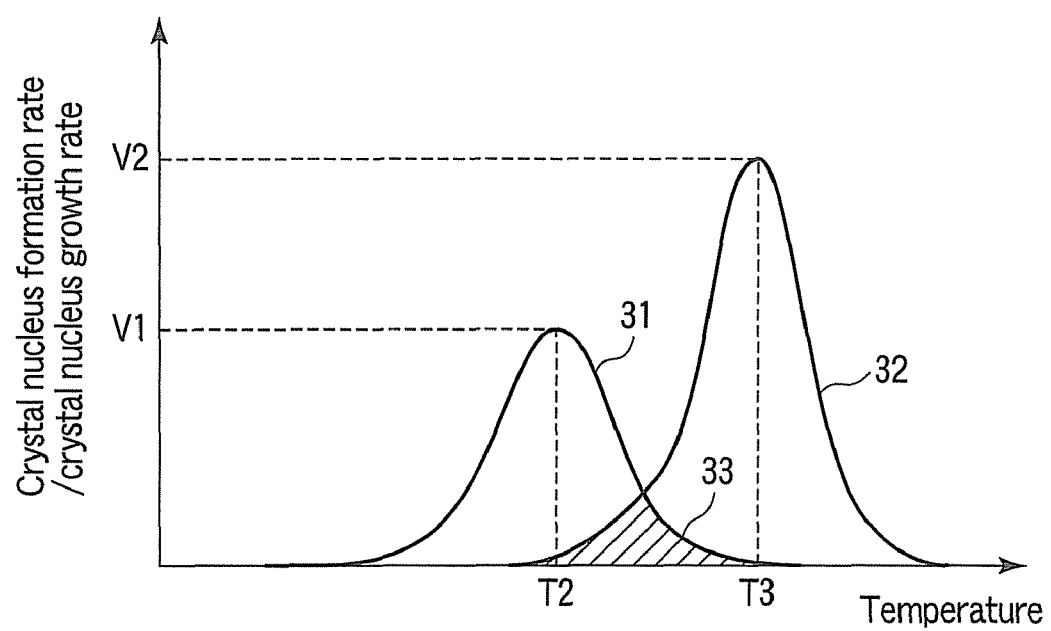
FIG. 33 is a graph showing the relationship between the temperature and the crystal nucleus formation rate/crystal nucleus growth rate according to the fourth embodiment.

It is not desirable to perform annealing in a region 33 surrounded by solid lines 31 and 32 in FIG. 33. The reason for this is that in the region 33 the density of crystal nuclei 25 becomes low, and sufficient growth cannot be achieved.

At time point t6, the first liner insulation film 11-1 is cooled down to room temperature or thereabout at a temperature-lowering rate $\alpha 3$. It is desirable that the rate $\alpha 3$ be as low as possible, in order to relax the internal stress which has occurred due to the crystal growth.

By the above-described process, the second liner insulation film 11-2, which is formed of the glass ceramics (pyroceramics) layer, can be fabricated. The composition of the glass ceramics shown in the present embodiment is merely an example, and it is possible to adopt any composition, such as a combination of $Li_2O$—$Al_2O_3$—$SiO_2$—$TiO2$, which can realize an amorphous state.

Although not shown, an interlayer insulation film 17 is formed in a manner to cover the transistors (nMOS1, pMOS1, nMOS2). Then, contact holes are formed in the interlayer insulation film 17 on the source S and drain D, and a polysilicon layer, for instance, is buried in the contact holes. Thereby, contact wiring lines SC and DC are formed. When the contact holes are formed, it is preferable to form the contact holes such that parts of the contact holes come in contact with the fringe portions 20 of the first liner insulation film 11-1.

By the above-described process, the semiconductor device according to the fourth embodiment is formed.

<Advantageous Effects>

With the semiconductor device and the manufacturing method thereof according to the fourth embodiment, at least the same advantageous effects (1) and (2) as described above are obtained. In addition, according to this embodiment, at least the following advantageous effects (3) to (7) can be obtained.

(3) The mobility of carriers can further be improved, regardless of the conductivity type of the transistor.

The semiconductor device of the fourth embodiment further includes a second liner insulation film 11-2 which is provided along the channel width direction <001> in a manner to cover the transistor (nMOS1, pMOS1, nMOS2), has a negative expansion coefficient and applies a tensile stress to the transistor (nMOS1, pMOS1, nMOS2) in the channel width direction by operation heat.

Thus, if the operation heat is conducted to the first liner insulation layer 11-1, the first liner insulation layer 11-1 expands in accordance with its own positive expansion coefficient, and a strain 28-1, which causes stretching deformation, occurs in the first liner insulation film 11-1. In addition, when the operation heat is conducted to the second liner insulation layer 11-2, the second liner insulation layer 11-2 contracts in accordance with its own negative expansion coefficient, and a strain 28-2, which causes contraction deformation, occurs in the second liner insulation film 11-2.

As a result, stresses in two axial directions, namely, a compressive stress CS in the channel length direction and a tensile stress TS in the channel width direction <001>, can be applied at the same time to the channel region CH.

Thus, even in the case where the temperature of the semiconductor substrate 10 rises to high temperatures, the mobility of carriers of the transistor can advantageously be more improved, regardless of the conductivity types of the pMOS transistor and nMOS transistor.

It is clear from the result of the study shown in FIG. 9 in the above section 4-1, that the stress as in the present embodiment is advantageous in improving the mobility regardless of the conductivity types of transistors.

(4) The optimal mobility of the transistor can be selected.

The magnitudes of the compressive stress CS and tensile stress TS that are applied to the channel region CH increase in proportion to, e.g. the volumes of the first and second liner insulation films 11-1 and 11-2.

Figure 37:
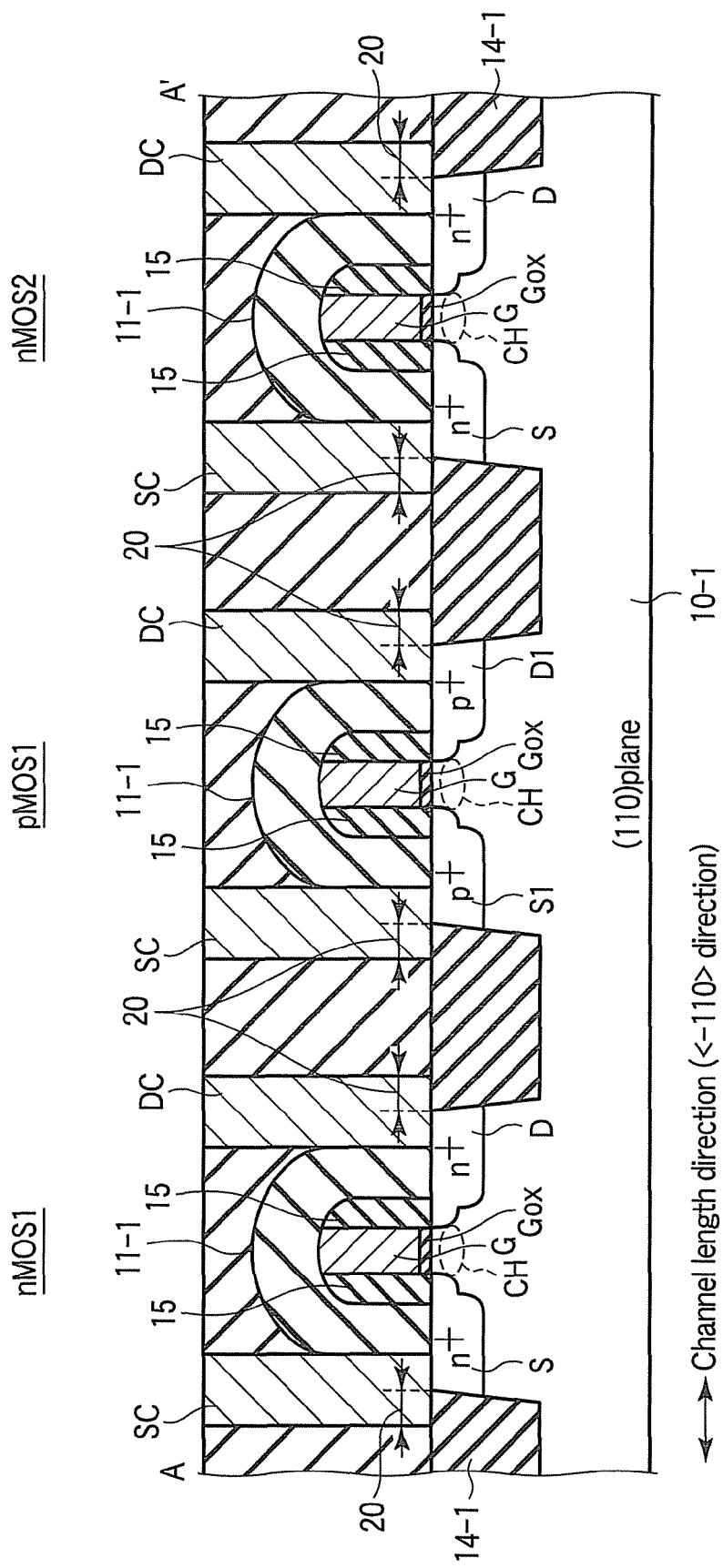
FIG. 37 is a cross-sectional view taken along line A-A in FIG. 36.

Thus, the optimal mobility of the transistor can advantageously be selected by controlling, for example, when the first and second liner insulation films 11-1 and 11-2 are formed (e.g. FIG. 37), the volume of the silicon oxide film 21, and selecting the optimal volume, for instance.

(5) Since the expansion coefficient of the second liner insulation film 11-2 can be controlled in a wide range by properly selecting the heat treatment process, the negative expansion coefficient that is optimal for the actual device operation can be selected.

As shown in FIG. 33, the second liner insulation film 11-2 has two temperature regions, that is, the temperature region indicated by the solid line 31 where the crystal nuclei 25 are formed, and the temperature region indicated by the solid line 32 where the crystal nuclei 25 are grown. Accordingly, for example, if a heat treatment process is performed at low temperatures in the temperature region indicated by the solid line 31, and a heat treatment process is performed at the temperature T3, at which the growth rate of crystal nuclei is highest, in the temperature region indicated by the solid line 32, the second liner insulation film 11-2 with a relatively low expansion coefficient can be formed.

As has been described above, since various combinations of the temperatures (e.g. T2, T3) of the temperature regions indicated by the solid lines 31 and 32 and the time periods (e.g. Δt2, Δt3) can be selected at the time of performing the heat treatment process (FIG. 28 to FIG. 32), the crystal lines 19 and amorphous matrix layer 18 can be formed with various densities and sizes. Therefore, advantageously, the margin of the expansion coefficient can be increased, and the second liner insulation film 11-2 having a target expansion coefficient can easily be formed.

In addition, at the time of performing the ion implantation process (FIG. 29), the necessary expansion coefficient can be controlled by selecting the kind, composition and dosage of the crystal seeds 23.

As described above, even if the composition, etc. are the same, optimal conditions can be variously selected at the time of the heat treatment process (FIG. 28 to FIG. 32) or the ion implantation process (FIG. 29), and the expansion coefficient can be controlled in a wide range according to purposes.

(6) To be more specific, if the temperatures T2 and T3, and the time Δt2>time Δt3, are selected, it is possible to form the second liner insulation film 11-2 which has a large negative expansion coefficient and can apply a large tensile stress TS.

One aspect of the liner insulation layer, which functions to apply a greater tensile stress to the channel region CH, is that the liner insulation layer has a higher negative expansion coefficient. To achieve this, it is desirable that the crystal lines 19 be closely formed with a higher density. If the time Δt2 is increased, the density of the crystal nuclei 25 can be increased, and if the time Δt3 is increased, each crystal nucleus 25 can be largely grown and a larger crystal line 19 can be formed.

Accordingly, in the case where the temperatures T2 and T3 are selected as in the present embodiment, both the temperatures T2 and T3 are temperatures at which the formation rate and growth rate of crystal nuclei take the maximum values (FIG. 33). Thus, by making the time Δt2 greater than the time Δt3 (time Δt2> time Δt3), the first liner insulation film 11-1 of glass ceramics, in which the crystal lines 19 are closely formed at high density, can be formed. If the time Δt2 is too short, the density of crystal nuclei 25 decreases, and crystal lines 19 cannot be formed at high density. On the other hand, if the time Δt3 is too long, each crystal nuclei 25 grows too large and a crack may occur due to stress.

Thus, the ratio of crystal lines 19 in the second liner insulation film 11-2 can be made greater than the ratio of amorphous matrix layer 18 in the second liner insulation film 11-2. As a result, advantageously, the expansion coefficient of the whole second liner insulation film 11-2 can be made negative, and the negative expansion coefficient can be made higher.

(7) The growth of crystal nuclei 25 can be made uniform, and the tensile stress TS, which is applied by the second liner insulation film 11-2, can be made uniform.

By increasing the rate α2 as high as possible, the temperature of the amorphous matrix layer 18 can be made to quickly reach the temperature T3 at which the crystal nucleus 25 grows at the highest rate, the non-uniformity in temperature can be prevented, and the time at which each crystal nucleus 25 is grown can be made uniform. Therefore, advantageously, the crystal nuclei 25 can be uniformly grown, the grain sizes of the crystal lines 19 can be made uniform, and the tensile stress TS, which is applied by the second liner insulation film 11-2, can be made uniform.

Fifth Embodiment

Application of Stress by a Liner Insulation Film that is Formed of Piezomaterial Next, referring to FIG. 34 to FIG. 35, a description is given of a semiconductor device and a manufacturing method thereof according to a fifth embodiment of the invention. This fifth embodiment relates to an example in which a piezomaterial is used as the material of the first liner insulation film having a positive expansion coefficient. A detailed description of the parts common to those of the above-described first embodiment is omitted here.

<Structure Example>

Referring to FIG. 34 and FIG. 35, a description is given of a structure example of the semiconductor device according to the fifth embodiment.

As shown in FIG. 34 and FIG. 35, the semiconductor device of the fifth embodiment differs from that of the first embodiment in that a piezomaterial (piezoelectric material)

11-1B is disposed as the first liner insulation film in association with the transistor (pMOS1). In this embodiment, as an example of the piezomaterial, a BaTiO3 (barium titanate) layer is used. The first liner insulation film 11-1B according to the present embodiment is a piezomaterial which tries to extend along the direction of electric field when the electric field is applied thereto.

<Application of Stress at Time of Driving Operation>

Next, a description is given of the application of stress at the time of the driving operation of the semiconductor device according to the fifth embodiment. A detailed description with reference to drawings is omitted here.

As in the above-described examples, when the transistor (nMOS1, pMOS1, nMOS2) is driven, a source voltage Vs, a drain voltage Vd and a predetermined gate voltage Vg are applied. Then, electrons or holes, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1A, 11-1B, the first liner insulation layer 11-1A expands in accordance with its own positive expansion coefficient, and a strain 28, which causes stretching deformation, occurs in the first liner insulation film 11-1A.

In addition, an electric field occurs between the contact wiring lines SC and DC, which are arranged in the channel length direction, due to the source voltage Vs and drain voltage Vd of the transistor (pMOS1). By the electric field occurring at this time, electric dipoles in the first liner insulation film 11-1B are aligned in the direction of the electric field. Thereby, the grains in the first liner insulation film 11-1B finely extend in the direction of the electric field. Accordingly, a strain, which causes stretching deformation along the direction of electric field, occurs in the first liner insulation film 11-1B to which the electric field is applied (inverse piezoelectric effect).

As a result, the compressive stress CS along the channel length direction <–100> can be applied to the channel region CH, and the mobility of carriers of the transistor (nMOS1, pMOS1, nMOS2) can be improved. In the present embodiment, the mobility of the transistor (pMOS1) can advantageously be further improved by the strain occurring due to the inverse piezoelectric effect of the first liner insulation film 11-1B.

Structures and Modifications According to the Present Embodiment

1. The piezomaterial 11-1B is applicable to both the n-conductivity type and p-conductivity type.

2. Selective use, as in the present embodiment, may be made such that the piezomaterial 11-1B is disposed only in the p-type transistor (pMOS1), and a positive-expansion-coefficient material is disposed in the n-type transistor (nMOS1, nMOS2).

3. Conversely to the above structure 2, selective use may be made such that the piezomaterial 11-1B is disposed in the n-type transistor (nMOS1, nMOS2), and a positive-expansion-coefficient material is disposed in the p-type transistor (pMOS1).

4. The choice between the above three structures 1 to 3 depends on actual devices, and may be made from the standpoint of optimization of the whole chip.

<Manufacturing Method>

The manufacturing method of the present embodiment differs from that of the first embodiment in that the first liner insulation film 11-1B is formed of the $BaTiO_3$ (barium titanate) that is the piezomaterial.

In the process of forming the $BaTiO_3$ layer, BaO powder and $TiO_2$ powder are first mixed, and the mixed powder is sintered, for example, at about 1100° C. for about two hours. Then, the resultant is ball-milled in ethanol solution for 24 hours, thereby forming mixture powder in which both components are uniformly mixed. This mixture powder is pressurized into a pellet under a high pressure of about 10 Mpa. Thereafter, this pellet is sintered, for example, at about 1350° C. for about two hours.

Using the sintered body as a target, a $BaTiO_3$ layer is deposited by evaporation on the gate electrode G and spacers 15 by, e.g. rf magnetic sputtering. Thus, the first liner insulation film 11-1B is formed. The rf magnetic sputtering is performed, for example, under such conditions that the temperature is about 700° C., the atmosphere is $Ar:O_2=4:1$, and the pressure in the chamber is about 20 mTorr. In the $BaTiO_3$ layer formed by the above process, a stress of about 5 Gpa can be produced.

Other Manufacturing Method of $BaTiO_3$ Layer

As regards another manufacturing method of the $BaTiO_3$ layer, barium acetate and titanium tetra n-butoxide are dissolved in methanol solution, with the mixture ratio of Ba and Ti being set at 1:1. Then, using acetic acid as catalyst, an organic reaction is caused to occur, and a sol solution is obtained.

Then, the sol solution is coated, for example, by spin coating, on the gate electrode G and spacers 15. The resultant is annealed, for example, at about 700° C. for about 40 minutes. Thereby, a $BaTiO_3$ layer is formed as the first liner insulation film 11-1B. In the $BaTiO_3$ layer formed by the above manufacturing process, a stress of about 5 Gpa can be produced. According to this manufacturing method, the manufacturing cost can advantageously be reduced.

The piezomaterials and the manufacturing methods thereof are not limited to the present embodiment, and other piezomaterials are applicable, where necessary.

Sixth Embodiment

An Example of Application of Stress by an Element Isolation Film

Next, referring to FIG. 36 to FIG. 39, a description is given of a semiconductor device and a manufacturing method thereof according to a sixth embodiment of the invention. This embodiment relates to an example in which a stress is further applied by an element isolation insulation film. A detailed description of the parts common to those of the above-described first embodiment is omitted here.

<Structure Example>

Figure 36:
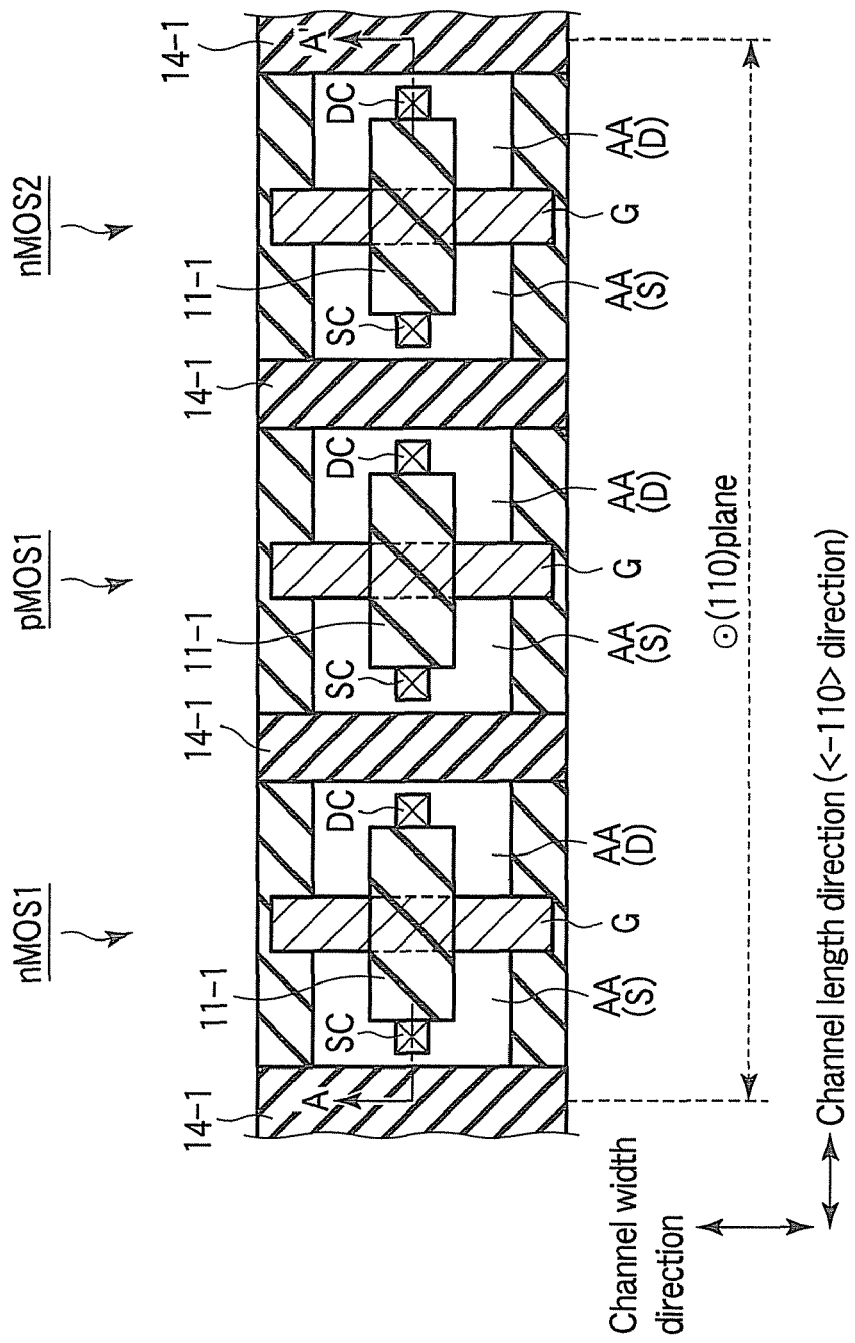
FIG. 36 is a plan view showing a semiconductor device according to a sixth embodiment of the present invention.
Figure 39:
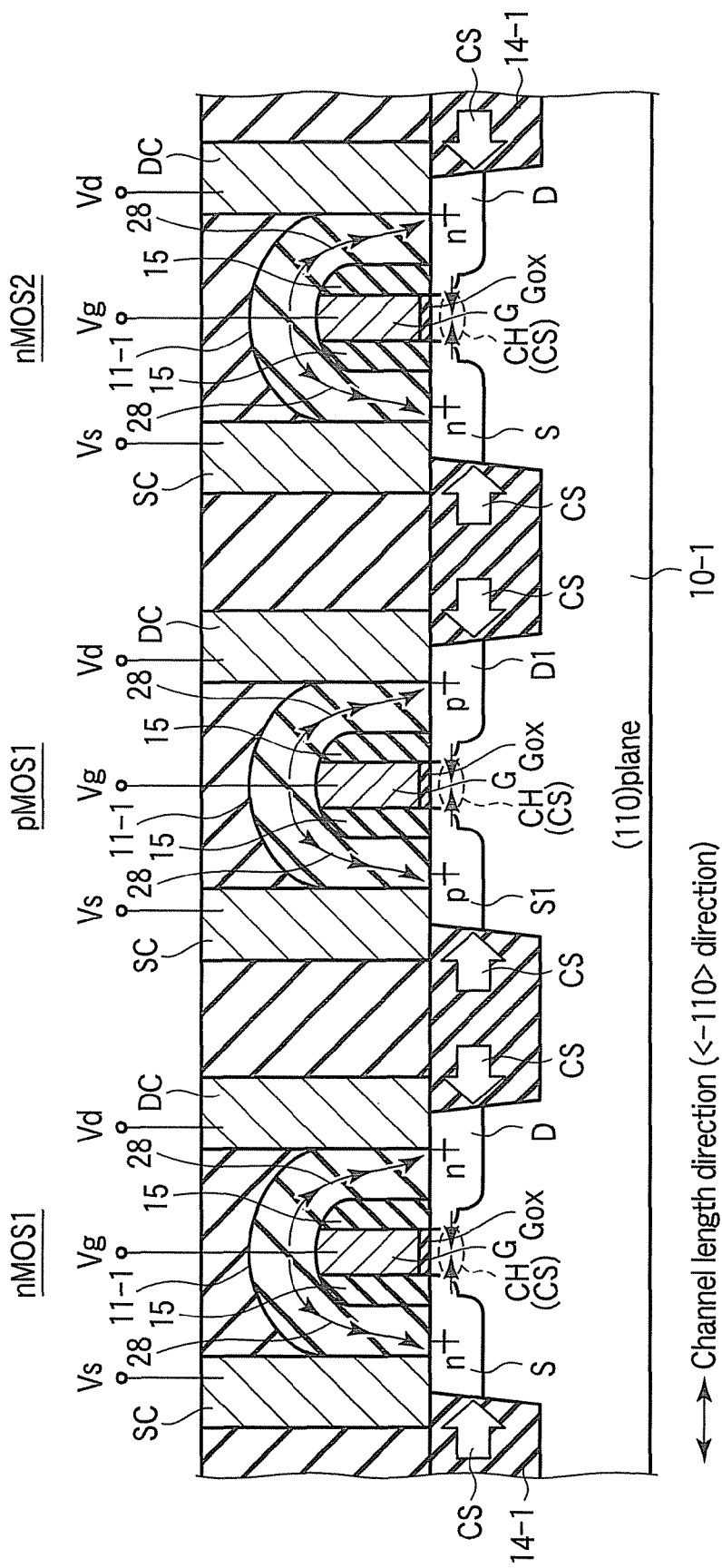
FIG. 39 is a cross-sectional view for explaining the driving operation of the semiconductor device according to the sixth embodiment.

Referring to FIG. 36 and FIG. 39, a structure example of the semiconductor device according to the sixth embodiment is described.

As shown in FIG. 36 and FIG. 39, the semiconductor device of the sixth embodiment differs from that of the first embodiment in that the semiconductor device of the sixth embodiment further includes a first element isolation insulation film 14-1 which has a positive expansion coefficient and is disposed in a manner to sandwich the transistor in an element isolation region along the channel width direction.

In the case of the present embodiment, the first element isolation insulation film 14-1 is formed of a silicon oxide film ($SiO_2$ film) having a positive expansion coefficient. As has been described above, most of substances expand in accordance with an increase in temperature, and thus have positive expansion coefficients. Accordingly, there are many choices of materials having positive expansion coefficients. Any material, which should preferably have a high expansion coefficient and does not adversely affect device performances, is applicable as a buried material of the first element isolation insulation film 14-1 in the present invention. Taking into account the fact that the buried material of the existing element isolation insulation film STI is the silicon oxide film ($SiO_2$ film), it is considered that it is the best solution to add to the silicon oxide film ($SiO_2$ film) such a composition as to increase the expansion coefficient, as in the present embodiment. Other modes of the buried material may include an amorphous mode and a mode in which the composition of the glass ceramics is varied. Aside from the silicon oxide film ($SiO_2$ film), use may be made of buried materials with positive expansion coefficients, such as an aluminum oxide film ($Al_2O_3$ film) and an aluminum nitride film (AlN film), which have large thermal expansion coefficients and large elastic coefficients.

<Application of Stress at Time of Driving Operation>

Figure 38:
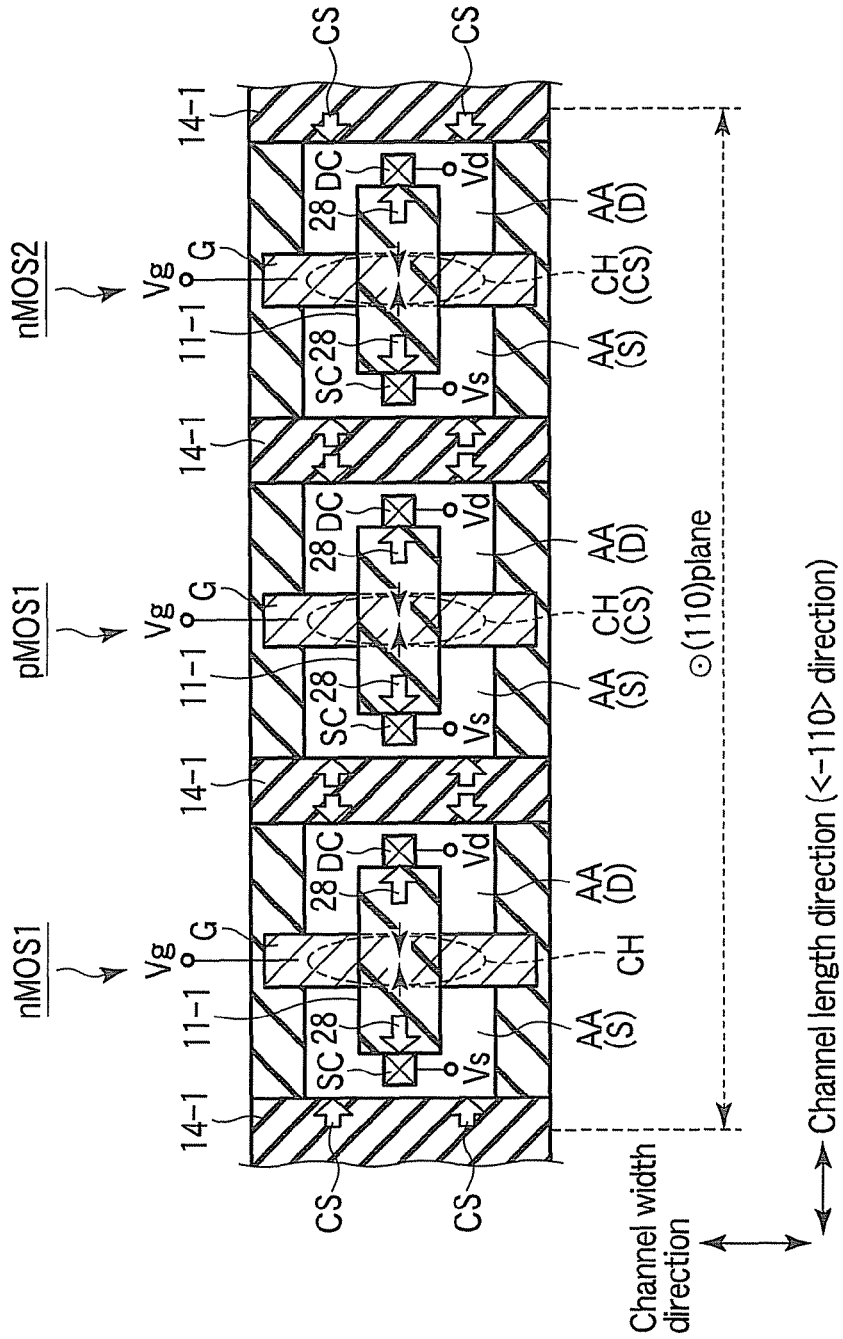
FIG. 38 is a plan view for explaining the driving operation of the semiconductor device according to the sixth embodiment.

Next, referring to FIG. 38 and FIG. 39, a description is given of the application of stress at the time of the driving operation of the semiconductor device according to the sixth embodiment.

As shown in FIG. 38 and FIG. 39, in the above-described structure, when the transistor (nMOS1, pMOS1, nMOS2) is driven, a source voltage Vs, a drain voltage Vd and a predetermined gate voltage Vg are applied. Then, electrons or holes, which are carriers, move in the channel CH which is formed in the semiconductor substrate 10-1 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first liner insulation layer 11-1, the first liner insulation layer 11-1 expands in accordance with its own positive expansion coefficient. Accordingly, a strain 28, which causes stretching deformation, occurs in the first liner insulation film 11-1, and a compressive stress CS can be applied to the channel CH.

In addition, if the operation heat is conducted to the first element isolation insulation layer 14-1, the first element isolation insulation layer 14-1 expands in accordance with its own positive expansion coefficient, and produces a compressive stress CS due to stretching deformation. Accordingly, the compressive stress CS by the first element isolation insulation layer 14-1 can further be applied, and the stress can be increased.

Therefore, the mobility of carriers can advantageously be further increased.

<Manufacturing Method>

In the manufacturing method, to begin with, a trench for element isolation, which reaches the surface of the semiconductor substrate 10-1, is formed. Then, when an insulation material is buried in the trench for element isolation, for example, a silicon oxide film ($SiO_2$ film), the composition of which has been selected so as to have a positive expansion coefficient, is buried, and the first element isolation insulation film 14-1 according to the present embodiment is formed.

In this process, other insulation materials, which should preferably have a high expansion coefficient and do not adversely affect device performances, are applicable as the buried material of the first element isolation insulation film 14-1. Other modes of the buried material may include an amorphous mode and a mode in which the composition of the glass ceramics is varied. Aside from the silicon oxide film ($SiO_2$ film), use may be made of buried materials with positive expansion coefficients, such as an aluminum oxide film ($Al_2O_3$ film) and an aluminum nitride film (AlN film), which have large thermal expansion coefficients and large elastic coefficients.

<Advantageous Effects>

With the semiconductor device and the manufacturing method thereof according to the sixth embodiment of the invention, at least the same advantageous effects (1) and (2) as described above can be obtained.

In addition, the semiconductor device according to the present embodiment includes a first element isolation insulation film 14-1 which has a positive expansion coefficient and is disposed in a manner to sandwich the transistor in an element isolation region along the channel width direction.

If the operation heat is conducted to the first element isolation insulation layer 14-1, the first element isolation insulation layer 14-1 expands in accordance with its own positive expansion coefficient, and produces a compressive stress CS due to stretching deformation. Accordingly, the compressive stress CS by the first element isolation insulation layer 14-1 can further be applied, and the stress can be increased. Therefore, in the present embodiment, the mobility of carriers can advantageously be further increased.

[Modifications (Other Examples Based on the Knowledge)]

An example of the application of piezomaterials has been described by referring to the fifth embodiment, for instance. However, the application of piezomaterials is not limited to the fifth embodiment, and various modifications, as described below, are applicable without departing from the knowledge that was obtained by the inventor.

Modification 1

Although not shown, all the positive-expansion-coefficient materials in the fifth embodiment may be replaced with piezomaterials 11-1B.

According to the structure of this modification, the first liner insulation film 11-1B can apply a stress due to a strain (inverse piezoelectric effect) which causes stretching deformation, by the electric field which occurs between the contact wiring lines SC and DC when the transistor is driven. In this respect, the mobility of carriers can more advantageously be improved.

Modification 2

As shown in FIG. 40, piezomaterials 11-1B are disposed on the element isolation insulation films STI in a manner to sandwich the transistor.

Figure 41:
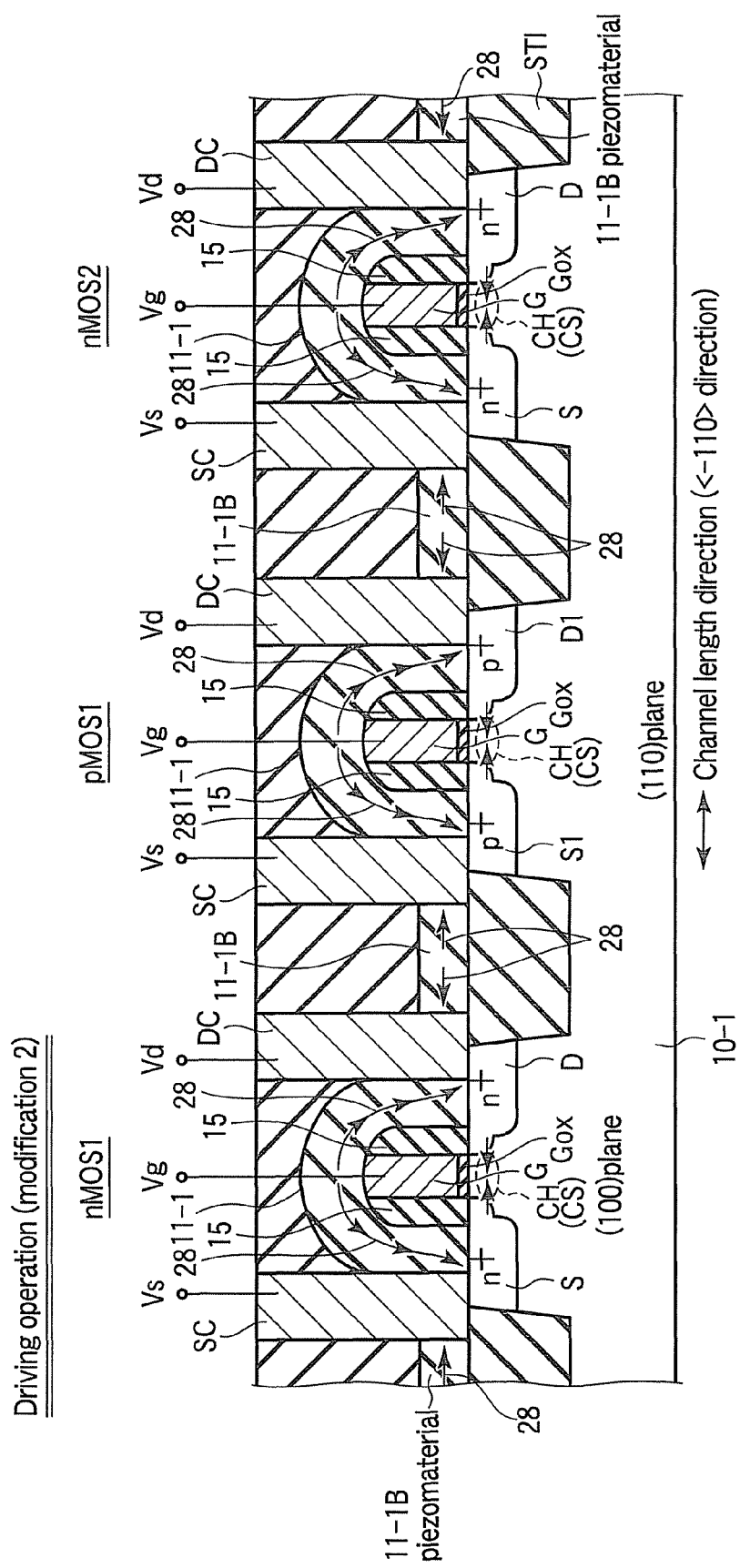
FIG. 41 is a cross-sectional view for explaining the driving operation of the semiconductor device according to Modification 2.

As shown in FIG. 41, according to the structure of this modification, the piezomaterial 11-1B can apply a stress due to a strain (inverse piezoelectric effect) which causes stretching deformation, by the electric field which occurs between the contact wiring lines SC and DC when the transistor is driven. In this respect, the mobility of carriers can more advantageously be improved. Moreover, by combining the positive-expansion-coefficient material and the piezomaterial, as described above, in accordance with concrete circuits, the stress control can finely be executed and the circuit operation can advantageously be optimized as much as possible.

Modification 3

Figure 42:
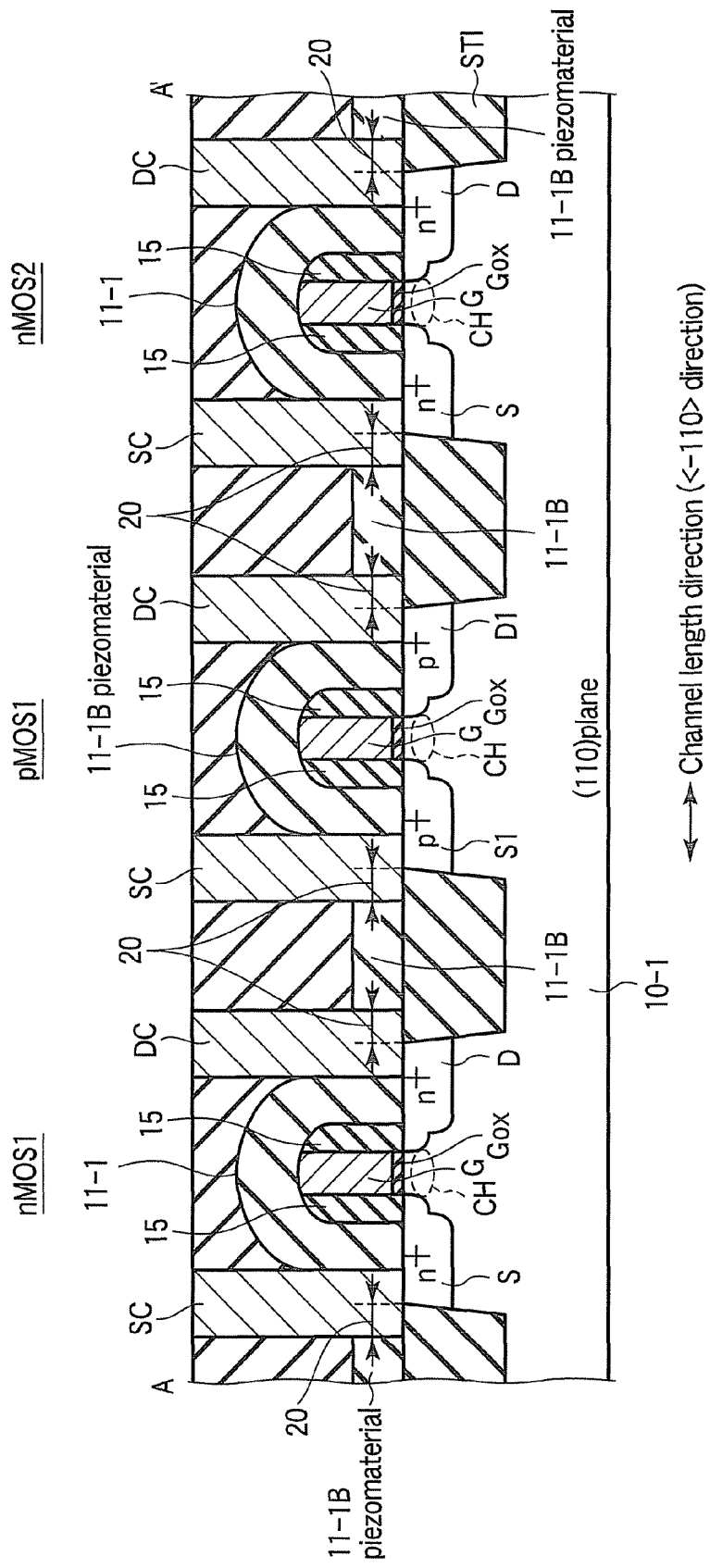
FIG. 42 is a cross-sectional view showing a semiconductor device according to Modification 3.

As shown in FIG. 42, the positive-expansion-coefficient material is applied to the nMOS transistor, and the piezomaterial 11-1B is disposed as a liner in the pMOS transistor. Conversely, the piezomaterial 11-1B is applied as a liner to the nMOS transistor, and the positive-expansion-coefficient material is disposed in the pMOS transistor.

Figure 43:
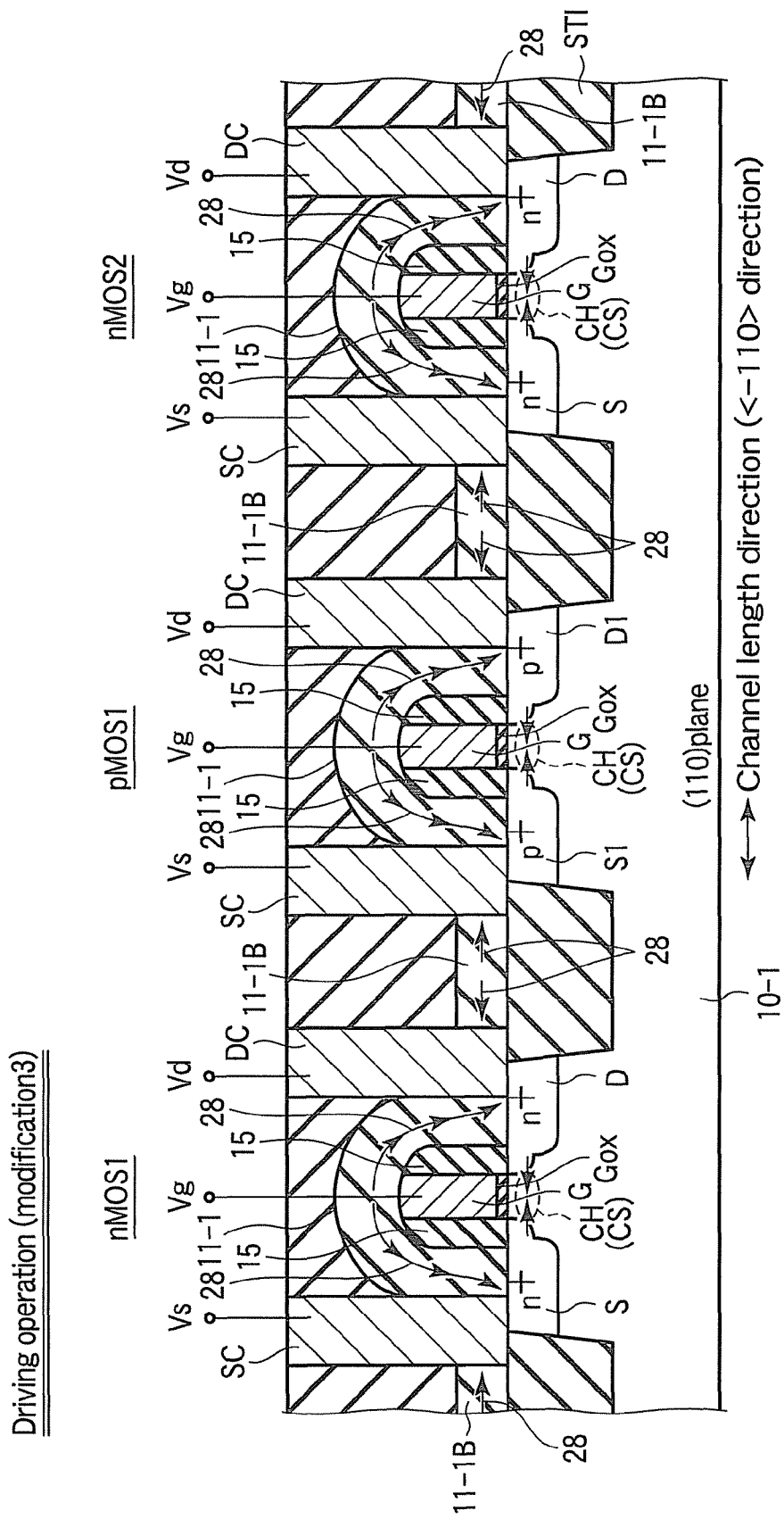
FIG. 43 is a cross-sectional view for explaining the driving operation of the semiconductor device according to Modification 3.

As shown in FIG. 43, according to the structure of this modification, the piezomaterial 11-1B can apply a stress due to a strain (inverse piezoelectric effect) which causes stretching deformation, by the electric field which occurs between the contact wiring lines SC and DC when the transistor is driven. In this respect, the mobility of carriers can more advantageously be improved. Moreover, by combining the positive-expansion-coefficient material and the piezomaterial, as described above, in accordance with concrete circuits, the circuit operation can advantageously be optimized.

Next, a semiconductor substrate (hybrid substrate), in which element formation planes in different plane directions are combined, is described by referring to three embodiments (seventh to ninth embodiments) as examples.

Seventh Embodiment

An Example of the Hybrid Substrate

Next, referring to FIG. 44 to FIG. 56, a description is given of a semiconductor device according to a seventh embodiment of the invention. The seventh embodiment relates to an example of a hybrid substrate having element formation planes in the (110) plane direction and (100) plane direction. A detailed description of the parts common to those of the above-described first embodiment is omitted here.
<Structure Example>
Referring to FIG. 44 and FIG. 45, a description is given of a structure example of the semiconductor device according to the seventh embodiment. As shown in FIG. 44 and FIG. 45, a plurality of transistors (nMOS1, pMOS1, nMOS2) are adjacently disposed on a silicon substrate having element formation planes in the (100) plane direction and (110) plane direction.

The pMOS transistor (pMOS1) is disposed on a silicon substrate 10-1 having the element formation plane in the (110) plane direction. The channel length direction of the pMOS transistor (pMOS1) is disposed in the <−110> direction. A first liner insulation film 11-1, which has a positive expansion coefficient and applies a compressive stress to the transistor (pMOS1) in the channel length direction by operation heat, is disposed in a manner to cover the pMOS transistor (pMOS1) along the channel length direction.

The nMOS transistor (nMOS1, nMOS2) is disposed on a silicon substrate 10-2 which is formed on a BOX layer 30 and has the element formation plane in the (100) plane direction. The channel length direction of the nMOS transistor (nMOS1, nMOS2) is disposed in the <100> direction. A second liner insulation film 11-2, which has a negative expansion coefficient and applies a tensile stress to the transistor (nMOS1, nMOS2) in the channel length direction by operation heat, is disposed in a manner to cover the nMOS transistor (nMOS1, nMOS2) along the channel length direction.
<Application of Stress at Time of Driving Operation>
Next, referring to FIG. 46 and FIG. 47, a description is given of the application of stress at the time of the driving operation of the semiconductor device according to the seventh embodiment.

As shown in FIG. 46 and FIG. 47, in the above-described structure, when the transistor (nMOS1, pMOS1, nMOS2) is driven, a source voltage Vs, a drain voltage Vd and a predetermined gate voltage Vg are applied. Then, holes or electrons, which are carriers, move in the channel CH which is formed in the semiconductor substrate 10-1, 10-2 below the gate electrode G. Thereby, an electric current flows between the source S and drain D, and a switching operation is performed. At this time, operation heat is produced by the application voltage, such as the drain voltage Vd, and the switching current.

If the operation heat is conducted to the first and second liner insulation layers 11-1 and 11-2, the first liner insulation layer 11-1 expands in accordance with its own positive expansion coefficient, and the second liner insulation layer 11-2 contracts in accordance with its own negative expansion coefficient. Accordingly, a strain 28, which causes stretching deformation, occurs in the first liner insulation film 11-1, and a strain 29, which causes contraction deformation, occurs in the second liner insulation film 11-2. As a result, a desired compressive stress CS and a desired tensile stress TS can be applied to the channel region CH. In this state, the holes or electrons, which are carriers, are passed, and the transistor (nMOS1, pMOS1, nMOS2) is driven.

Thus, according to the structure of the present embodiment, even in the case where the temperature of the semiconductor substrate 10-1, 10-2 rises to high temperatures, the mobility of holes or electrons, which are carriers of the transistor, can advantageously be improved. This is more clear from the result of the study shown in FIG. 5 and FIG. 6 in the above sections 2-2 and 2-3.

In addition, in the present embodiment, the pMOS transistor (pMOS1) is disposed on the silicon substrate 10-1 having the element formation plane in the (110) plane direction, and the nMOS transistor (nMOS1, nMOS2) is disposed on the silicon substrate 10-2 having the element formation plane in the (100) plane direction. Thus, also because the transistors are disposed in the advantageous plane directions in accordance with their conductivity types, the mobility can advantageously be improved. This is more clear from the result of the study shown in FIG. 7, FIG. 8 and FIG. 10 in the above sections 3 and 4.
<Manufacturing Method>
Next, referring to FIG. 48 to FIG. 56, a description is given of a method of manufacturing the semiconductor device according to the seventh embodiment.
Manufacturing Method of Hybrid Substrates To begin with, referring to FIGS. 48A and 48B through FIGS. 50A and 50B, a description is given of a method of fabricating hybrid substrates which are used in the method of manufacturing the semiconductor device according to the seventh embodiment. In the description below, FIG. 48A through FIG. 50A illustrate a process of fabricating a semiconductor substrate having an element formation plane in the (110) plane direction, and FIG. 48B through FIG. 50B illustrate a process of fabricating a semiconductor substrate having an element formation plane in the (100) plane direction.

Figure 48A:
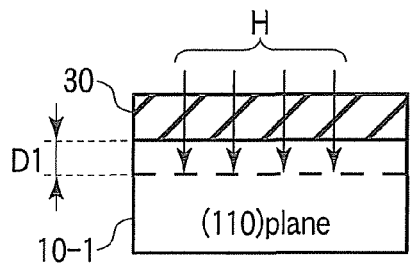
FIG. 48A and FIG. 48B are cross-sectional views illustrating a fabrication step of the semiconductor device according to the seventh embodiment.
Figure 48B:
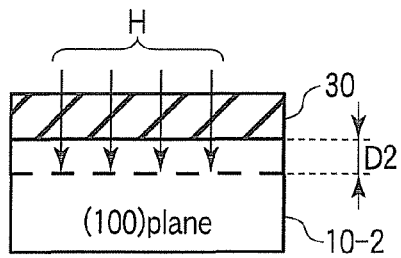

To start with, as shown in FIG. 48A and FIG. 48B, silicon oxide films (Oxide) are formed by, e.g. a thermal oxidation method, as BOX layers 30 on the surfaces of semiconductor substrates 10-1 and 10-2 having the element formation planes in the (110) plane direction and (100) plane direction, respectively.

Subsequently, hydrogen ions H are doped by, e.g. an ion implantation method, from the surfaces of the semiconductor substrates 10-1 and 10-2 to predetermined depths D1 and D2 or thereabout. The hydrogen ions H function as an etching stopper in a later fabrication step of reducing the thickness of the semiconductor substrates 10-1 and 10-2. Thus, the depth D1, D2, corresponds to the thickness of the semiconductor substrate 10-1, 10-2.

Figure 49A:
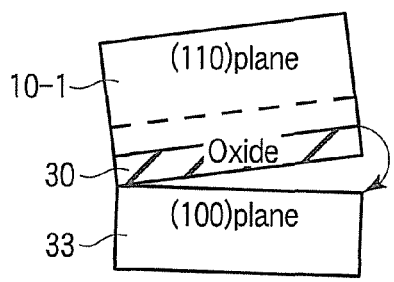
FIG. 49A and FIG. 49B are cross-sectional views illustrating a fabrication step of the semiconductor device according to the seventh embodiment.
Figure 49B:
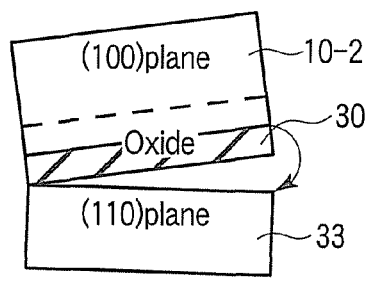

As shown in FIG. 49A and FIG. 49B, the semiconductor substrates 10-1 and 10-2 are inverted, and the BOX layers 30 are bonded to operation substrates 33 such that their element formation planes are set in the (110) plane direction and (100) plane direction, respectively.

Figure 50A:
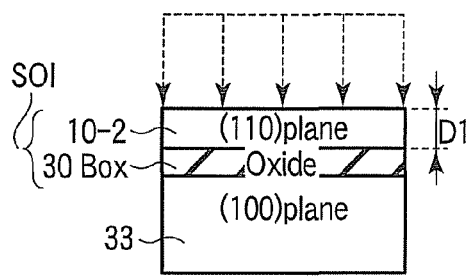
FIG. 50A and FIG. 50B are cross-sectional views illustrating a fabrication step of the semiconductor device according to the seventh embodiment.
Figure 50B:
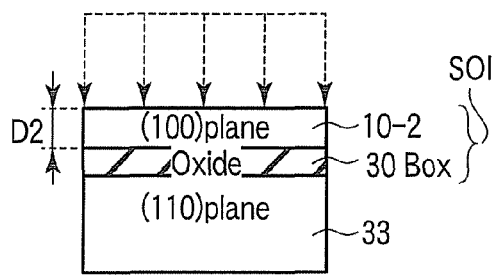

Subsequently, as shown in FIG. 50A and FIG. 50B, using the doped hydrogen ions H as a stopper, the thicknesses of the semiconductor substrates 10-1 and 10-2 are reduced to thicknesses D1 and D2 or thereabout by using, e.g. a CMP method.

By the above fabrication process, semiconductor substrates (SOI substrates) having element formation planes in the (110) plane direction and (100) plane direction can be manufactured.

Manufacturing Method of Elements Using Hybrid Substrates

Next, referring to FIG. 51 to FIG. 56, a description is given of a method of manufacturing the semiconductor device according to the present embodiment by using the hybrid substrates which have been manufactured as described above. The description given below exemplifies the use of the semiconductor substrate (SOI substrate) 10-2 with the element formation plane in the (100) plane direction.

To start with, as shown in FIG. 51, an $SiO_2$ film 41 is formed by, e.g. a thermal oxidation method, on the semiconductor substrate 10-2 having the element formation plane in the (100) plane direction. Then, a nitride film 42 is formed by, e.g. CVD, on the $SiO_2$ film 41.

Subsequently, as shown in FIG. 52, a predetermined trench is formed by, e.g. RIE, in that part of the semiconductor substrate 10-1 and BOX layer 30, which corresponds to a pMOS transistor formation area (pArea). Then, SiN films are formed by, e.g. CVD, as spacers 43 on side walls of the trench.

In this case, as shown in the Figures, the semiconductor substrate 10-2 corresponding to the nMOS transistor formation region (nArea) is formed such that the channel length direction of a transistor, which is to be formed subsequently, is set to be the <100> direction. The same applies to the description below.

Thereafter, as shown in FIG. 53, the silicon substrate 10-1 with the element formation surface in the (110) plane direction is formed by using, e.g. an epitaxial method, so as to fill the trench.

Figure 54:
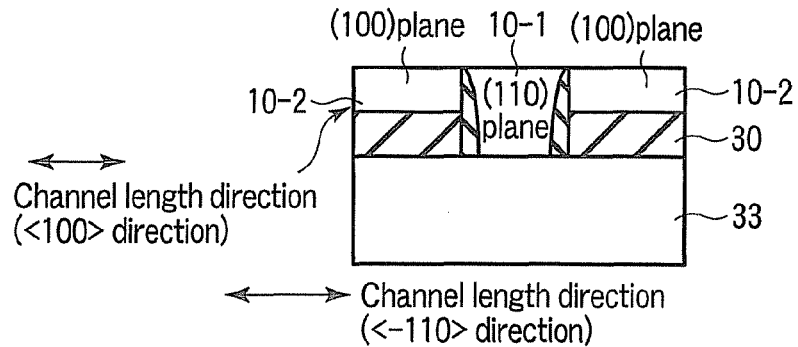
FIG. 54 is a cross-sectional view illustrating a fabrication step of the semiconductor device according to the seventh embodiment.

Following the above, as shown in FIG. 54, the nitride film 42 and $SiO_2$ film are removed by, e.g. CMP.

Figure 55:
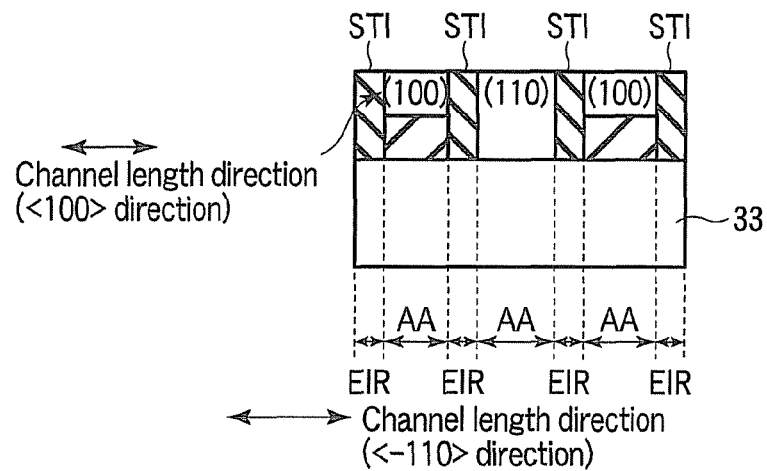
FIG. 55 is a cross-sectional view illustrating a fabrication step of the semiconductor device according to the seventh embodiment.

As shown in FIG. 55, trenches for element isolation are formed by, e.g. RIE, in the semiconductor substrates 10-1 and 10-2 and BOX 30 in element isolation regions EIR, the trenches reaching the surface of the operation substrate 33. Subsequently, a silicon oxide film is buried in the trench for element isolation, and an element isolation insulation film STI is formed.

Figure 56:
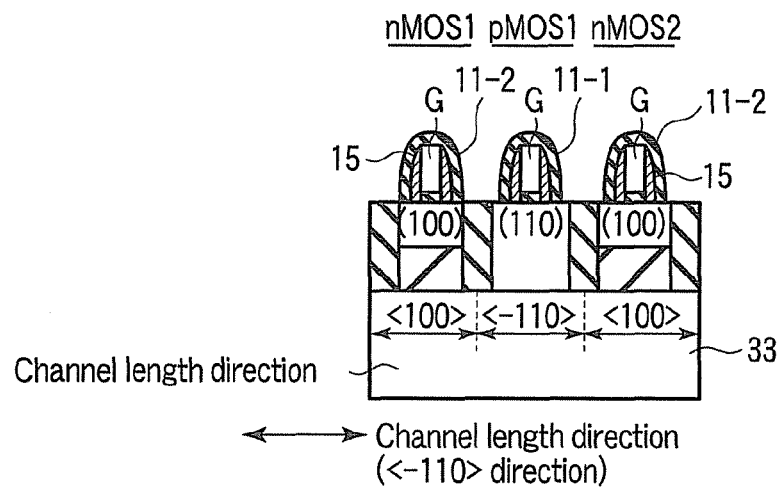
FIG. 56 is a cross-sectional view illustrating a fabrication step of the semiconductor device according to the seventh embodiment.

Thereafter, as shown in FIG. 56, using a well-known fabrication process, a pMOS transistor (pMOS1) is formed on the semiconductor substrate 10-1 having the element formation plane in the (110) plane direction, and an nMOS transistor (nMOS1, nMOS2) is formed on the semiconductor substrate 10-2 having the element formation plane in the (100) plane direction. At this time, the gate electrode G, etc. are formed such that the channel length direction of the transistor (pMOS1) is set to be the <−110> direction. Similarly, the gate electrode G, etc. are formed such that the channel length direction of the transistor (nMOS1, nMOS2) is set to be the <110> direction.

Subsequently, a $SiO_2$ film having a positive expansion coefficient is formed by, e.g. CVD so as to cover the nMOS transistor (nMOS1, nMOS2). Then, the formed $SiO_2$ film is patterned to be left on only the element region AA, and the first liner insulation film 11-1 according to this embodiment is formed.

Subsequently, a glass ceramics layer having a negative expansion coefficient is formed, for example, by using the same fabrication process as described above, so as to cover the pMOS transistor (pMOS1). Thus, the second liner insulation film 11-2 according to this embodiment is formed.

Although not shown, an interlayer insulation film 17 and contact wiring lines SC and DC are formed, and the semiconductor device according to the present embodiment is manufactured.

<Advantageous Effects>

With the semiconductor device and the manufacturing method thereof according to the seventh embodiment, at least the same advantageous effects (1) and (2) as described above can be obtained.

In the present embodiment, the pMOS transistor (pMOS1) is disposed on the silicon substrate 10-1 having the element formation plane in the (110) plane direction. The channel length direction of the pMOS transistor (pMOS1) is disposed in the <−110> direction.

The nMOS transistor (nMOS1, nMOS2) is disposed on the silicon substrate 10-2 which is formed on the BOX layer 30 and has the element formation plane in the (100) plane direction. The channel length direction of the nMOS transistor (nMOS1, nMOS2) is disposed in the <100> direction.

Thus, since the transistors are disposed in the advantageous plane directions in accordance with their conductivity types, the mobility can more advantageously be improved.

Eighth Embodiment

An Example of the Hybrid Substrate

Referring to FIG. 57 to FIG. 58, a description is given of a semiconductor device according to an eighth embodiment of the invention. The eighth embodiment relates to an example of a hybrid substrate having element formation planes in the (110) plane direction and (100) plane direction. A detailed description of the parts common to those of the above-described seventh embodiment is omitted here.

<Structure Example>

Referring to FIG. 57, a description is given of a structure example of the semiconductor device according to the eighth embodiment. As shown in FIG. 57, the structure of this embodiment differs from that of the seventh embodiment in that a piezomaterial 11-1B is provided along the channel length direction in a manner to cover the pMOS transistor (pMOS1).

<Application Of Stress at Time Of Driving Operation>

Next, referring to FIG. 58, a description is given of the application of stress at the time of the driving operation of the semiconductor device according to the eighth embodiment.

As shown in FIG. 58, an electric field occurs between the contact wiring lines SC and DC, which are arranged in the channel length direction, due to the source voltage Vs and drain voltage Vd of the transistor (pMOS1). By the electric field occurring at this time, electric dipoles in the first liner insulation film 11-1B are aligned in the direction of the electric field. Thereby, the grains in the first liner insulation film 11-1B finely extend in the direction of the electric field. Accordingly, a strain, which causes stretching deformation along the direction of electric field, occurs in the first liner insulation film 11-1B to which the electric field is applied (inverse piezoelectric effect).

As a result, in the present embodiment, a desired stress is applied by the strain occurring due to the inverse piezoelectric effect of the first liner insulation film 11-1B, and the mobility of the transistor (pMOS1) can advantageously be further improved.

Ninth Embodiment

An Example of the Hybrid Substrate

Referring to FIG. 59 to FIG. 60, a description is given of a semiconductor device according to a ninth embodiment of the invention. The ninth embodiment relates to an example of a hybrid substrate having element formation planes in the (110) plane direction and (100) plane direction. A detailed description of the parts common to those of the above-described seventh embodiment is omitted here.

<Structure Example>

Referring to FIG. 59, a description is given of a structure example of the semiconductor device according to the ninth embodiment. As shown in FIG. 59, the structure of this embodiment differs from that of the seventh embodiment in that a piezomaterial 11-1B is provided on the element isolation insulation film STI in a manner to sandwich the pMOS transistor (pMOS1).

<Application of Stress at Time of Driving Operation>

Next, referring to FIG. 60, a description is given of the application of stress at the time of the driving operation of the semiconductor device according to the ninth embodiment.

As shown in FIG. 60, an electric field occurs between the contact wiring lines SC and DC, which are arranged in the channel length direction, due to the source voltage Vs and drain voltage Vd of the transistor (nMOS1, pMOS1, nMOS2). By the electric field occurring at this time, electric dipoles in the piezomaterial 11-1B on the element isolation insulation film STI are aligned in the direction of the electric field. Thereby, the grains in the piezomaterial 11-1B finely extend in the direction of the electric field. Accordingly, a strain, which causes stretching deformation along the direction of electric field, occurs in the piezomaterial 11-1B to which the electric field is applied (inverse piezoelectric effect).

As a result, in the present embodiment, a desired stress is applied to the channel region by the strain occurring due to the inverse piezoelectric effect of the piezomaterial 11-1B, and the mobility of the transistor (nMOS1, pMOS1, nMOS2) can advantageously be further improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first insulated-gate field-effect transistor which is disposed on a bulk semiconductor substrate having an element formation plane in a (110) plane direction, and which has a channel length direction in a <−110> direction;
    a second insulated-gate field-effect transistor which is disposed on the bulk semiconductor substrate, has a channel length direction in the <−110> direction, and neighbors the first insulated-gate field-effect transistor in the channel length direction; and
    a first liner insulation film which is provided in a manner to cover the first and second insulated-gate field-effect transistors, the first liner insulation film including a piezomaterial, having a positive expansion coefficient, and applying a compressive stress by operation heat to the first and second insulated-gate field-effect transistors in the channel length direction.

2. The device of claim 1, wherein the first liner insulation film is also disposed on an element isolation insulation film.

3. The device of claim 1, wherein carriers of the first insulated-gate field-effect transistor are holes, and carriers of the second insulated-gate field-effect transistor are electrons.

4. The device of claim 1, further comprising a source contact wiring line and a drain, contact wiring line which are provided on a source and a drain of each of the first and second insulated-gate field-effect transistors, and
    one end and the other end of the first liner insulation film are connected to the source contact wiring line and the drain contact wiring line.

5. The device of claim 1, wherein the first and second insulated-gate field-effect transistors are adjacently disposed along the channel length direction.

6. The device of claim 1, further comprising a second liner insulation film which is provided in a manner to cover the first and second insulated-gate field-effect transistors, the second liner insulation film having a negative expansion coefficient, and applying, together with the first liner insulation film, a stress by operation heat to the first and second insulated-gate field-effect transistors in two axial directions that are the channel length direction and a channel width direction.

7. The device of claim 6, wherein the first liner insulation film includes one of a $SiO_2$ film, an $Al_2O_3$ film and an AlN film, and
    the second liner insulation film includes a glass ceramics layer including an amorphous matrix layer and crystal lines dispersed in the amorphous matrix layer, or includes a $HfW_2O_8$ layer.

8. The device of claim 1, wherein the first liner insulation film comprises a second linear insulation film which is provided in a manner to cover the first insulation-gate field-effect transistor, the second linear insulation film having a positive expansion coefficient; and
    a third liner insulation film which is provided in a manner to cover the second insulated-gate field-effect transistor, the third liner insulation film including a piezomaterial.

9. The device of claim 8, wherein the first insulated-gate field-effect transistor is n type metal oxide semiconductor transistor, and the second insulated-gate field-effect transistor is p type metal oxide semiconductor transistor.

10. A semiconductor device comprising:
    a first insulated-gate field-effect transistor which is disposed on a semiconductor substrate having an element formation plane in a (110) plane direction, and which has a channel length direction in a <−110> direction;
    a second insulated-gate field-effect transistor which is disposed on a semiconductor layer above the semiconductor substrate with an insulation film interposed there between having an element formation plane in a (100) plane direction, and which has a channel length direction in a <100> direction, the second insulated-gate field-effect transistor neighboring the first insulated-gate field-effect transistor in the channel length direction;
    a first liner insulation film which is provided in a manner to cover the first insulated-gate field-effect transistor, the first liner insulation film including a piezomaterial, having a positive expansion coefficient, and applying a compressive stress by operation heat to the first insulated-gate field-effect transistor in the channel length direction; and a second liner insulation film which is provided in a manner to cover the second insulated-gate field-effect transistor, the second liner insulation film having a negative expansion coefficient, and applying a tensile stress by operation heat to the second insulated-gate field-effect transistor in the channel length direction.

11. The device of claim 10, wherein the first and second liner insulation films are also disposed on an element isolation insulation film.

12. The device of claim 10, wherein carriers of the first insulated-gate field-effect transistor are holes, and carriers of the second insulated-gate field-effect transistor are electrons.

13. The device of claim 10, further comprising a source contact wiring line and a drain contact wiring line which are provided on a source and a drain of each of the first and second insulated-gate field-effect transistors, and one end and the other end of each of the first and second liner insulation films are connected to the source contact wiring line and the drain contact wiring line.

14. The device of claim 10, wherein the first and second insulated-gate field-effect transistors are adjacently disposed along the channel length direction.

15. The device of claim 10, further comprising a third liner insulation film which is provided in a manner to cover the first and second insulated-gate field-effect transistors, the third liner insulation film having a negative expansion coefficient, and applying, together with the first and second liner insulation films, a stress by operation heat to the first and second insulated-gate field-effect transistors in two axial directions that are the channel length direction and a channel width direction.

16. The device of claim 15, wherein the first liner insulation film includes one of a $SiO_2$ film, an $Al_2O_3$ film and an AlN film, and each of the second and third liner insulation films includes a glass ceramics layer including an amorphous matrix layer and crystal lines dispersed in the amorphous matrix layer, or includes a $HfW_2O_8$ layer.

* * * * *